US010755857B2

(12) United States Patent
Li et al.

(10) Patent No.: US 10,755,857 B2
(45) Date of Patent: *Aug. 25, 2020

(54) YANLI DIELECTRIC MATERIALS AND CAPACITOR THEREOF

(71) Applicant: CAPACITOR SCIENCES INCORPORATED, Menlo Park, CA (US)

(72) Inventors: Yan Li, Fremont, CA (US); Pavel Ivan Lazarev, Menlo Park, CA (US); Paul T. Furuta, Sunnyvale, CA (US); Barry K. Sharp, Redwood City, CA (US); Samuel Hein, Fremont, CA (US)

(73) Assignee: CAPACITOR SCIENCES INCORPORATED, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/436,269

(22) Filed: Jun. 10, 2019

(65) Prior Publication Data

US 2019/0348221 A1 Nov. 14, 2019

Related U.S. Application Data

(63) Continuation of application No. 15/710,587, filed on Sep. 20, 2017, now Pat. No. 10,319,523, which is a continuation-in-part of application No. 15/449,524, filed on Mar. 3, 2017, now Pat. No. 10,340,082, and a continuation-in-part of application No. 15/449,587, filed on Mar. 3, 2017, now abandoned, said application No. 15/449,524 is a continuation-in-part of application No. 14/710,491, filed on May 12, 2015, now Pat. No. 9,589,727.

(60) Provisional application No. 62/318,134, filed on Apr. 4, 2016, provisional application No. 61/991,871, filed on May 12, 2014.

(51) Int. Cl.
| | |
|---|---|
| *H01G 4/18* | (2006.01) |
| *C08F 20/34* | (2006.01) |
| *C08F 20/18* | (2006.01) |
| *H01L 49/02* | (2006.01) |
| *C08F 20/36* | (2006.01) |
| *C08G 73/02* | (2006.01) |
| *C08L 33/02* | (2006.01) |
| *H01G 4/32* | (2006.01) |
| *H01G 9/04* | (2006.01) |
| *H01G 9/07* | (2006.01) |

(52) U.S. Cl.
CPC .............. *H01G 4/18* (2013.01); *C08F 20/18* (2013.01); *C08F 20/34* (2013.01); *C08F 20/36* (2013.01); *C08G 73/024* (2013.01); *C08L 33/02* (2013.01); *H01G 4/32* (2013.01); *H01G 9/04* (2013.01); *H01G 9/07* (2013.01); *H01L 28/40* (2013.01)

(58) Field of Classification Search
CPC ........................................................ H01G 4/18
USPC ......................................................... 361/323
See application file for complete search history.

(56) References Cited

U.S. PATENT DOCUMENTS

| | | |
|---|---|---|
| 5,286,803 A | 2/1994 | Lindsay et al. |
| 10,340,082 B2* | 7/2019 | Lazarev .................. H01G 4/38 |
| 2008/0002329 A1 | 1/2008 | Pohm et al. |
| 2012/0122274 A1 | 5/2012 | Lazarev |
| 2014/0098458 A1 | 4/2014 | Almadhoun et al. |
| 2016/0020027 A1 | 1/2016 | Lazarev |

OTHER PUBLICATIONS

Information Disclosure Statement submitted on Apr. 22, 2019 in parent U.S. Appl. No. 15/710,587, now U.S. Pat. No. 10,319,523.
Information Disclosure Statement submitted on Jan. 7, 2019 in parent U.S. Appl. No. 15/710,587, now U.S. Pat. No. 10,319,523.
Information Disclosure Statement submitted on Oct. 3, 2018 in parent U.S. Appl. No. 15/710,587, now U.S. Pat. No. 10,319,523.
Information Disclosure Statement submitted on Apr. 13, 2018 in parent U.S. Appl. No. 15/710,587, now U.S. Pat. No. 10,319,523.
Information Disclosure Statement submitted on Dec. 15, 2017 in parent U.S. Appl. No. 15/710,587, now U.S. Pat. No. 10,319,523.
International Search Report issued in corresponding International application PCT/US2017/024150 dated Jun. 21, 2017
Ding et al., "A Photoactive Polymer with Azobenzene Chromophore in the Side Chains", Macromolecules, vol. 40, No. 6, Mar. 1, 2007, pp. 2267-2270.
Zhou et al., "Conjugated Polymers of Rylene Diimide and Phenothiazine for n-Channel Organic Filed-Effect Transistors", Macromolecules, vol. 45, No. 10, May 22, 2012, pp. 4115-4121.
Supplementary European Search Report issued in corresponding European patent application No. 17779524.2 dated Nov. 7, 2019.
Information Disclosure Statement form submitted in parent U.S. Appl. No. 15/710,587 (now U.S. Pat. No. 10,319,523), dated Apr. 22, 2019.
Information Disclosure Statement form submitted in parent U.S. Appl. No. 15/710,587 (now U.S. Pat. No. 10,319,523), dated Jan. 4, 2019.
Information Disclosure Statement form submitted in parent U.S. Appl. No. 15/710,587 (now U.S. Pat. No. 10,319,523), dated Oct. 3, 2018.
Information Disclosure Statement form submitted in parent U.S. Appl. No. 15/710,587 (now U.S. Pat. No. 10,319,523), dated Dec. 15, 2017.
Information Disclosure Statement form submitted in parent U.S. Appl. No. 15/710,587 (now U.S. Pat. No. 10,319,523), dated Apr. 13, 2018.

* cited by examiner

*Primary Examiner* — Nizal S Chandrakumar
(74) *Attorney, Agent, or Firm* — BCF LLP

(57) ABSTRACT

A composite polymeric material includes one or more repeating backbone units; one or more polarizable units incorporated into or connected to one or more of the one or more repeating backbone units; and one or more resistive tails connected to one or more of the repeating backbone units or to the one or more polarizable units as a side chain on the polarizable unit, on a hydrocarbon chain linking a polarizable unit to a backbone unit, or directly attached to a backbone unit. The composite polymeric material may be used to form a metadielectric, which may be sandwiched between to electrodes to form a metacapacitor.

7 Claims, 4 Drawing Sheets

YANLI DIELECTRIC MATERIALS AND CAPACITOR THEREOF

CLAIM OF PRIORITY

This application is a continuation-in-part of U.S. patent application Ser. No. 15/449,587, filed Mar. 3, 2017, the entire contents of which are incorporated herein by reference and U.S. patent application Ser. No. 15/449,524 filed Mar. 3, 2017, the entire contents of which are hereby incorporated herein by reference in their entirety.

FIELD OF THE INVENTION

The present disclosure relates generally to passive components of electrical circuits and more particularly to a composite organic compound and capacitor based on this material and intended for energy storage. A capacitor is an energy storage device that stores an applied electrical charge for a period of time and then discharges it. It is charged by applying a voltage across two electrodes and discharged by shorting the two electrodes. A voltage is maintained until discharge even when the charging source is removed. A capacitor blocks the flow of direct current and permits the flow of alternating current. The energy density of a capacitor is usually less than for a battery, but the power output of a capacitor is usually higher than for a battery. Capacitors are often used for various purposes including timing, power supply smoothing, coupling, filtering, tuning and energy storage. Batteries and capacitors are often used in tandem such as in a camera with a flash. The battery charges the capacitor that then provides the high power needed for a flash. The same idea works in electric and hybrid vehicles where batteries provide energy and capacitors provide power for starting and acceleration.

BACKGROUND

A capacitor is a passive electronic component that is used to store energy in the form of an electrostatic field, and comprises a pair of electrodes separated by a dielectric layer. When a potential difference exists between the two electrodes, an electric field is present in the dielectric layer. An ideal capacitor is characterized by a single constant value of capacitance, which is a ratio of the electric charge on each electrode to the potential difference between them. For high voltage applications, much larger capacitors have to be used.

One important characteristic of a dielectric material is its breakdown field. This corresponds to the value of electric field strength at which the material suffers a catastrophic failure and conducts electricity between the electrodes. For most capacitor geometries, the electric field in the dielectric can be approximated by the voltage between the two electrodes divided by the spacing between the electrodes, which is usually the thickness of the dielectric layer. Since the thickness is usually constant it is more common to refer to a breakdown voltage, rather than a breakdown field. There are a number of factors that can dramatically reduce the breakdown voltage. In particular, the geometry of the conductive electrodes is important factor affecting breakdown voltage for capacitor applications. In particular, sharp edges or points hugely increase the electric field strength locally and can lead to a local breakdown. Once a local breakdown starts at any point, the breakdown will quickly "trace" through the dielectric layer until it reaches the opposite electrode and causes a short circuit.

Breakdown of the dielectric layer usually occurs as follows. Intensity of an electric field becomes high enough to "pull" electrons from atoms of the dielectric material and makes them conduct an electric current from one electrode to another. Presence of impurities in the dielectric or imperfections of the dielectric structure can result in an avalanche breakdown as observed in semiconductor devices.

Another important characteristic of a dielectric material is its dielectric permittivity. Different types of dielectric materials are used for capacitors and include ceramics, polymer film, paper, and electrolytic capacitors of different kinds. The most widely used polymer film materials are polypropylene and polyester. Increasing dielectric permittivity while maintaining high resistivity allows for increasing volumetric energy density, which makes it an important technical task.

One method for creating dielectrics with high permittivity is to use highly polarizable materials which when placed between two electrodes and subjected to an electric field can more easily absorb more electrons due to polarized ends of the molecule orienting toward oppositely charged electrodes. U.S. patent application Ser. No. 15/449,587 demonstrates a method of incorporating highly polarizable molecules into an oligomer to create such a dielectric material and is hereby incorporated in its entirety by reference. The article "Synthesis and spectroscopic characterization of an alkoxysilane dye containing C. I. Disperse Red 1" (Yuanjing Cui, Minquan Wang, Lujian Chen, Guodong Qian, Dyes and Pigments, 62 (2004) pp. 43-47) describe the synthesis of an alkoxysilane dye (ICTES-DR1) which was copolymerized by sol-gel processing to yield organic-inorganic hybrid materials for use as second-order nonlinear optical (NLO) effect. C. I. Disperse Red 1 (DR1) was attached to Si atoms by a carbamate linkage to provide the functionalized silane via the nucleophilic addition reaction of 3-isocyanatopropyl triethoxysilane (ICTES) with DR1 using triethylamine as catalyst. The authors found that triethylamine and dibutyltin dilaurate were almost equally effective as catalysts. The physical properties and structure of ICTES-DR1 were characterized using elemental analysis, mass spectra, 1 H-NMR, FTIR, UV-visible spectra and differential scanning calorimetry (DSC). ICTES-DR1 displays excellent solubility in common organic solvents.

Second-order nonlinear optical (NLO) effects of organic molecules have been extensively investigated for their advantages over inorganic crystals. Properties studied, for example, include their large optical non-linearity, ultra-fast response speed, high damage thresholds and low absorption loss, etc. Particularly, organic thin films with excellent optical properties have tremendous potential in integrated optics such as optical switching, data manipulation and information processing. Among organic NLO molecules, azo-dye chromophores have been a special interest to many investigators because of their relatively large molecular hyper-polarizability (b) due to delocalization of the p-electronic clouds. They were most frequently either incorporated as a guest in the polymeric matrix (guest-host polymers) or grafted into the polymeric matrix (functionalized polymers) over the past decade.

Chromophoric orientation is obtained by applying a static electric field or by optical poling. Whatever the poling process, poled-order decay is an irreversible process which tends to annihilate the NLO response of the materials and this process is accelerated at higher temperature. For device applications, the most probable candidate must exhibit inherent properties that include: (i) high thermal stability to withstand heating during poling; (ii) high glass transition temperature ($T_g$) to lock the chromophores in their acentric order after poling.

Most of the polymers, however, have either low $T_g$ or poor thermal stability which makes them unsuitable for direct use. To overcome these problems, one attractive approach is incorporating the nonlinear optical active chromophore into a polymerizable silane by covalent bond to yield an alkoxysilane dye which can be copolymerized via sol-gel processing to form organic-inorganic hybrid materials. The hydrolysis and condensation of functionalized silicon alkoxydes can yield a rigid amorphous three-dimensional network which leads to slower relaxation of NLO chromophores. Therefore, sol-gel hybrid nonlinear optical materials have received significant attention and exhibited the desired properties. In this strategy, the design and synthesis of new network-forming alkoxysilane dye are of paramount importance.

In the article "Design and Characterization of Molecular Nonlinear Optical Switches" (Frederic Castet et. al., ACCOUNTS OF CHEMICAL RESEARCH, pp. 2656-2665, (2013), Vol. 46, No. 11), Castet et. al. illustrate the similarities of the experimental and theoretical tools to design and characterize highly efficient NLO switches but also the difficulties in comparing them. After providing a critical overview of the different theoretical approaches used for evaluating the first hyperpolarizabilities, Castet et. al. reported two case studies in which theoretical simulations have provided guidelines to design NLO switches with improved efficiencies. The first example presents the joint theoretical/experimental characterization of a new family of multi-addressable NLO switches based on benzazolo-oxazolidine derivatives. The second focuses on the photoinduced commutation in merocyanine-spiropyran systems, where the significant NLO contrast could be exploited for metal cation identification in a new generation of multiusage sensing devices. Finally, Castet et. al. illustrated the impact of environment on the NLO switching properties, with examples based on the keto-enol equilibrium in aniline derivatives. Through these representative examples, Castet et. al. demonstrated that the rational design of molecular NLO switches, which combines experimental and theoretical approaches, has reached maturity. Future challenges consist in extending the investigated objects to supramolecular architectures involving several NLO-responsive units, in order to exploit their cooperative effects for enhancing the NLO responses and contrasts.

Two copolymers of 3-alkylthiophene (alkyl=hexyl, octyl) and a thiophene functionalized with Disperse Red 19 (TDR19) as chromophore side chain were synthesized by oxidative polymerization by Marilu Chavez-Castillo et. al. ("Third-Order Nonlinear Optical Behavior of Novel Polythiophene Derivatives Functionalized with Disperse Red 19 Chromophore", Hindawi Publishing Corporation International Journal of Polymer Science, Volume 2015, Article ID 219361, 10 pages, http://dx.doi.org/10.1155/2015/219361). The synthetic procedure was easy to perform, cost-effective, and highly versatile. The molecular structure, molecular weight distribution, film morphology, and optical and thermal properties of these polythiophene derivatives were determined by NMR, FT-IR, UV-Vis GPC, DSC-TGA, and AFM. The third-order nonlinear optical response of these materials was performed with nanosecond and femtosecond laser pulses by using the third-harmonic generation (THG) and Z-scan techniques at infrared wavelengths of 1300 and 800 nm, respectively. From these experiments, it was observed that although the TRD19 incorporation into the side chain of the copolymers was lower than 5%, it was sufficient to increase their nonlinear response in solid state. For instance, the third-order nonlinear electric susceptibility of solid thin films made of these copolymers exhibited an increment of nearly 60% when TDR19 incorporation increased from 3% to 5%. In solution, the copolymers exhibited similar two-photon absorption cross sections $\sigma_{2PA}$ with a maximum value of 8545 GM and 233 GM (1 GM=$10^{-50}$ cm$^4$ s) per repeated monomeric unit.

The theory of molecular nonlinear optics based on the sum-over-states (SOS) model was reviewed by Mark G. Kuzyk et. al. ("Theory of Molecular Nonlinear Optics", Advances in Optics and Photonics 5, 4-82 (2013) doi: 10.1364/AOP 0.5.000004). The interaction of radiation with a single wtp-isolated molecule was treated by first-order perturbation theory, and expressions were derived for the linear ($\alpha_{ij}$) polarizability and nonlinear ($\beta_{ijk}$, $\gamma_{ijkl}$) molecular hyperpolarizabilities in terms of the properties of the molecular states and the electric dipole transition moments for light-induced transitions between them. Scale invariance was used to estimate fundamental limits for these polarizabilities. The crucial role of the spatial symmetry of both the single molecules and their ordering in dense media, and the transition from the single molecule to the dense medium case (susceptibilities $\chi^{(1)}_{ij}$, $\chi^{(2)}_{ijk}$, $\chi^{(3)}_{ijkl}$), is discussed. For example, for $\beta_{ijk}$, symmetry determines whether a molecule can support second-order nonlinear processes or not. For non-centrosymmetric molecules, examples of the frequency dispersion based on a two-level model (ground state and one excited state) are the simplest possible for $\beta_{ijk}$ and examples of the resulting frequency dispersion were given. The third-order susceptibility is too complicated to yield simple results in terms of symmetry properties. It will be shown that whereas a two-level model suffices for non-centrosymmetric molecules, symmetric molecules require a minimum of three levels in order to describe effects such as two-photon absorption. The frequency dispersion of the third-order susceptibility will be shown and the importance of one and two-photon transitions will be discussed.

The promising class of (polypyridine-ruthenium)-nitrosyl complexes capable of high yield Ru—NO/Ru—ON isomerization has been targeted as a potential molecular device for the achievement of complete NLO switches in the solid state by Joelle Akl, Chelmia Billot et. al. ("Molecular materials for switchable nonlinear optics in the solid state, based on ruthenium-nitrosyl complexes", New J. Chem., 2013, 37, 3518-3527). A computational investigation conducted at the PBE0/6-31+G** DFT level for benchmark systems of general formula [R-terpyridine-Ru$^{II}$Cl$_2$(NO)](PF$_6$) (R being a substituent with various donating or withdrawing capabilities) lead to the suggestion that an isomerization could produce a convincing NLO switch (large value of the $\beta_{ON}/\beta_{OFF}$ ratio) for R substituents of weak donating capabilities. Four new molecules were obtained in order to test the synthetic feasibility of this class of materials with R=4'-p-bromophenyl, 4'-p-methoxyphenyl, 4'-p-diethylaminophenyl, and 4'-p-nitrophenyl. The different cis-(Cl,Cl) and trans-(Cl,Cl) isomers can be separated by HPLC, and identified by NMR and X-ray crystallographic studies.

Single crystals of doped aniline oligomers can be produced via a simple solution-based self-assembly method (see Yue Wang et. al., "Morphological and Dimensional Control via Hierarchical Assembly of Doped Oligoaniline Single Crystals", J. Am. Chem. Soc. 2012, v. 134, pp. 9251-9262). Detailed mechanistic studies reveal that crystals of different morphologies and dimensions can be produced by a "bottom-up" hierarchical assembly where structures such as one-dimensional (1-D) nanofibers can be aggregated into higher order architectures. A large variety of crystalline nanostructures including 1-D nanofibers and nanowires, 2-D nanoribbons and nanosheets, 3-D nanoplates, stacked sheets, nanoflowers, porous networks, hollow spheres, and twisted coils can be obtained by controlling the nucleation of the crystals and the non-covalent interactions between the doped oligomers. These nanoscale crystals exhibit enhanced conductivity compared to their bulk counterparts as well as interesting structure-property relationships such as shape-dependent crystallinity. Further, the morphology and dimension of these structures can be largely rationalized and predicted by monitoring molecule-solvent interactions via absorption studies. Using doped tetraaniline as a model system, the results and strategies presented by Yue Wang et. al. provide insight into the general scheme of shape and size control for organic materials.

Hu Kang et. al. detail the synthesis and chemical/physical characterization of a series of unconventional twisted π-electron system electro-optic (EO) chromophores ("Ultralarge Hyperpolarizability Twisted π-Electron System Electro-Optic Chromophores: Synthesis, Solid-State and Solution-Phase Structural Characteristics, Electronic Structures, Linear and Nonlinear Optical Properties, and Computational Studies", J. AM. CHEM. SOC. 2007, vol. 129, pp. 3267-3286). Crystallographic analysis of these chromophores reveals large ring-ring dihedral twist angles (80-89°) and a highly charge-separated zwitterionic structure dominating the ground state. NOE NMR measurements of the twist angle in solution confirm that the solid-state twisting persists essentially unchanged in solution. Optical, IR, and NMR spectroscopic studies in both the solution phase and solid state further substantiate that the solid-state structural characteristics persist in solution. The aggregation of these highly polar zwitterions is investigated using several experimental techniques, including concentration-dependent optical and fluorescence spectroscopy and pulsed field gradient spin-echo (PGSE) NMR spectroscopy in combination with solid-state data. These studies reveal clear evidence of the formation of centrosymmetric aggregates in concentrated solutions and in the solid state and provide quantitative information on the extent of aggregation. Solution-phase DC electric-field-induced second-harmonic generation (EFISH) measurements reveal unprecedented hyperpolarizabilities (nonresonant $\mu\beta$ as high as $-488,000\times10^{-48}$ esu at 1907 nm). Incorporation of these chromophores into guest-host poled polyvinylphenol films provides very large electro-optic coefficients ($r_{33}$) of ~330 pm/V at 1310 nm. The aggregation and structure-property effects on the observed linear/nonlinear optical properties were discussed. High-level computations based on state-averaged complete active space self-consistent field (SA-CASSCF) methods provide a new rationale for these exceptional hyperpolarizabilities and demonstrate significant solvation effects on hyperpolarizabilities, in good agreement with experiment. As such, this work suggests new paradigms for molecular hyperpolarizabilities and electro-optics.

U.S. Pat. No. 5,395,556 (Tricyanovinyl Substitution Process for NLO Polymers) demonstrate NLO effect of polymers that specifies a low dielectric constant. U.S. patent application Ser. No. 11/428,395 (High Dielectric, Non-Linear Capacitor) develops high dielectric materials with non-linear effects. It appears to be an advance in the art to achieve non-linear effects through supramolecular polarizable structures that are insulated from each other that include doping properties in the connecting insulating or resistive elements to the composite organic compound. It further appears to be an advance in the art to combine composite organic compounds with non-linear effects that form ordered structures in a film and are insulated from each other and do not rely on forming self-assembled monolayers on a substrate electrode. Additionally, it appears to be an advance to achieve high dielectric non-linear capacitors in which a dielectric is comprised of supramolecular polarizable structures and wherein the supramolecular polarizable structures are arranged perpendicular to electrodes and are dispersed in a dielectric layer more or less stochastically, semi-ordered, or crystalline. Semi-ordered and stochastically dispersed dielectric layers comprised of said composite organic compounds have, in some instances, more favorable mechanical properties over purely crystal dielectrics.

The production and use of oligomers of azo-dye chromophores with resistive tails is described in U.S. Patent Application 62/318,134 which is hereby incorporated in its entirety by reference.

Capacitors as energy storage device have well-known advantages versus electrochemical energy storage, e.g. a battery. Compared to batteries, capacitors are able to store energy with very high power density, i.e. charge/recharge rates, have long shelf life with little degradation, and can be charged and discharged (cycled) hundreds of thousands or millions of times. However, capacitors often do not store energy in small volume or weight compared with batteries, or at low energy storage cost, which makes capacitors impractical for some applications, for example electric vehicles. Accordingly, it may be an advance in energy storage technology to provide capacitors of higher volumetric and mass energy storage density and lower cost.

A need exists to improve the energy density of film capacitors while maintaining the existing power output and durability or lifetime. There exists a further need to provide a capacitor featuring a high dielectric constant sustainable to high direct current (DC) voltages where the capacitance is voltage dependent. Such a capacitor is the subject of the present disclosure. The capacitor of the present disclosure builds on past work on non-linear optical chromophores and non-linear capacitors comprising said chromophores.

In high frequency applications, it is often important that the capacitors used do not have high dielectric losses. In the case of ferroelectric ceramic capacitors with a high dielectric constant, the presence of domain boundaries and electrostriction provide loss mechanisms that are significant. In contrast, the high dielectric mechanism disclosed in this disclosure involves the movement of an electron in a long molecule and its fixed donor.

A second very useful property of the type of capacitor disclosed in the disclosure is its non-linearity. In many applications, it is desirable to have a voltage sensitive capacitance to tune circuits and adjust filters. The disclosed capacitors have such a property; as the mobile electron moves to the far end of the composite organic compounds as the voltage increases, its motion is stopped so that with additional voltage little change in position occurs.

A third useful property of the type of capacitor disclosed in the disclosure is its resistivity due to resistive tails covalently bonded to the composite organic compound or in a polymer. In many instances, electron mobility is hindered by a matrix of resistive materials. A composite of a non-linear polarizable compound and electrically resistive tails introduces order to a film of consisting of a composite organic compound or a polymer which can enhance the energy density of capacitors. This is achieved by increasing the density of polarization units by also limiting mobility of pi or ionic electrons to the chromophores and/or reducing electron tunneling. Ordered resistive tails can further enhance the energy density of capacitors by improving packing, increasing internal film organization, increasing crystallinity, reducing voids, or any combination thereof, which thereby increases film resistivity, film dielectric constant, breakdown voltage, or any combination thereof.

In one example, rather than using alkyl chains for the resistive tails, rigid resistive tails can be used to introduce some order to the overall material by preventing the presence of voids due to coiling of alkyl chains. This is described in greater detail in U.S. patent application Ser. No. 15/163, 595, which is incorporated herein in its entirety by reference.

The resistive tails, ordered or disorder, may also crosslink to further enhance the structure of the dielectric film which can reduce localized film defects and enhance the film's breakdown voltage or breakdown field. Further, a polymer of a composite non-linear polarizable compound and electrically resistive chain may crosslink inter- and/or intra polymer backbones to enhance the dielectric film structure, which can reduce localized film defects and enhance the film's breakdown voltage or breakdown field. Further, ordered resistive tails can improve solubility of the composite compound in organic solvents. Still further, the resistive tails can act to hinder electro-polar interactions between supramolecular structures formed from pi-pi stacking of the optionally attached polycyclic conjugated molecule. Even further, the resistive tails can act to hinder electro-polar interaction between repeat units of a polymer consisting of non-linear polarizable compounds.

A co-polymer consisting of a monomer with a non-linear polarizable compound and a monomer with a resistive tail can be used to introduce some order to dielectric films consisting of said co-polymer due to the resistive tails and non-linear polarizable compounds forming polar, pi-pi, van der Waals interaction, or any combination thereof. Further, a homo-polymer consisting of a single monomer comprised of both a non-linear polarizable compound and at least one resistive tail introduces greater order to a dielectric film consisting said homo-polymer. Still further, a co-polymer or homo-polymer backbone can be selected for mechanical rigidity, which can increase order of a dielectric film consisting of one or more said polymers.

A fourth very useful property of the type of capacitor disclosed in the disclosure is enhancing the non-linear response of the chromophores by using non-ionic dopant groups to change electron density of the chromophores. Manipulation of the electron density of the chromophores can significantly increase the non-linear response which is useful for increasing the polarizability and the type of dopant groups on chromophores is also important to achieving enhanced non-linear polarization versus a neutral or deleterious effect on the non-linearity of the chromophore.

A fifth very useful property of the type of capacitor disclosed in the disclosure is enhancing the non-linear response of the chromophores by using non-ionic dopant connecting groups or polymer backbone units consisting of a heteroatom connected to or in conjugation with the chromophore to change electron density of the chromophores. Manipulation of the electron density of the chromophores can significantly increase the non-linear response which is useful for increasing the polarization of the capacitor and thus energy density of said capacitor. However, placement and type of dopant connecting groups on chromophores is also important to achieving enhanced non-linear polarization versus a neutral or deleterious effect on the non-linearity of the chromophore.

SUMMARY

Figure 1:
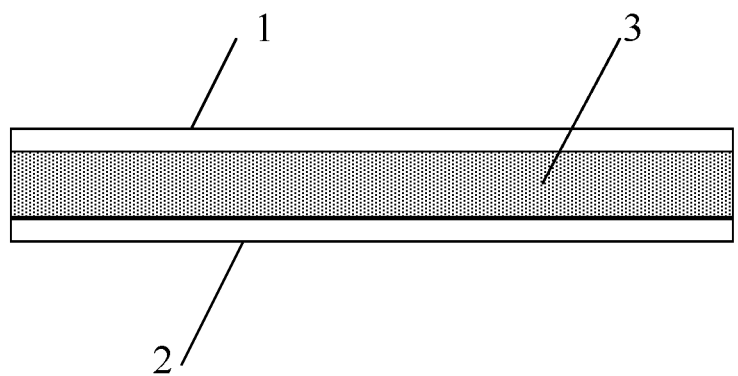
FIG. 1 shows a metacapacitor with two electrodes and a metadielectric according to aspects of the present disclosure.

Aspects of the present disclosure include a class of materials referred to herein as YanLi materials and YanLi polymers. In general, a YanLi polymer is a composite oligomeric material comprised of monomers that have polarizable and insulating components. The monomers may include a polarizable unit having a non-linear polarizable core that includes a conjugated ring system and at least one dopant group. The monomers also include an insulating tail as a side chain on the polarizable unit, on the handle linking a polarizable unit to the monomer backbone, or directly attached to the backbone. In some embodiments, a YanLi polymer may be a co-polymer wherein one monomer unit includes an insulating tail and a second monomer unit includes a polarizable unit having a non-linear polarizable core that includes a conjugated ring system and at least one dopant group. In some embodiments, the polarizable unit may be partially or fully incorporated into the monomer backbone. Additionally, the polarizable unit may be partially or fully incorporated into the monomer backbone.

A particular subclass of YanLi materials are referred to herein as YanLi dielectrics, which are materials of one or more YanLi polymers, of one or more YanLi oligomer, or any combination therein.

One aspect of the present disclosure is to provide a capacitor with a high power output. A further aspect of the present disclosure is to provide a capacitor featuring a high dielectric constant sustainable to high voltage. Another aspect of the present disclosure is to provide a capacitor with a high energy density. A still further aspect of the present disclosure is to provide a capacitor featuring voltage dependent capacitance. In yet another aspect of the present disclosure, a method to make such a capacitor is provided.

The capacitor, in its simplest form, comprises a first electrode, a second electrode and a composite oligomer, comprising ordered resistive tails and polarizable units (i.e. chromophore side chains), between the first electrode and the second electrode. The polarizable units on the oligomer in some instances may be chromophore side chains that have dopant groups which can be independently selected from electron acceptor and/or electron donor groups separated by a conjugated ring system with or without a conjugated bridge. The conjugated bridge comprises one or more double bonds that alternate with single bonds in an unsaturated compound. Among the many elements that may be present in the double bond, carbon, nitrogen, oxygen and sulfur are the most preferred heteroatoms. Alternatively, the conjugated bridge may comprise one or more triple bonds that alternate with single bonds in an unsaturated compound. Among the elements that may be present in the triple bond, carbon is the most preferred heteroatom. The π electrons in the conjugated ring system are delocalized across the length of the chromophore. Among the many types of resistive tails that may be present in the composite monomer, alkyl chains, branched alkyl chains, fluorinated alkyl chains, branched flouroalkyl chains, poly(methyl methacrylate) chains are examples and are preferentially positioned on the terminal aromatic rings of a chromophore. In some embodiments, the resistive tails are positioned on side or lateral positions of the polarizable unit or fragment of the composite organic compound. Additionally, in some embodiments, the resistive tails may be positioned on both the terminal aromatic rings and lateral or side positions of non-terminal aromatic rings of a chromophore. When a bias is applied across the first and second electrodes, the composite oligomer becomes more or less polarized with electron density moving to compensate the field induced by the applied bias. When the bias is removed, the original charge distribution is restored. In some embodiments, the capacitor comprises a plurality of YanLi oligomers (varying in length and/or type of monomer units) as a structured dielectric film with lamella or micelle structures. YanLi oligomers (typically less than 100 monomer units long) may be YanLi polymers (typically greater than 100 monomer units long).

Note on Nomenclature

The terms oligomer and polymer are sometimes used interchangeably. However, oligomer is more commonly used to describe a specific embodiment of a polymer, a polymer complex with short backbone length (low molecular weight), or a specific portion of a complex molecule or motif (e.g., chromophore side chains or alkyl side chain).

DETAILED DESCRIPTION

According to aspects of the present disclosure an energy storage device, such as a capacitor, may include a composite polymeric material of any of the types described herein sandwiched between first and second electrodes. The electrodes may be made conductors or semiconductors. Conductors include, but are not limited to, metals, conducting polymers, carbon nano-materials, and graphite including graphene sheets. Semiconductors include, but are not limited to, silicon, germanium, silicon carbide, gallium arsenide and selenium. The electrode may or may not be formed on a support layer. Flat layers may include, but are not limited to, glass, plastic, silicon, and metal surfaces.

Aspects of the present disclosure include composite polymeric materials of the following general formula:

wherein D is

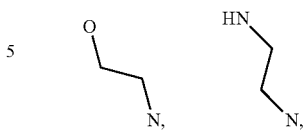

N, N, N, or a hydrocarbon chain, wherein $R^{1a}, R^{1b}, R^{1a}, R^{2b}, R^{2c}, R^{2d}, R^{3a}, R^{3b}, R^{4a}, R^{4b}, R^{4c}, R^{4d}, R^{5a}, R^{5b}, R^{5c}, R^{5d}$ are independently selected from —H, —OH, —Ak, -Ak-$X_l$, —OAk, or —OAk-X; $L_2$ is a heteroatom bridge in conjugation with the ring system containing $R^{2a}, R^{2b}, R^{2c}, R^{2d}, Q^1, Q^2, Q^3, Q^4, Q^5$; wherein $R^{2a}, R^{2b}, R^{2c}, R^{2d}, Q^1, Q^2, Q^3, Q^4, Q^5$ are each independently selected from —H and any electron withdrawing or electron donating group; wherein Ak is alkyl, X is any halogen, n is 0-150, m is 1-300, l is 1-51, o is 0-10, p is 0-1 when o is less than or equal to one and 1 when o is greater than 1, wherein $R^{1a}$ or $R^{1b}$ is an insulating resistive tail or both $R^{1a}$ and $R^{2a}$ are insulating resistive tails.

In some implementations of composite polymeric materials of the above general formula, the value of n may be equal to or greater than 1.

In some implementations of composite polymeric materials of the above general formula, the value of n may be equal to zero. In such implementations, $R^{1a}, R^{1b}, R^{3a}$ or $R^{3b}$ may possesses at least 7 carbon atoms.

In some implementations of composite polymeric materials of the above general formula, $R^{1a}, R^{1b}, R^{3a}$, and $R^{3b}$ may be insulating resistive tails are independently selected from the group consisting of saturated hydrocarbon, saturated halogenated hydrocarbon, partially halogenated hydrocarbon, aryl chain, and cycloalkyl, and X—RR'R"; wherein X is selected from C, O, N, and S, and R, R', and R" are independently selected from H and $C_{5-50}$, wherein one or more of R, R', and R" is $C_{5-50}$. As used in the present disclosure, the notation $C_{5-50}$ means a chain of 5 to 50 carbon atoms. In such implementations a chain may be monounsaturated or partially unsaturated, yet the unsaturated bonds are not conjugated. In such implementations all insulating resistive tails may be selected independently from the group consisting of non-aromatic carbocycles and non-aromatic heterocycles.

In some implementations of composite polymeric materials of the above general formula, all insulating resistive tails may be rigid.

In some implementations of composite polymeric materials of the above general formula, $Q_1, Q_2, Q_3, Q_4$ and $Q_5$ may each be independently selected from —$NO_2$, —$NH_3^+$ and —NRR'R"+ (quaternary nitrogen salts) with counterion

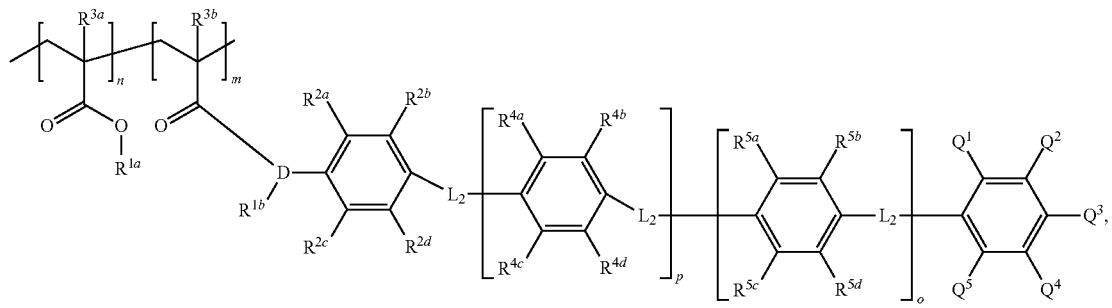

Cl⁻ or Br⁻, —CHO (aldehyde), —CRO (keto group), —SO₃H (sulfonic acids), —SO₃R (sulfonates), SO₂NH₂ (sulfonamides), —COOH (carboxylic acid), —COOR (esters, from carboxylic acid side), —COCl (carboxylic acid chlorides), —CONH₂ (amides, from carboxylic acid side), —CF₃, —CCl₃, —CN, —O— (phenoxides) with counter ion Na⁺ or K⁺, —NH₂, —NHR, —NR₂, —OH, OR (ethers), —NHCOR (amides, from amine side), —OCOR (esters, from alcohol side), alkyls, —C₆H₅, vinyls, wherein R and R' and R" are radicals selected from the list comprising hydrogen, alkyl (methyl, ethyl, isopropyl, tert-butyl, neopentyl, cyclohexyl etc.), allyl (—CH2-CH=CH2), benzyl (—CH2C6H5) groups, phenyl (+substituted phenyl) and other aryl (aromatic) groups. In some such implementations, one or more of $Q^1$, $Q^2$, $Q^3$, $Q^4$, and $Q^5$ may be —NO₂.

In some implementations of composite polymeric materials of the above general formula, D may be a hydrocarbon chain that is interrupted by heteroatoms at the point of backbone attachment and side chain attachment.

In some implementations of composite polymeric materials of the above general formula, $L_2$ may be an azo-bridge or —N=N—, an alkene bridge or —HC=CH—, and alkyne bridge or —C≡C—.

In some implementations of composite polymeric materials of the above general formula, the composite polymeric material may have any of structures 1 to 20:

1

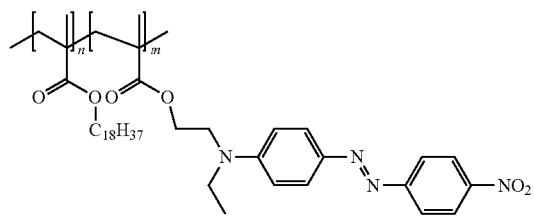

2

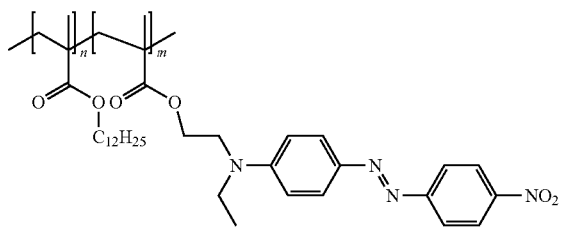

3

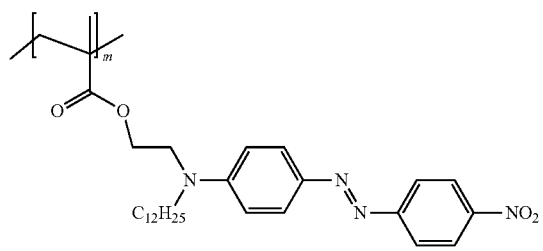

4

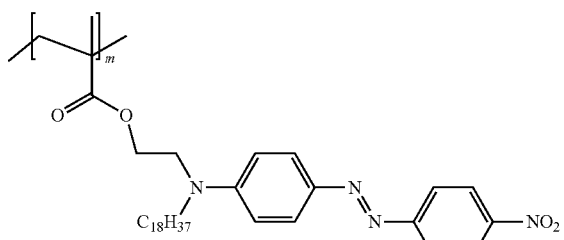

5

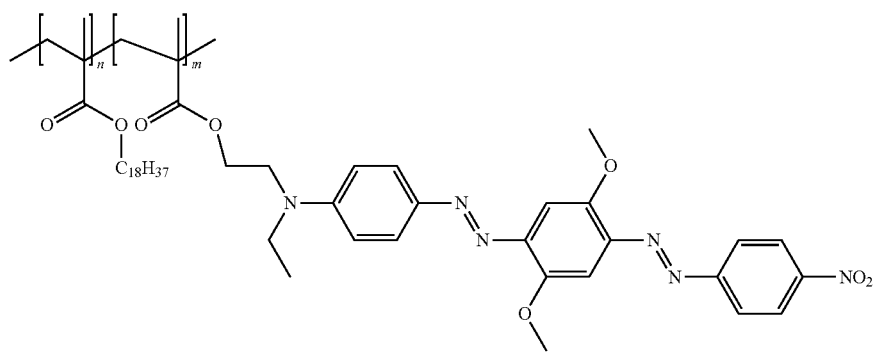

6

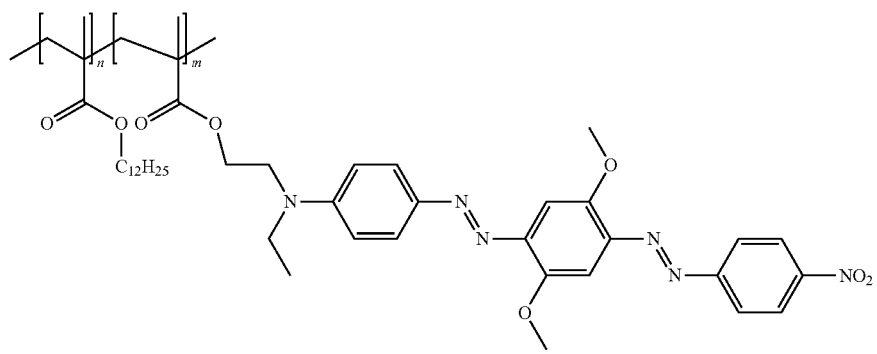

7
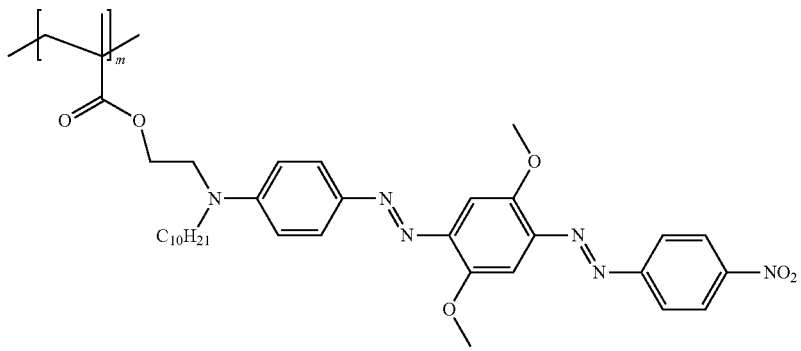
8
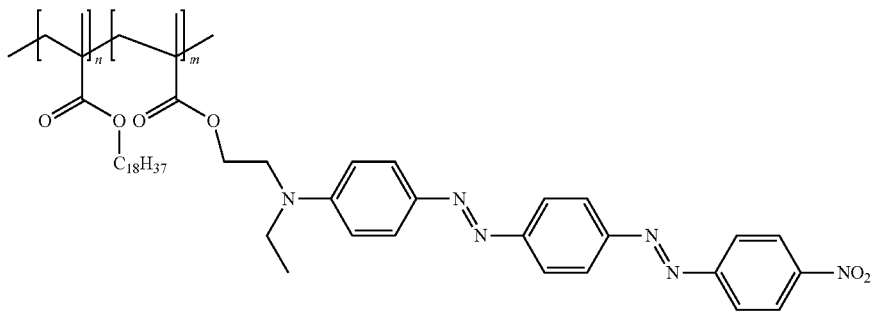
9
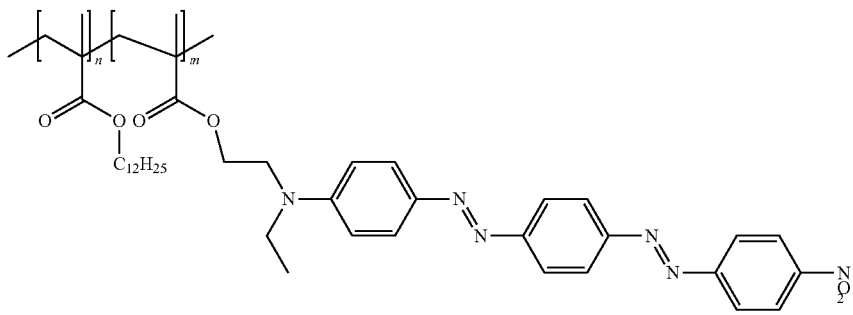
10
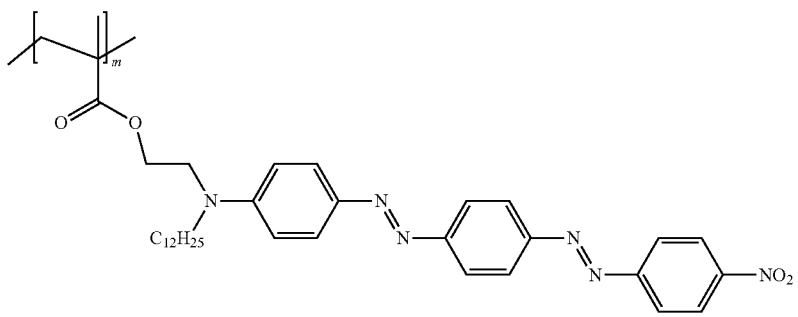
11
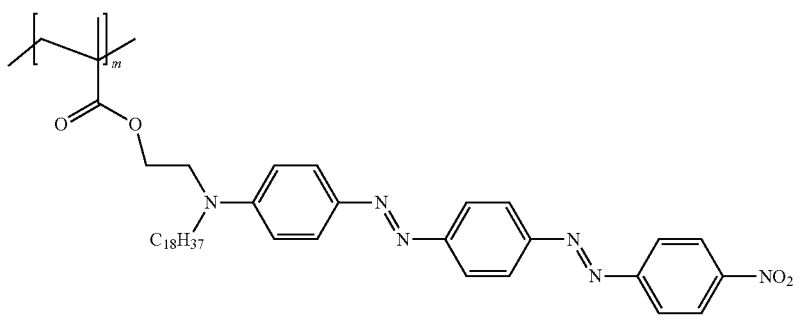

-continued
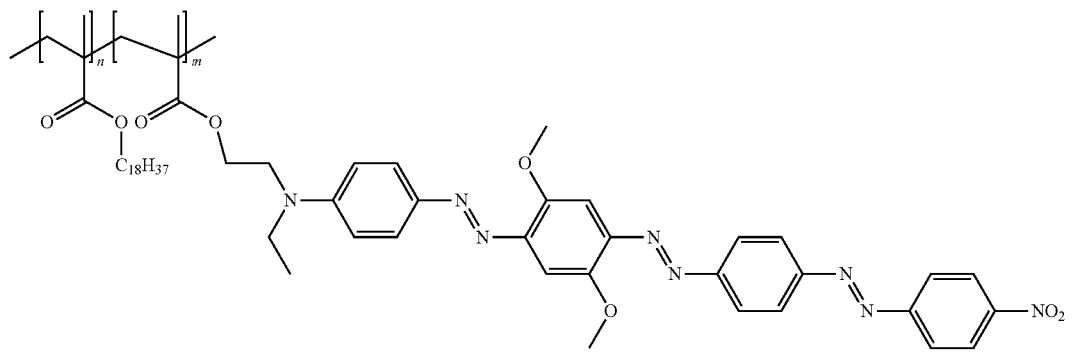
12
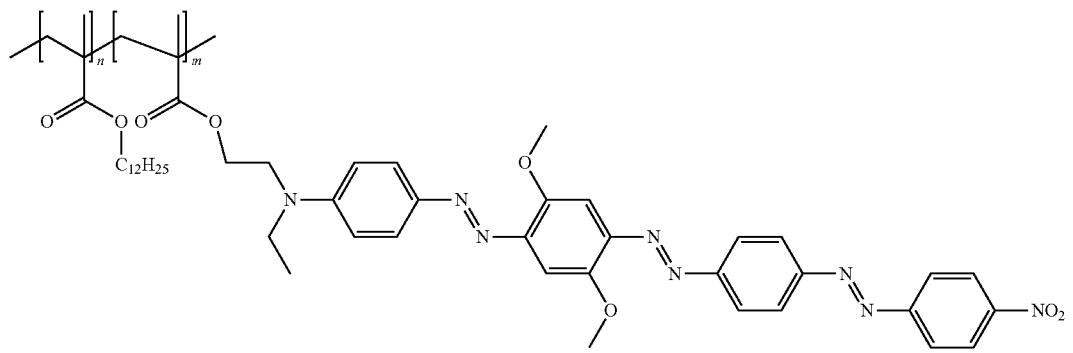
13
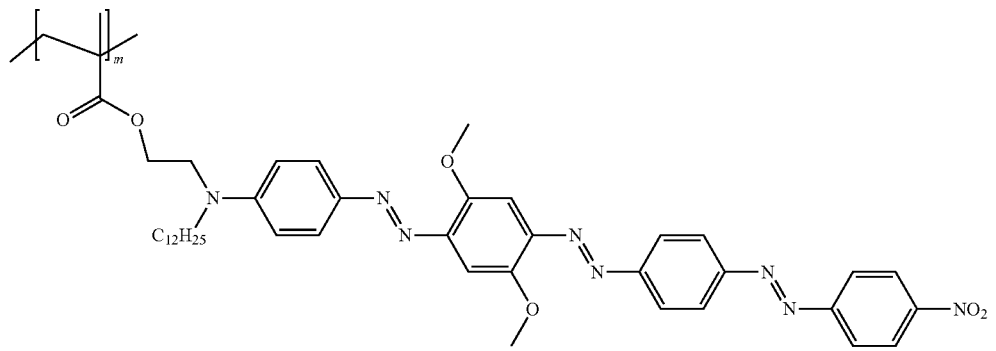
14
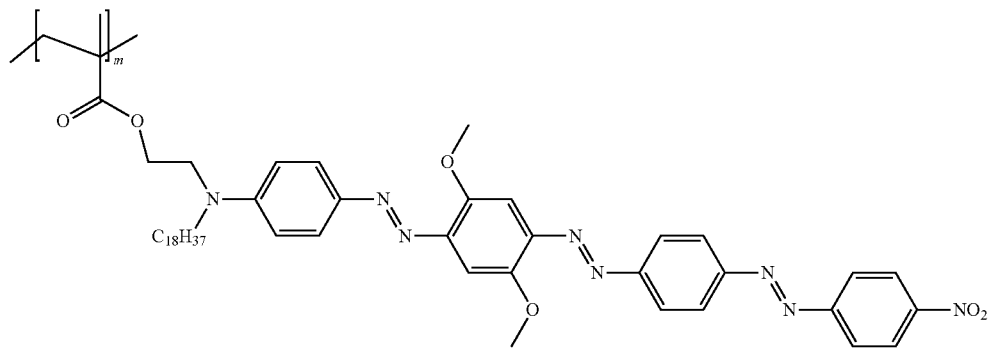
15

-continued
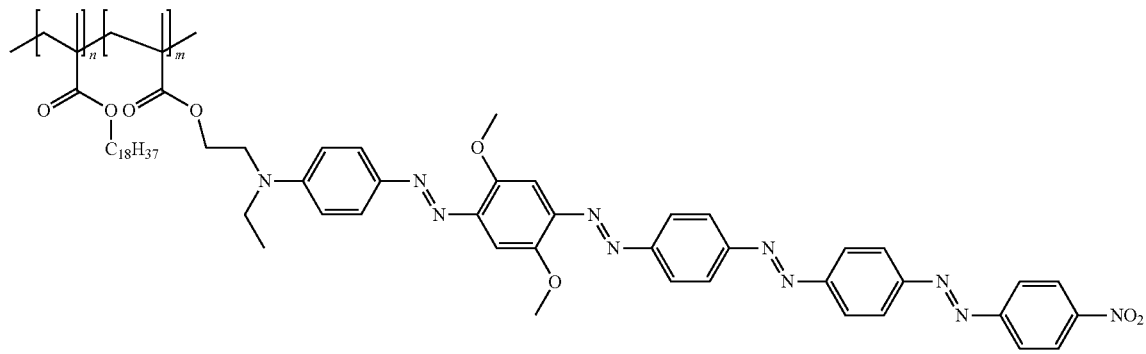
16
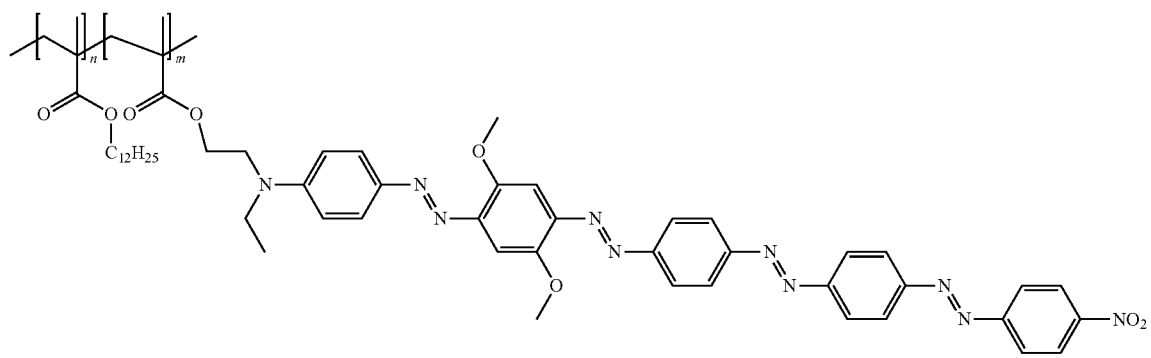
17
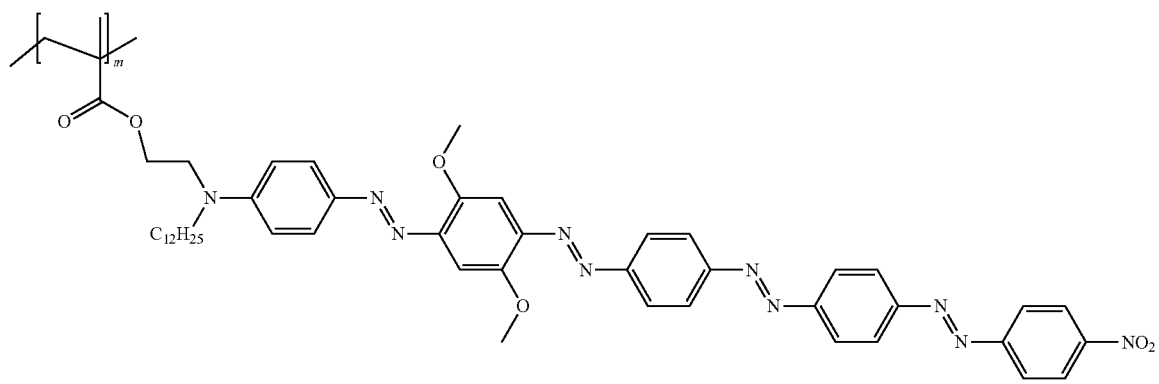
18
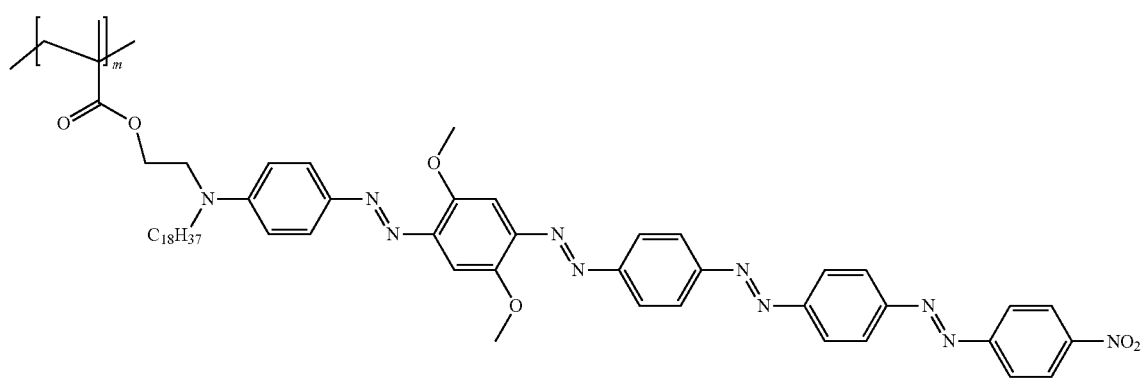
19

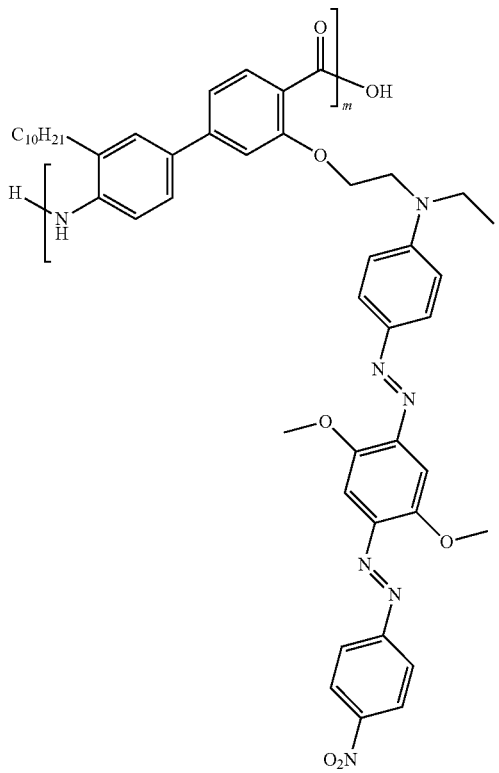

wherein n ranges from 0-150 and m ranges from 1-300. Additionally, the repeat units of co-polymer variants repeat randomly, or more-or-less one-to-one in succession.

In addition, aspects of the present disclosure include composite polymeric materials of the following general formula:

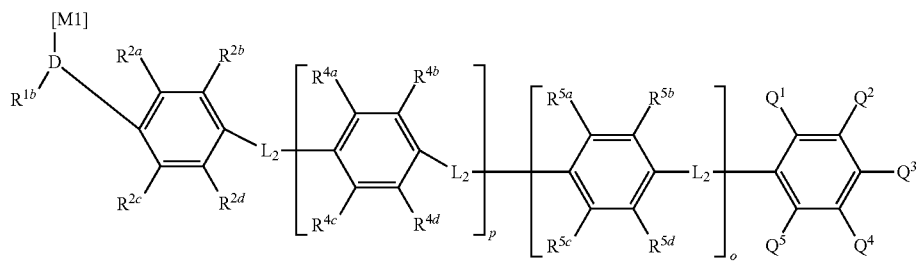

In the above general formula [M1] is:

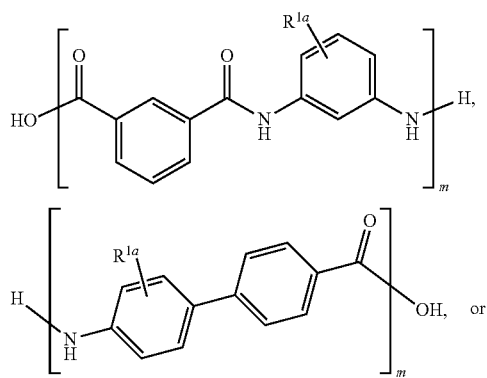

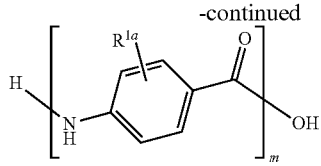

$R^{1a}$, $R^{1b}$, $R^{1a}$, $R^{2b}$, $R^{2c}$, $R^{2d}$, $R^{3a}$, $R^{3b}$, $R^{4a}$, $R^{4b}$, $R^{4c}$, $R^{4d}$, $R^{5a}$, $R^{5b}$, $R^{5c}$, $R^{5d}$ are independently selected from —H, —OH, —Ak, -Ak-X, —OAk, or —OAk-$X_l$, $L_2$ is a heteroatom bridge in conjugation with the ring system containing $R^{2a}$, $R^{2b}$, $R^{2c}$, $R^{2d}$, $Q^1$, $Q^2$, $Q^3$, $Q^4$, $Q^5$; wherein $R^{2a}$, $R^{2b}$, $R^{2c}$, $R^{2d}$, $Q^1$, $Q^2$, $Q^3$, $Q^4$, $Q^5$ are each independently selected from —H and any electron withdrawing or electron donating group, wherein D is a hydrocarbon chain, wherein Ak is alkyl, X is any halogen, m is 1-300, is 1-51, o is 0-10, p is 0-1 when o is less than or equal to one and 1 when o is greater than 1, wherein $R^{1a}$ or $R^{1b}$ is an insulating resistive tail or both $R^{1a}$ and $R^{1b}$ are insulating resistive tails.

In some implementations of composite polymeric materials of the above general formula, $R^{1a}$, $R^{1b}$, $R^{3a}$ or $R^{3b}$ may possess at least 7 carbon atoms.

In some implementations of composite polymeric materials of the above general formula, $R^{1a}$, $R^{1b}$, $R^{3a}$, and $R^{3b}$ are insulating resistive tails are independently selected from the group consisting of saturated hydrocarbon, saturated halogenated hydrocarbon, partially halogenated hydrocarbon, aryl chain, and cycloalkyl, and X—RR'R"; wherein X is selected from C, O, N, and S, and R, R', and R" are independently selected from H and $C_{5-50}$, wherein one or more of R, R', and R" is $C_{5-50}$.

In some implementations of composite polymeric materials of the above general formula, the insulating resistive tails may be selected independently from the group consisting of non-aromatic carbocycles and non-aromatic heterocycles.

In some implementations of composite polymeric materials of the above general formula all insulating resistive tails may be rigid.

In some implementations of composite polymeric materials of the above general formula, $Q_1$, $Q_2$, $Q_3$, $Q_4$ and $Q_5$ are each independently selected from —$NO_2$, —$NH_3^+$ and —NRR'R"+ (quaternary nitrogen salts) with counterion Cl⁻ or Br⁻, —CHO (aldehyde), —CRO (keto group), —$SO_3H$ (sulfonic acids), —$SO_3R$ (sulfonates), $SO_2NH_2$ (sulfonamides), —COOH (carboxylic acid), —COOR (esters, from carboxylic acid side), —COCl (carboxylic acid chlorides), —$CONH_2$ (amides, from carboxylic acid side), —$CF_3$, —$CCl_3$, —CN, —O— (phenoxides) with counter ion Na⁺ or K⁺, —$NH_2$, —NHR, —$NR_2$, —OH, OR (ethers), —NH-COR (amides, from amine side), —OCOR (esters, from alcohol side), alkyls, —$C_6H_5$, vinyls, wherein R and R' and R" are radicals selected from the list comprising hydrogen, alkyl (methyl, ethyl, isopropyl, tert-butyl, neopentyl, cyclohexyl etc.), allyl (—CH2-CH=CH2), benzyl (—CH2C6H5) groups, phenyl (+substituted phenyl) and other aryl (aromatic) groups. In some such implementations, one or more of $Q^1$, $Q^2$, $Q^3$, $Q^4$, and $Q^5$ may be —$NO_2$.

In some implementations of composite polymeric materials of the above general formula, D may be a hydrocarbon chain that is interrupted by heteroatoms at the point of backbone attachment and side chain attachment.

In some implementations of composite polymeric materials of the above general formula, $L_2$ may be an azo-bridge or —N=N—, an alkene bridge or —HC=CH—, and alkyne bridge or —C≡C—.

In some implementations of composite polymeric materials of the above general formula, D may be a hydrocarbon chain interrupted by heteroatoms at the point of backbone attachment and side chain attachment.

In some implementations of composite polymeric materials of the above general formula, $L_2$ may be an azo-bridge or —N=N—, an alkene bridge or —HC=CH—, and alkyne bridge or —C≡C—.

Furthermore, aspects of the present disclosure include composite polymeric materials of the following general formula:

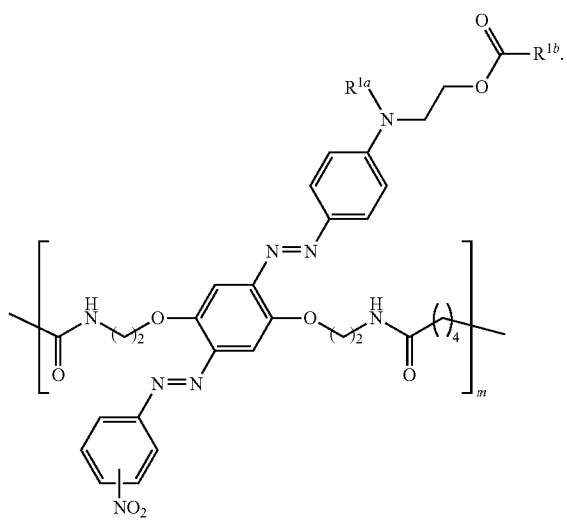

In the foregoing general formula $R^{1a}$ and $R^{1b}$ are independently selected from —H, —OH, —Ak, -Ak-$X_l$, —OAk, and —OAk-$X_l$, Ak is alkyl, X is any halogen, m is 1-300, l is 1-51, and wherein $R^{1a}$ or $R^{1b}$ is an insulating resistive tail or wherein $R^{1a}$ and $R^{1b}$ are both insulating resistive tails.

In some implementations of composite polymeric materials of the above general formula, $R^{1a}$ or $R^{1b}$ may possesses at least 7 carbon atoms.

In some implementations of composite polymeric materials of the above general formula, $R^{1a}$ and $R^{1b}$ may be insulating resistive tails are independently selected from the group consisting of saturated hydrocarbon, saturated halogenated hydrocarbon, partially halogenated hydrocarbon, aryl chain, and cycloalkyl, and X—RR'R"; wherein X is selected from C, O, N, and S, and R, R', and R" are independently selected from H and $C_{5-50}$, wherein one or more of R, R', and R" is $C_{5-50}$. In some such implementations, the insulating resistive tails may be selected independently from the group consisting of non-aromatic carbocycles and non-aromatic heterocycles.

In some implementations of composite polymeric materials of the above general formula, all insulating resistive tails may be rigid.

In some implementations of composite polymeric materials of the above general formula, the composite polymeric material may have structure 21:

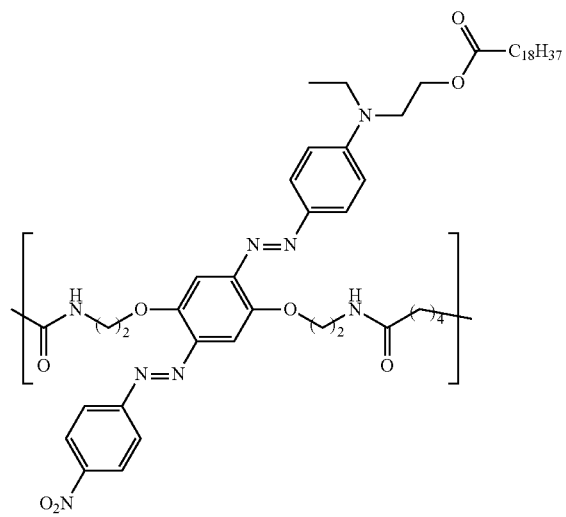

wherein m ranges from 1-300.

Additional aspects of the present disclosure include composite polymeric materials of the following general formula:

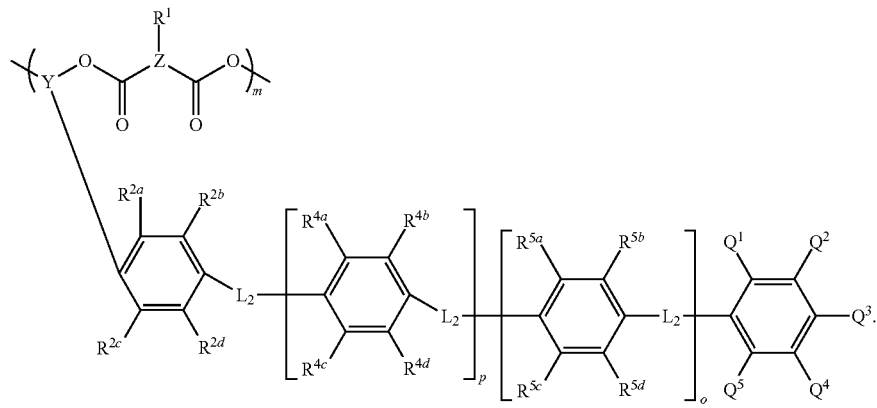

In the foregoing general formula $R^1$, $R^{2a}$, $R^{2b}$, $R^{2c}$, $R^{2d}$, $R^{4a}$, $R^{4b}$, $R^{4c}$, $R^{4d}$, $R^{5a}$, $R^{5b}$, $R^{5c}$, $R^{5d}$ are independently selected from —H, —OH, —Ak, -Ak-X, —OAk, or —OAk-$X_l$, $L_2$ is a heteroatom bridge in conjugation with the ring system containing $R^{2a}$, $R^{2b}$, $R^{2c}$, $R^{2d}$, $Q^1$, $Q^2$, $Q^3$, $Q^4$, $Q^5$; wherein $R^{2a}$, $R^{2b}$, $R^{2c}$, $R^{2d}$, $Q^1$, $Q^2$, $Q^3$, $Q^4$, $Q^5$ are each independently selected from —H and any electron withdrawing or electron donating group, wherein Ak is alkyl, X is any halogen, wherein o is 0-10, p is 0-1 when o is less than or equal to one and 1 when o is greater than 1, wherein $R^1$ is an insulating resistive tail; wherein Z is substituted or unsubstituted hydrocarbon cyclic or chain linkage, Y is any hydrocarbon chain which may be interrupted by a hetero atom at the point of attachment.

In some implementations of composite polymeric materials of the above general formula, the composite polymeric material may have structure 22:

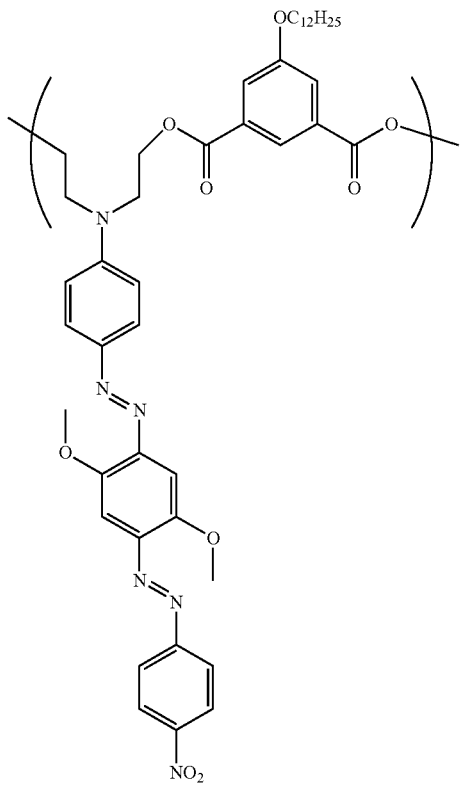

wherein m ranges from 1-300.

In some implementations of composite polymeric materials of the above general formula, $R^1$ may possess at least 7 carbon atoms.

In some implementations of composite polymeric materials of the above general formula, $R^1$ may be an insulating resistive tail selected from the group consisting of saturated hydrocarbon, saturated halogenated hydrocarbon, partially halogenated hydrocarbon, aryl chain, and cycloalkyl, and X—RR'R"; wherein X is selected from C, O, N, and S, and R, R', and R" are independently selected from H and $C_{5-50}$, wherein one or more of R, R', and R" is $C_{5-50}$.

In some implementations of composite polymeric materials of the above general formula, $R^1$ may be a rigid insulating resistive tail. In some such implementations, the rigid insulating resistive tail may be selected from the group consisting of non-aromatic carbocycles and non-aromatic heterocycles.

In some implementations of composite polymeric materials of the above general formula, $Q_1$, $Q_2$, $Q_3$, $Q_4$ and $Q_5$ may each be independently selected from —$NO_2$, —$NH_3^+$ and —NRR'R"+ (quaternary nitrogen salts) with counterion Cl— or Br—, —CHO (aldehyde), —CRO (keto group), —$SO_3H$ (sulfonic acids), —$SO_3R$ (sulfonates), $SO_2NH_2$ (sulfonamides), —COOH (carboxylic acid), —COOR (esters, from carboxylic acid side), —COCl (carboxylic acid chlorides), —$CONH_2$ (amides, from carboxylic acid side), —$CF_3$, —$CCl_3$, —CN, —O— (phenoxides) with counter ion $Na^+$ or $K^+$, —$NH_2$, —NHR, —$NR_2$, —OH, OR (ethers), —NHCOR (amides, from amine side), —OCOR (esters, from alcohol side), alkyls, —$C_6H_5$, vinyls, wherein R and R' and R" are radicals selected from the list comprising hydrogen, alkyl (methyl, ethyl, isopropyl, tert-butyl, neopentyl, cyclohexyl etc.), allyl (—CH2-CH=CH2), benzyl (—CH2C6H5) groups, phenyl (+substituted phenyl) and other aryl (aromatic) groups. In some such implementations, one or more of $Q^1$, $Q^2$, $Q^3$, $Q^4$, and $Q^5$ may be —$NO_2$.

The present disclosure provides a metacapacitor comprising two metal electrodes positioned parallel to each other and which can be rolled or flat and planar and a metadielectric layer between said electrodes and optionally an insulation layer. The metadielectric layer comprises polarizable compounds that include composite polymeric materials of any of the general formulae and implementations discussed above and as disclosed in further detail below.

Further, the disclosure provides a stacked metacapacitor comprising the stacked structure sequence $E(DED)_m$, wherein E are electrodes and D are metadielectric layers, and m is an integer greater than or equal to 1. In another embodiment, the disclosure provides a stacked metacapacitor comprising a stack of $(EDT)_m$ wherein E is an electrode, D is a metadielectric layer, T is a tape of an electrode and isolation layer. In still another embodiment, a metacapacitor will have a sequence $(E-B1-D-B2-E-B1-D)_m$ wherein E are electrodes, B1 and B2 are respectively a hole blocking layer and electron blocking layer (or vice versa), and D is a metadielectric layer. In the three aforementioned embodiments, m is an integer greater than or equal to 1.

A metadielectric layer may be a film made from composite polymers referred to herein as YanLi materials. Such a composite polymeric material is characterized by a chemical structure that includes a repeating backbone unit, a polarizable unit, and a resistive tail. The polarizable unit must possess a high degree of conjugation. Herein, we define "polarizable unit" to mean any multicyclic arrangement where electrons are delocalized over the entire portion of the polarizable unit structure via conjugated single and double bonds. Herein, anisometric is defined as the condition of a molecule possessing charge or partial charge asymmetry along an axis. Possible, non-limiting, forms of this conjugation are polycyclic fused aromatic systems or a conjugated bridge where aromatic systems are connected by alternating single and double bonds.

By way of example, and not by way of limitation, according to aspects of the present disclosure, a metadielectric film may include a polymer matrix and at least one material of any of the four general formulae discussed above or any specific implementations mentioned above or discussed further below.

In some embodiments, the metadielectric layer may be comprised of a mixture or YanLi materials selected from at least one YanLi material of the four general formulae discussed above or a mixture of any specific implementations mentioned above.

Alternatively, the metadielectric layer maybe comprised of any organic composite oligomers, compounds, or polymers as disclosed in U.S. patent application Ser. No. 14/710,491 filed May 12, 2015, Ser. No. 15/043,186 filed Feb. 12, 2016, Ser. No. 15/043,209 filed Feb. 12, 2016, Ser. No. 15/194,224 filed Jun. 27, 2016, Ser. No. 15/043,247 filed Feb. 12, 2016, Ser. No. 15/090,509 filed Apr. 4, 2016, and Ser. No. 15/163,595 filed May 24, 2016 all of which are entirely incorporated herein.

In some implementations of the above metadielectric film, the polymer matrix may additionally include at least one monomer selected from acrylate, ester, aramid, repeat units of which YanLi polymers are comprised.

In some implementations of the above metadielectric film, the film may include a plasticizer.

In some implementations of the above metadielectric film, the film may include a mixture of polyacrylate and polyamide materials.

In some implementations of the above metadielectric film, the film may have a relative permittivity greater than or equal to 1000, a resistivity greater than or equal to $10^{16}$ Ohm cm.

According to aspects of the present disclosure, metadielectric films of the type described herein may be used in metacapacitors. By way of example, and not by way of limitation, a metacapacitor according to certain aspects of the present disclosure may include a first electrode, a second electrode, and a metadielectric film, e.g., as described generally above or in further detail below, sandwiched between said first and second electrodes.

In some implementations, such a metacapacitor may be characterized by a capacitance that varies non-linearly with voltage.

In some implementations, one or more of the electrodes may be formed on a substrate of flexible tape, wherein the substrate, first and second electrodes, and the metadielectric film are coiled such that the substrate forms an isolation layer between the first and second electrodes, and wherein the substrate is selected from the list of materials according to claim 1 and plastic films.

FIG. 1 illustrates an example of a metacapacitor comprising a first electrode 1, a second electrode 2, and a metadielectric layer 3 disposed between said first and second electrodes as shown in FIG. 1. The electrodes 1 and 2 may be made of a metal, such as copper, zinc, or aluminum or other conductive material such as graphite or carbon nanomaterials and are generally planar in shape.

The electrodes 1, 2 may be flat and planar and positioned parallel to each other. Alternatively, the electrodes may be planar and parallel, but not necessarily flat, they may be coiled, rolled, bent, folded, or otherwise shaped to form the capacitor. It is also possible for the electrodes to be non-flat, non-planar, or non-parallel or some combination of two or more of these. By way of example and not by way of limitation, a spacing d between the electrodes 1 and 2 may range from about 3 nm to about 100 m. The maximum voltage $V_{bd}$ between the electrodes 1 and 2 is approximately the product of the breakdown field $E_{bd}$ and the electrode spacing d. If $E_{bd}$=0.1 V/nm and the spacing d between the electrodes 1 and 2 is 100 microns (100,000 nm), the maximum voltage $V_{bd}$ would be 10,000 volts.

Additionally, the metacapacitor may have an insulation layer to insulate electrodes 1 and 2 from making ohmic contact with each other in coiled, rolled, bent, and folded embodiments. Non-limiting examples of the insulation layer include metadielectric material, polypropylene (PP), polyethylene terephthalate polyester (PET), polyphenylene sulfide (PPS), polyethylene naphthalate (PEN), polycarbonate (PP), polystyrene (PS), and polytetrafluoroethylene (PTFE).

The electrodes 1 and 2 may have the same shape as each other, the same dimensions, and the same area A. By way of example, and not by way of limitation, the area A of each electrode 1 and 2 may range from about 0.01 $m^2$ to about 1000 $m^2$. By way of example and not by way of limitation for rolled capacitors, electrodes up to, e.g., 1000 m long and 1 m wide.

These ranges are non-limiting. Other ranges of the electrode spacing d and area A are within the scope of the aspects of the present disclosure.

If the spacing d is small compared to the characteristic linear dimensions of electrodes (e.g., length and/or width), the capacitance C of the capacitor may be approximated by the formula:

$$C=\varepsilon\varepsilon_o A/d, \qquad (V)$$

where $\varepsilon_o$ is the permittivity of free space ($8.85\times10^{-12}$ Coulombs$^2$/(Newton·meter$^2$)) and $\varepsilon$ is the dielectric constant of the dielectric layer. The energy storage capacity U of the capacitor may be approximated as:

$$U=\tfrac{1}{2}\varepsilon\varepsilon_o A E_{bd}^2 d \qquad (VI)$$

The energy storage capacity U is determined by the dielectric constant c, the area A, the electrode spacing d, and the breakdown field $E_{bd}$. By appropriate engineering, a capacitor or capacitor bank may be designed to have any desired energy storage capacity U. By way of example, and not by way of limitation, given the above ranges for the dielectric constant c, electrode area A, and breakdown field $E_{bd}$ a capacitor in accordance with aspects of the present disclosure may have an energy storage capacity U ranging from about 500 Joules to about $2 \cdot 10^{16}$ Joules.

For a dielectric constant c ranging, e.g., from about 100 to about 1,000,000 and constant breakdown field $E_{bd}$ between, e.g., about 0.1 and 0.5 V/nm, a capacitor of the type described herein may have a specific energy capacity per unit mass ranging from about 10 W·h/kg up to about 100,000 W·h/kg, though implementations are not so limited.

Alternatively, in some embodiments, electrodes 1 and 2 may have different shapes from each other with the same or different dimensions, and the same or different areas.

Figure 2A:
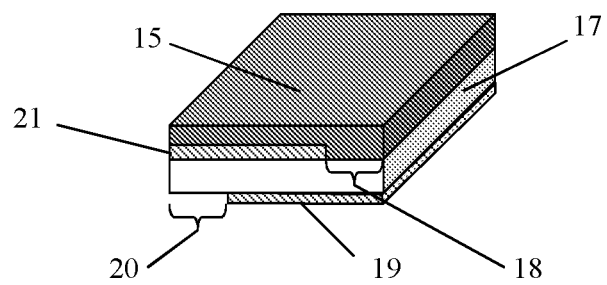
FIG. 2A shows a formation of two metal strips on top and bottom surfaces of the plastic layer for a coiled metacapacitor according to an aspect of the present disclosure.
Figure 2B:
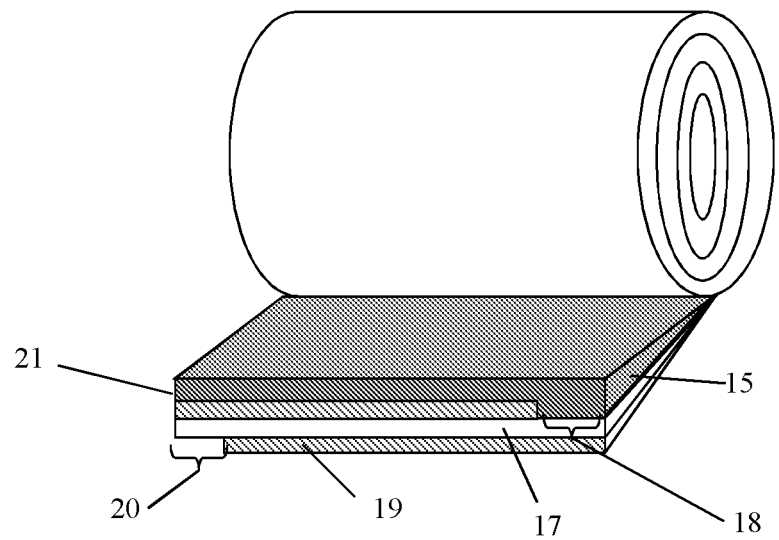
FIG. 2B shows a winding of the multilayered tape for a coiled metacapacitor according to an aspect of the present disclosure.
Figure 3:
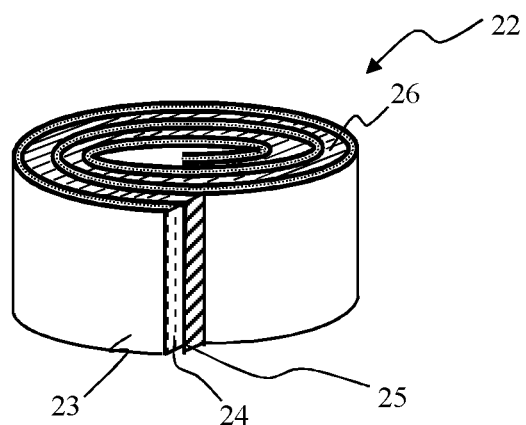
FIG. 3 shows a coiled film metacapacitor according to an aspect of the present disclosure.

The present disclosure includes metacapacitors that are coiled, e.g., as depicted in FIGS. 2A, 2B and 3. As shown in FIG. 2A, electrodes 19, 21, e.g., metal electrodes, are formed onto opposite surfaces of a metadielectric layer 17 with margin portions 18, 20 that are free of metal located on opposite edges of the metadielectric layer 17. In some embodiments, such a configuration of electrodes 19, 21 and metadielectric layer 17 form a tape or a multilayered tape. An electrically insulating layer 15, e.g., a plastic material is formed over one of the electrodes 21 or a plastic film is overlaid on one of the electrodes 21. The electrically insulating layer 15 may include metadielectric materials or common capacitor insulating materials such as PET. The metadielectric lay 17 may be formed, e.g., by applying a solution containing YanLi material to the electrode 19 and then drying the applied solution to form a solid layer of the YanLi material.

Alternatively, electrodes 19 and 21 may be formed onto opposite surfaces of an insulating layer 15 with margin portions 18, 20 that are free of electrode material located on opposite edges of the insulating layer 15. In some embodiments, such a configuration of electrodes 19, 21 and insulating layer 15 form a tape or a multilayered tape. The electrically insulating layer 15 may include metadielectric materials or common capacitor insulating materials such as PET. The metadielectric lay 17 may be formed, e.g., by applying a solution containing YanLi material to the electrode 19 and then drying the applied solution to form a solid layer of the YanLi material.

In some implementations, the applied YanLi material may be a polymerized solution of YanLi oligomers which is dried to form a metadielectric. In some implementations, the YanLi material may be polymerized to form a metadielectric. The thickness of the metadielectric layer may be a relatively uniformly thick layer. The metadielectric layer thickness may range from 0.01 m to 50 µm depending on the desired maximum capacitor voltage. In general, thicker metadielectric layers are used for higher maximum capacitor voltages. Furthermore, with a given metacapacitor the metadielectric layer thickness may vary due to normal manufacturing process variations, e.g., by about 1% to 10% of a nominal thickness value. In this example shown in FIG. 2A the first metal electrode 19 is formed on a portion of a first surface of the metadielectric layer 17 with a first margin portion 18 that is free of metal. The second electrode 21 is formed on a portion of a second surface of the plastic layer with a second margin portion 20 located on an opposite edge of the metadielectric layer 17 being free of metal. The multilayered structure depicted in FIG. 2A may be wound into a coil as shown in FIG. 2B. The insulating layer 15 prevents undesired electrical shorts between the first and second electrodes after being wound into the coil. By way of example and not by way of limitation, the insulating layer 15 may include a metadielectric material, polypropylene (PP), polyethylene terephthalate polyester (PET), polyphenylene sulfide (PPS), polyethylene naphthalate (PEN), polycarbonate (PP), polystyrene (PS), or polytetrafluoroethylene (PTFE).

Figure 4A:
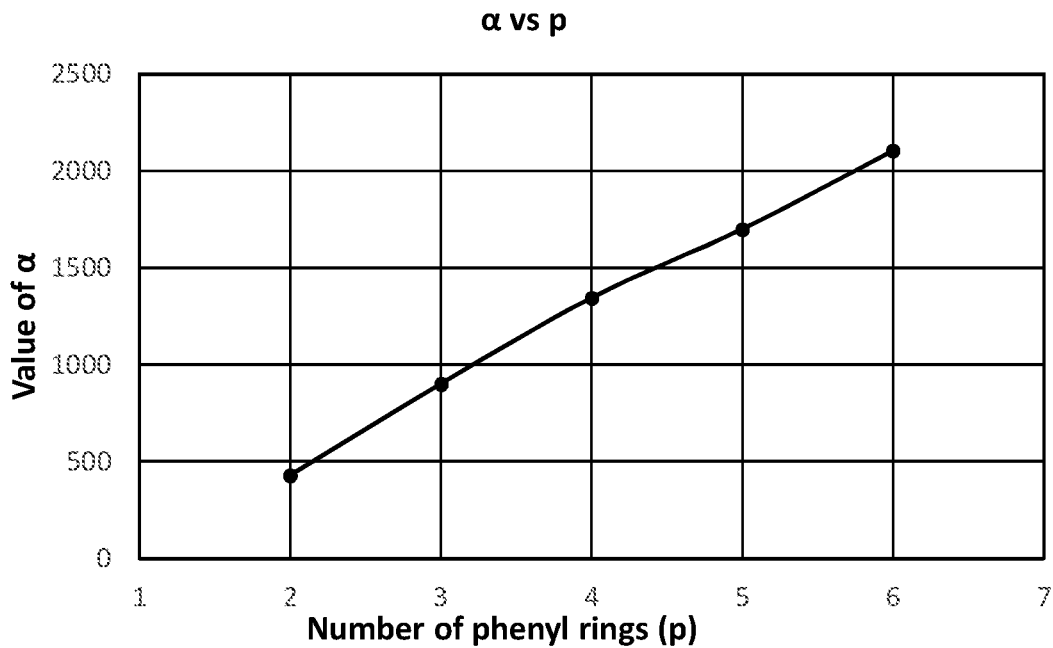
FIG. 4A depicts a graph of linear polarizability a versus number of phenyl rings p in a composite polymer according to an aspect of the present disclosure.
Figure 4B:
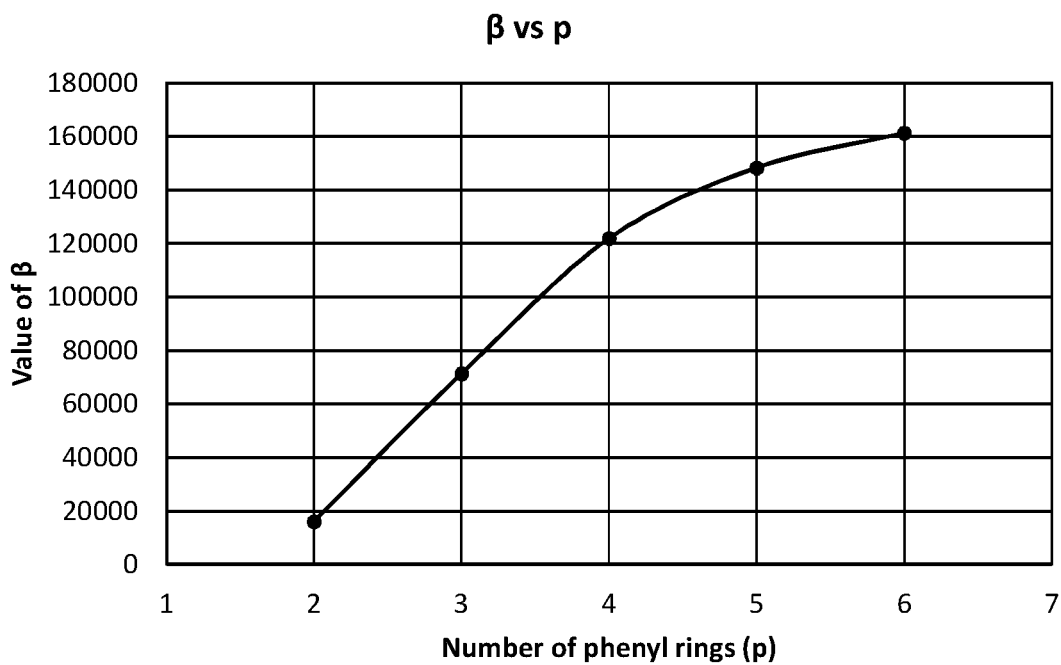
FIG. 4B depicts a graph of nonlinear polarizability 3 versus number of phenyl rings p in a composite polymer according to an aspect of the present disclosure.

In the example depicted in FIG. 4, a metacapacitor 22 comprises a first electrode 23, a second electrode 25, and a metadielectric material layer 24 of the type described herein disposed between said first and second electrodes. The electrodes 23 and 25 may be made of a metal, such as copper, zinc, or aluminum or other conductive material such as graphite or carbon nanomaterials and are generally planar in shape. In one implementation, the electrodes and metadielectric material layer 24 are in the form of long strips of material that are sandwiched together and wound into a coil along with an insulating material 26, e.g., a plastic film such as polypropylene or polyester to prevent electrical shorting between the electrodes 23 and 25. Alternatively, the insulating material may include a metadielectric layer comprised of any composite oligomer or polymer formed therefrom or mixture thereof, as described herein below. In some embodiments, the electrodes may be multilayered structures consisting of a conductive layer and any combination of one or more of layers selected from the list of field planarization layer, surface planarization layer, electron blocking layer, and hole blocking layer. For examples, a metacapacitor may have a sequence $(E-B1-D2-B2-E-B1-D^2)_m$ wherein E are electrodes, B1 and B2 are respectively a hole blocking layer and electron blocking layer (or vice versa), D1 is a metadielectric layer, D2 is selected from a metadielectric layer or a plastic isolation layer (i.e. polypropylene), and m is an integer greater than or equal to 1. Non-limiting examples of capacitors and electrodes comprised of field planarization and surface planarization layers are described in U.S. patent application Ser. No. 15/368,171 which is herein incorporated by reference in its entirety.

Figure 5:
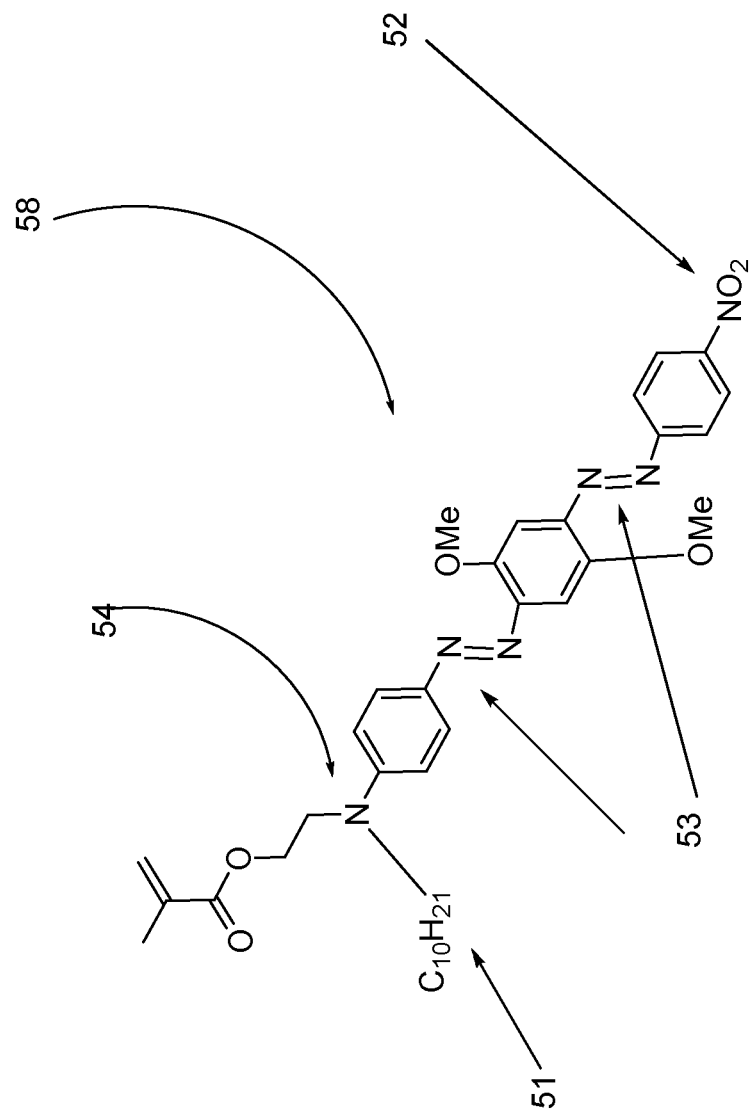
FIG. 5 illustrates an example of the chemical structure of a YanLi material as a monomer of a polymer, wherein the polarizable unit is a doped chromophore 58, having an electron donor 54, two conjugated bridges 53, and an electron acceptor 52. A tail 51 is covalently bounded to the electron donor group 54. A composite oligomer forming the polarizable unit can have more than one electron donor 54, electron acceptor 52, and tail 51.

Non-limiting examples of suitable coiled capacitors are described in U.S. patent application Ser. No. 14/752,600 which is herein incorporated by reference in their entirety. In this aspect, the present invention provides a coiled capacitor comprising a coil formed by a flexible multilayered tape, and a first terminating electrode (a first contact layer) and a second terminating electrode (a second contact layer) which are located on butts of the coil. The flexible multilayered tape contains the following sequence of layers: first metal layer, a layer of a plastic, second metal layer, a layer of energy storage material. The first metal layer forms an ohmic contact with the first terminating electrode (the first contact layer) and the second metal layer (the second contact layer) forms an ohmic contact with the second terminating electrode. The layer of energy storage material may be any oligomer or polymer described herein FIG. 5 illustrates an example of the in the chemical structure of a YanLi material as a monomer of a polymer, wherein the polarizable unit is a doped chromophore 58, having an electron donor 54, two conjugated bridges 53, an electron acceptor 52. A tail 51 is covalently bounded to the electron donor group 54. A composite oligomer forming the polarizable unit can have more than one electron donor 54, electron acceptor 52, and tail 51. In some embodiments, the composite oligomer forming the polarizable unit has an aromatic ring system in conjugation with a conjugated bridge. In some embodiments, the aromatic ring system consists of fused aromatic rings in conjugation. According to aspects of the present disclosure, a composite oligomer may comprise a mixture of molecules. YanLi monomers of the type shown in FIG. 5 may be polymerized to synthesize a YanLi polymer and dried or cured to form a YanLi dielectric.

In one embodiment of the present disclosure, the layer's relative permittivity is greater than or equal to 1000. In another embodiment of the present disclosure, the polarization (P) of the metadielectric layer comprises first-order ($\varepsilon_{(1)}$) and second-order ($\varepsilon_{(2)}$) and third order ($\varepsilon_{(3)}$) permittivities according to the following formula:

$$P=\varepsilon_0(\varepsilon_1-1)\varepsilon+\varepsilon_0\varepsilon_2 E^2+\varepsilon_0\varepsilon_3 E^3+\ldots$$

where P is the polarization of the material, which also can be represented by the following formula:

$$P=NP_{induced}$$

where $P_{induced}$ is the induced polarization which can be expressed by the formula:

$$P_{induced}=\alpha E_{loc}+\beta E_{loc}^2+\gamma E_{loc}^3+\ldots$$

where $E_{loc}$ is the localized field and is expressed by the formula:

$$E_{loc}=E+P/(3\varepsilon_0)$$

The real part of the relative permittivity ($\varepsilon'$) as can be seen from the above equations, also comprises first, second, and third order permittivities. Further, permittivity of a capacitor is a function of applied voltage and thickness of the capacitor's dielectric (d). Where voltage is the DC-voltage which is applied to the metadielectric layer, and d is the layer thickness. In another embodiment of the present invention, the metadielectric layer's resistivity is greater than or equal to $10^{15}$ ohm cm. In some embodiment of the present invention, the metadielectric layer's resistivity is between $10^{16}$ ohm cm and $10^{22}$ ohm cm.

Alternatively, in some embodiments the metadielectric layer may be comprised of the aforementioned YanLi materials and the aforementioned oligomers, compounds, polymers, monomers or polymers of the backbone units of said YanLi materials, one or more plasticizers (phthalates or non-phthalates), or any combination thereof. Use of non-ionic plasticizers can improve the metadielectric layer's resistivity through smoothing out electric field lines. This phenomenon occurs when the plasticizers fill voids and/or assists in supramolecular alignment. Additionally, plasticizers can improve the material's mechanical properties by reducing brittleness of the material during and post processing.

In one embodiment, the composite polymer comprises more than one type of resistive tails. In another embodiment, the composite polymer comprises more than one type of ordered resistive tails. In yet another embodiment, the composite polymer comprises at least one resistive tail or at least one type of ordered resistive tails.

In order that the invention may be more readily understood, reference is made to the following examples, which are intended to be illustrative of the invention, but are not intended to limit the scope.

In one embodiment, a liquid or solid composite polymer is placed between the first and second electrodes. A solid chromophore is, for example, pressed into a pellet and placed between the first electrode and the second electrode. The chromophore can be ground into a powder before pressing.

In another embodiment, at least one type of YanLi polymer or YanLi oligomer may be dissolved or suspended in a solvent. The resultant material can be spin coated, extruded via slot die, roll-to-roll coated, or pulled and dried to form a dielectric film.

In another embodiment, a composite oligomer may be dissolved or suspended in a polymer. This is termed a "guest-host" system where the oligomer is the guest and the polymer is the host. Polymer hosts include, but are not limited to, poly(methyl methacrylate), polyimides, polycarbonates and poly($\varepsilon$-caprolactone). These systems are cross-linked or non-cross-linked. In some instances, it may be beneficial to use tailless composite oligomers.

In another embodiment, a composite oligomer may be attached to a polymer. This is termed a "side-chain polymer" system. This system has the advantages over guest-host systems because high composite oligomer concentrations are incorporated into the polymer with high order and regularity and without phase separation or concentration gradients. Side chain polymers include, but are not limited to, poly[4-(2,2-dicyanovinyl)-N-bis(hydroxyethyl)aniline-alt-(4,4'-methylenebis(phenylisocyanate))]urethane, poly[4-(2,2-dicyanovinyl)-N-bis(hydroxyethyl)aniline-alt-(isophoronediisocyanate)]urethane, poly(9H-carbazole-9-ethyl acrylate), poly(9H-carbazole-9-ethyl methacrylate), poly(Disperse Orange 3 acrylamide), poly(Disperse Orange 3 methacrylamide), poly(Disperse Red 1 acrylate), poly(Disperse Red 13 acrylate), poly(Disperse Red 1 methacrylate), poly(Disperse Red 13 methacrylate), poly[(Disperse Red 19)-alt-(1,4-diphenylmethane urethane)], poly(Disperse Red 19-p-phenylene diacrylate), poly(Disperse Yellow 7 acrylate), poly(Disperse Yellow 7 methacrylate), poly[(methyl methacrylate)-co-(9-H-carbazole-9-ethyl acrylate)], poly[(methyl methacrylate)-co-(9-H-carbazole-9-ethyl methacrylate)], poly[methyl methacrylate-co-(Disperse Orange 3 acrylamide)], poly[methyl methacrylate-co-(Disperse Orange 3 methacrylamide)], poly[(methyl methacrylate)-co-(Disperse Red 1 acrylate)], poly[(methyl methacrylate)-co-(Disperse Red 1 methacrylate)], poly[(methyl methacrylate)-co-(Disperse Red 13 acrylate)], poly[(methyl methacrylate)-co-(Disperse Red 13 methacrylate)], poly[methyl methacrylate-co-(Disperse Yellow 7 acrylate)], poly[methyl methacrylate-co-(Disperse Yellow 7 methacrylate)], poly [[(S)-1-(4-nitrophenyl)-2-pyrrolidinemethyl]acrylate], poly[((S)-(−)-1-(4-nitrophenyl)-2-pyrrolidinemethyl)acrylate-co-methyl methacrylate], poly [[(S)-1-(4-nitrophenyl)-2-pyrrolidinemethyl]methacrylate] and poly[((S)-(−)-1-(4-nitrophenyl)-2-pyrrolidinemethyl)methacrylate-co-methyl methacrylate]. These systems are cross-linked or non-cross-linked.

In another embodiment, composite oligomers may be embedded in matrices such as oxides, halides, salts and organic glasses. An example of a matrix is inorganic glasses comprising the oxides of aluminum, boron, silicon, titanium, vanadium and zirconium.

According to aspects of the present disclosure, the polymers that make up a YanLi dielectric may be aligned, partially aligned or unaligned. The composite polymer is preferably aligned for optimal geometric configuration of polarizing units as this results in higher capacitance values in the capacitor. One method of alignment is to apply a DC electric field to the composite polymer at a temperature at which the polarizable units can be oriented. This method is termed "poling." Poling is generally performed near the glass transition temperature of polymeric and glassy systems. One possible method of poling is corona poling. Other methods of alignment could be roll-to-roll, Meyer bar, dip, slot die, and air knife coating of solutions and liquid crystal solutions of said side-chain polymers or composite oligomers.

In some instances, the side-chain polymer or composite oligomers may form liquid crystals in solution or solvent and with or without external influence. Non-limiting examples of liquid crystals include lyotropic and thermotropic liquid crystals. Non-limiting examples of external influences include heat, electric field, mechanical disturbances (e.g. vibration or sonication), and electromagnetic radiation. Said liquid crystals are supramolecular structures comprised of said side-chain polymers or composite oligomer in solution or solvent and are ordered and aligned or partially ordered or partially aligned. Such liquid crystal materials may be coated onto a substrate, e.g., by roll-to-roll, Meyer bar, dip, slot die, or air knife coating in a process that includes mechanical ordering of the liquid crystals, and drying of the liquid crystal solution or evaporation of the solvent such that the liquid crystals form a crystalline or semi-crystalline layer or film of metadielectric material. Alternatively, such liquid crystal materials may be extruded as a film such that the liquid crystals form a crystalline or semi-crystalline film of metadielectric material. In some instances, extrusion of such liquid crystal materials may be coextruded as a multilayer film. Such multilayer films may include alternating layers of conducting layers and insulating layers, wherein the insulating layers may be the aforementioned crystalline or semi-crystalline layer of metadielectric material.

Preferred polymer embodiments are polyester, polyalkylacrylate (preferably methacrylic and acrylic), polyamide, and polyaramid. This resistive tail may be attached to the polarizable side chain or may be its own independent side chain interspersed in any pattern or random assortment with the polarizable side chains or a mixture thereof. These species can be represented by one of the following formula.

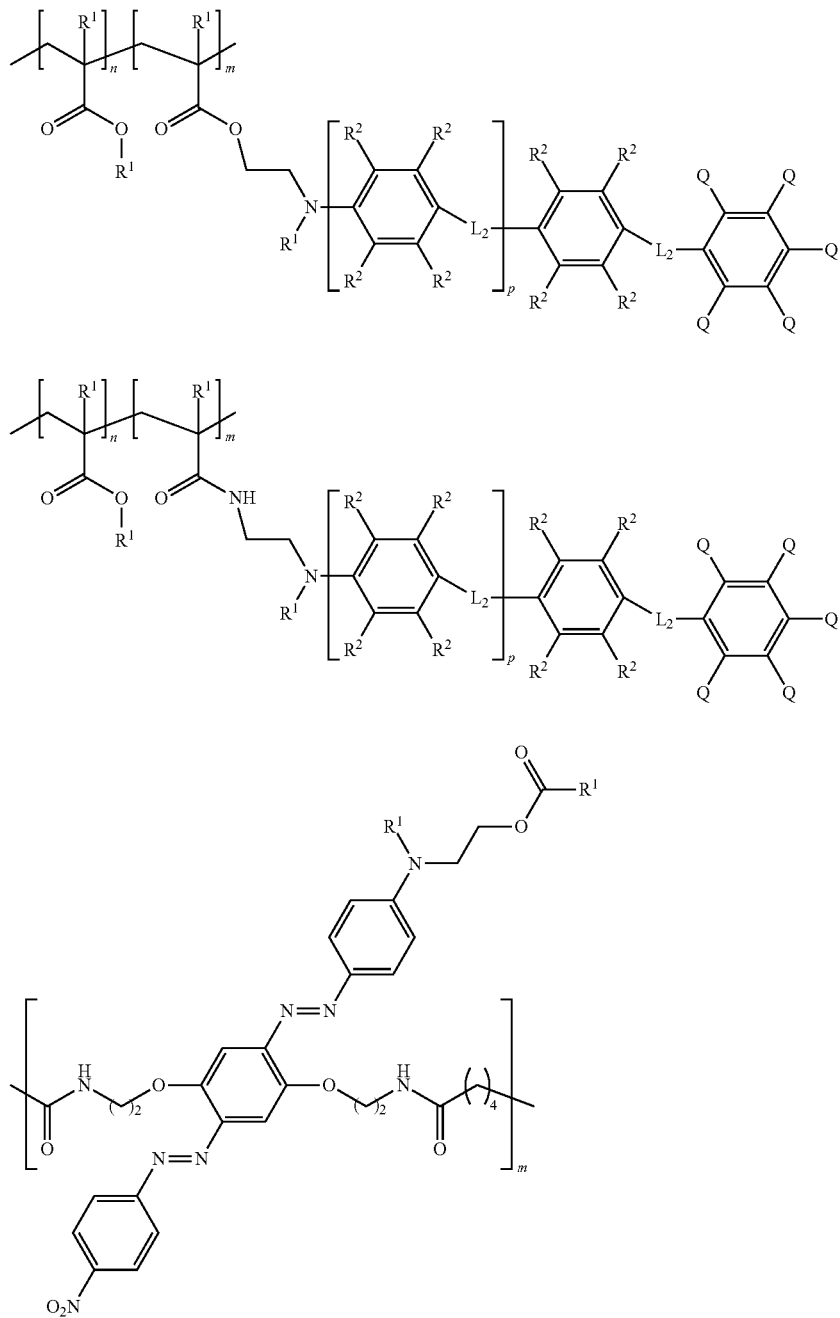

-continued
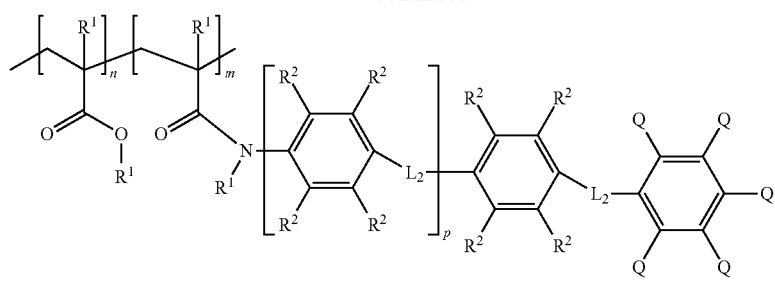
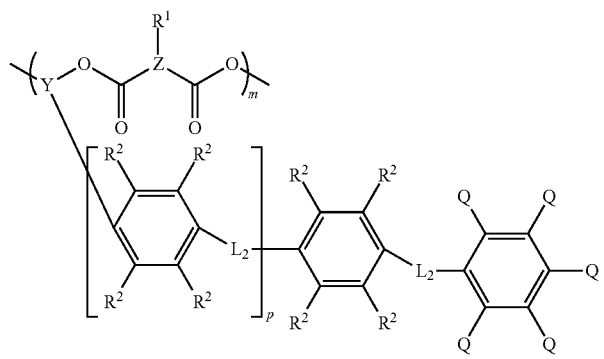
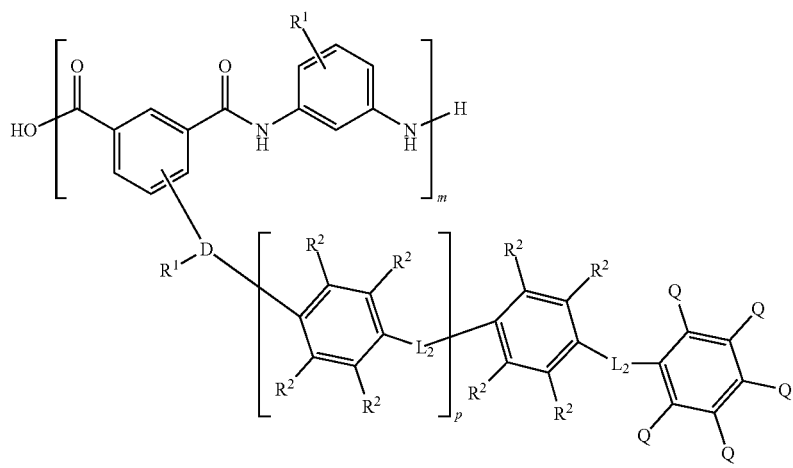
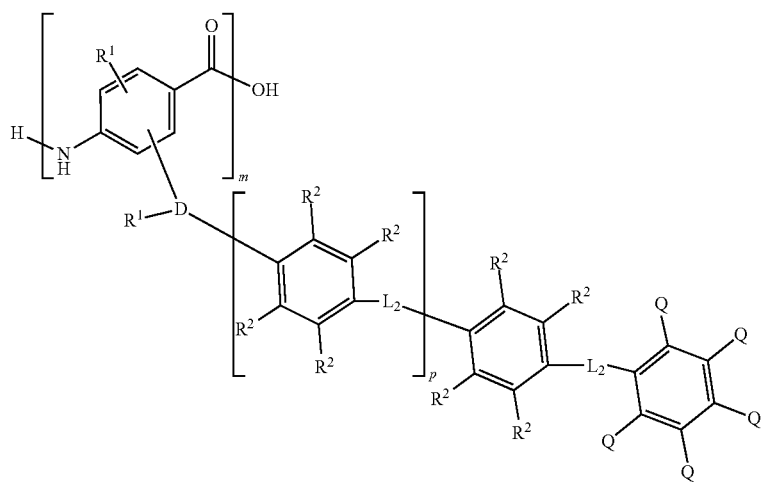

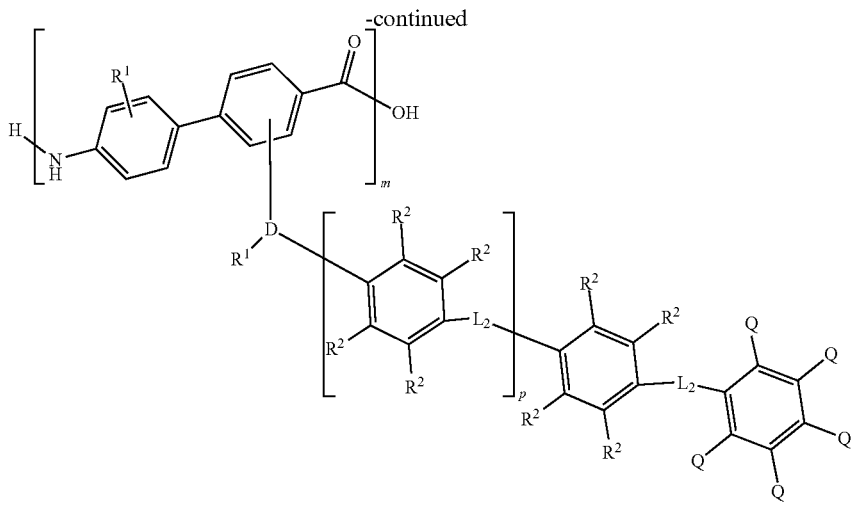

Wherein, each instance of $R^1$ is independently selected from —H, —OH, —Ak, alkoxy, —OAk-$X_o$, or —Ak-$X_o$, each instance of $R^2$ is independently selected from —H, —OH, —OAk, or —OAk-$X_o$; D is any hydrocarbon chain which may be interrupted by hetero atoms at the point of backbone attachment and side chain attachment, $L_2$ is a heteroatom bridge in conjugation with the ring system of the side chain (e.g. azo-bridge, alkene bridge, and alkyne bridge), each instance of Q is independently selected from any electron donating or electron withdrawing group or H, Z is substituted or unsubstituted hydrocarbon cyclic or chain linkage, Y is any hydrocarbon chain which may be interrupted by a hetero atom at the point of attachment to the side chain, Ak is alkyl, X is any halogen, n is 0-150, m is 1-300, o is 1-51, p is 0-10, q is 0-4, and r is 0-4, with the provisio that at least one instance of $R^1$ must be a resistive tail. Preferred, but not limiting, embodiments of resistive tails include hydrocarbon and halohydrocarbon chains, non-aromatic hydrocarbocycles, and non-aromatic heterocycles. In some embodiments, it may be preferable for the resistive tails to be ridged. In such embodiments, rigid resistive tails maybe non-aromatic carbocycles or non-aromatic heterocycles.

The conjugated aromatic ring system may be made further polarizable by adding a variety of functional groups to various cyclic positions of the structure. Incorporating electron donors and electron acceptors is one way to enhance the polarizability. Electrophilic groups (electron acceptors) are selected from —$NO_2$, —$NH_3^+$ and —$NR_3^+$ (quaternary nitrogen salts), counterion $Cl^-$ or $Br^-$, —CHO (aldehyde), —CRO (keto group), —$SO_3H$ (sulfonic acids), —$SO_3R$ (sulfonates), $SO_2NH_2$ (sulfonamides), —COOH (carboxylic acid), —COOR (esters, from carboxylic acid side), —COCl (carboxylic acid chlorides), —$CONH_2$ (amides, from carboxylic acid side), —$CF_3$, —$CCl_3$, —CN, wherein R is radical selected from the list comprising alkyl (methyl, ethyl, isopropyl, tert-butyl, neopentyl, cyclohexyl etc.), allyl (—$CH_2$—CH=$CH_2$), benzyl (—$CH_2C_6H_5$) groups, phenyl (+substituted phenyl) and other aryl (aromatic) groups. Nucleophilic groups (electron donors) are selected from —$O^-$ (phenoxides, like —ONa or —OK), —$NH_2$, —NHR, —$NR_2$, —NRR', —OH, OR (ethers), —NHCOR (amides, from amine side), —OCOR (esters, from alcohol side), alkyls, —$C_6H_5$, vinyls, wherein R and R' are radicals independently selected from the list comprising alkyl (methyl, ethyl, isopropyl, tert-butyl, neopentyl, cyclohexyl etc.), allyl (—CH2—CH=CH2), benzyl (—CH2C6H5) groups, phenyl (+substituted phenyl) and other aryl (aromatic) groups. Preferred electron donors include, but are not limited to, amino and phosphino groups and combinations thereof. Preferred electron acceptors include, but are not limited to, nitro, carbonyl, oxo, thioxo, sulfonyl, malononitrile, isoxazolone, cyano, dicyano, tricyano, tetracycano, nitrile, dicarbonitrile, tricarbonitrile, thioxodihydropyrimidinedione groups and combinations thereof. More conjugated bridges include, but are not limited to, 1,2-diphenylethene, 1,2-diphenyldiazene, styrene, hexa-1,3,5-trienylbenzene and 1,4-di(thiophen-2-yl)buta-1,3-diene, alkenes, dienes, trienes, polyenes, diazenes and combinations thereof.

Existence of the electrophilic groups (acceptors) and the nucleophilic groups (donors) in the aromatic polycyclic conjugated molecule promotes increase of electronic polarizability of these molecules. Under the influence of external electric field electrons are displaced across the polarizable unit to compensate the electric field. The nucleophilic groups (donors) and the electrophilic groups (acceptors) add to the electron density of the polarizable unit, which increases polarizability of such molecules and ability to form compensating electric field counter in the presence of an electric field. Thus a distribution of electronic density in the molecules is non-uniform. The presence of the polarizable units leads to increasing of polarization ability of the disclosed material because of electronic conductivity of the polarizable units.

Increasing the number of phenyl rings 'p' can increase the linear polarizability ($\alpha$) and the nonlinear polarizability ($\beta$) of the conjugated side chain, as seen in the graphs '$\alpha$ vs p' (depicted in FIG. 4A) and '$\beta$ vs p' (depicted in FIG. 4B), and corresponding Table 1 below, which lists comparative values of $\alpha$ and $\beta$ for chromophores having different numbers of phenyl rings. However, increasing the number of conjugated aromatic rings reduces the side chains solubility. Addition of alkoxy groups to at least one of the side chain rings can improve solubility of the choromophores while maintaining high non-linear polarization or slightly improving it. One preferential embodiment is placement of two methoxy groups on a ring that is separated by one conjugated bridge and ring from an electron donating group.

TABLE 1

Impact of number of rings on polarizability

| p | α | β |
|---|-----|--------|
| 2 | 427 | 16067 |
| 3 | 900 | 71292 |
| 4 | 1343 | 121801 |
| 5 | 1699 | 148208 |
| 6 | 2103 | 161156 |

Ionic groups may increase polarization of the disclosed YanLi material when zwitterionic groups are covalently attached to YanLi polymer sidechains. The polarizable units can be nonlinearly polarizable and may be comprised of an aromatic polycyclic conjugated molecule with at least one dopant group, the polarizable units and are placed into a resistive dielectric envelope formed by resistive substituents. In some instances, the resistive substituents provide solubility of the organic compound in a solvent and act to electrically insulate supramolecular structures comprised of YanLi polymers from neighboring supramolecular structures of YanLi polymers. Additionally, said resistive substituents may act to electrically insulate intra-polymer side chains from one another. A non-centrosymmetric arrangement of the dopant group(s) can lead to a strong nonlinear response of the compound's electronic polarization in the presence of an electric field. Additionally, an anisometric molecule or polarizing unit can lead to a strong nonlinear response of the compound's electronic polarization in the presence of an electric field. Resistive substituents (e.g. resistive tails described above) increase the electric strength of these polarizable compounds and breakdown voltage of the dielectric layers made on their basis.

Specific, but non-limiting embodiments are shown in the following table, wherein co-polymer variants are preferentially alternating more or less one-to-one, or more-or-less randomly. Di-block co-polymer embodiments being less preferential to alternating monomers one-to-one and random or near random arrangements.

TABLE 2

Examples of YanLi Polymers

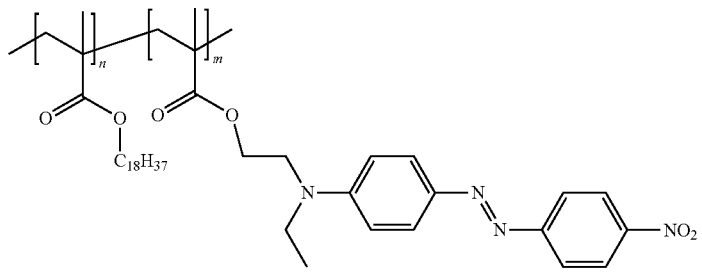

1

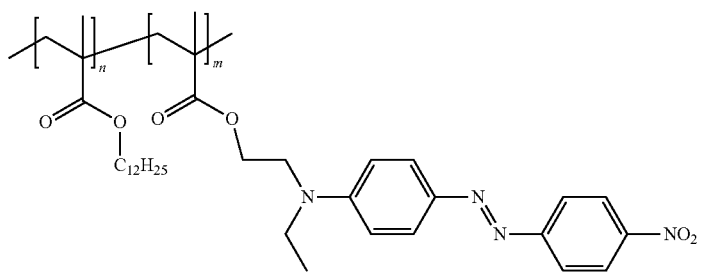

2

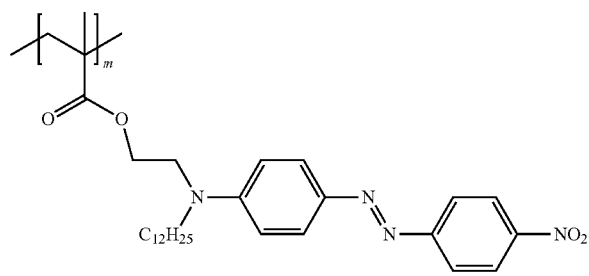

3

TABLE 2-continued
Examples of YanLi Polymers
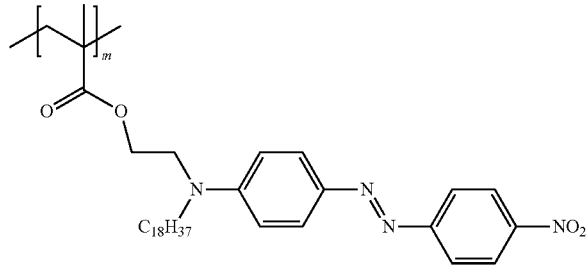
4
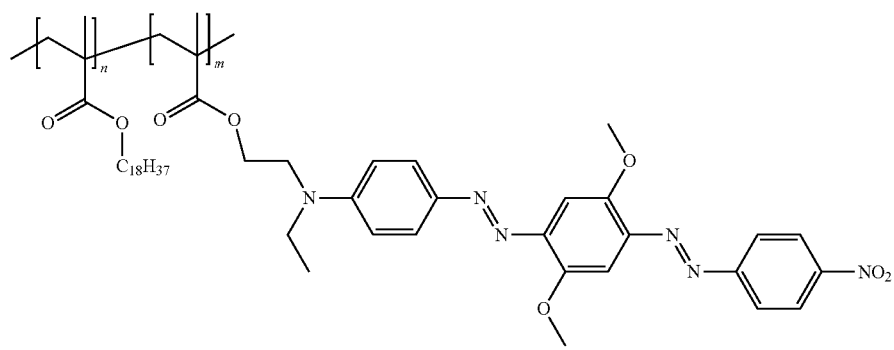
5
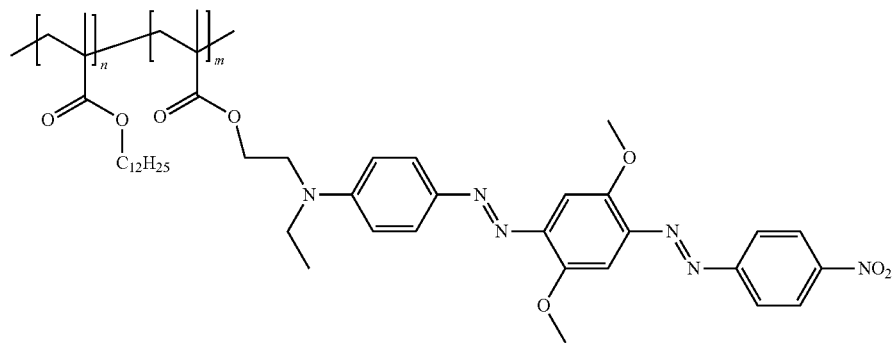
6
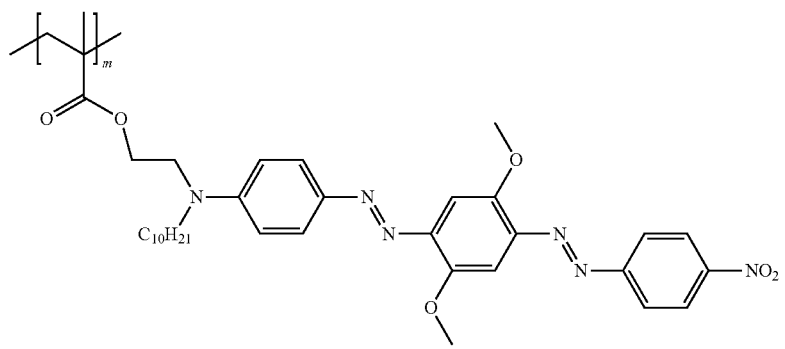
7

TABLE 2-continued
Examples of YanLi Polymers
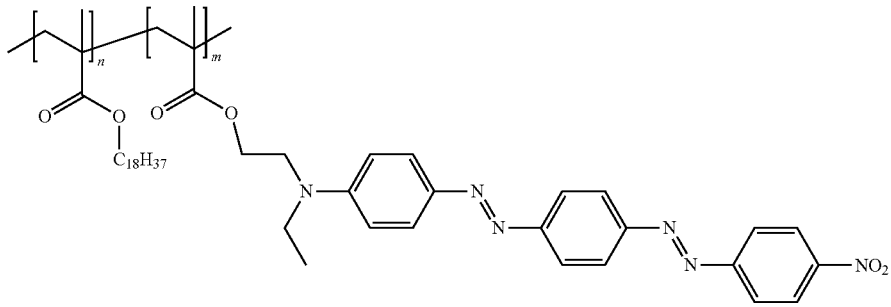
8
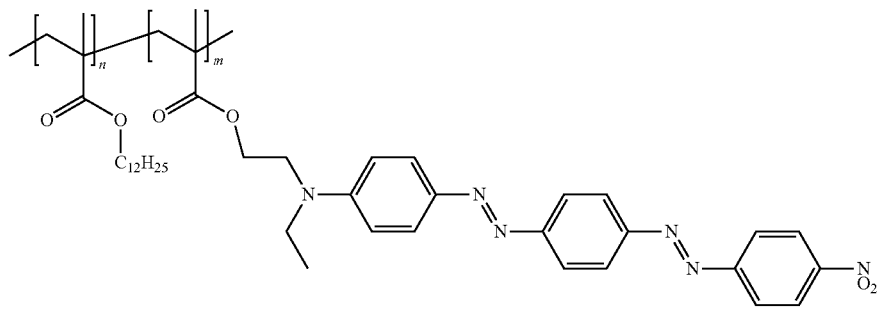
9
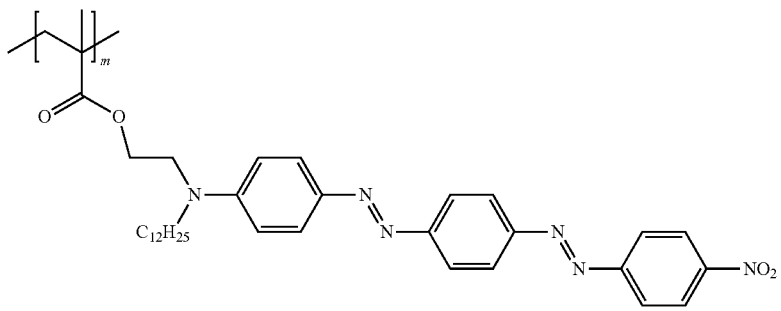
10
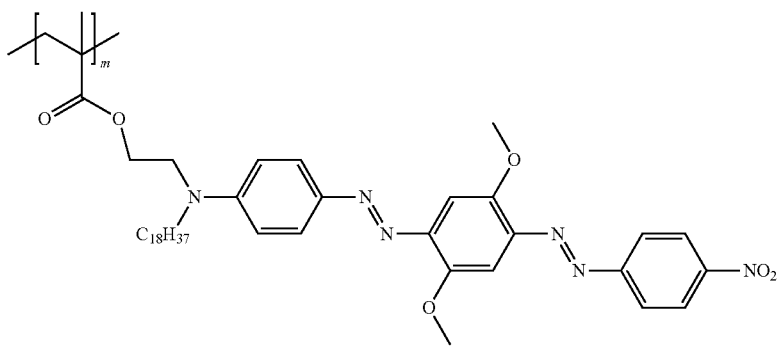
11

TABLE 2-continued
Examples of YanLi Polymers
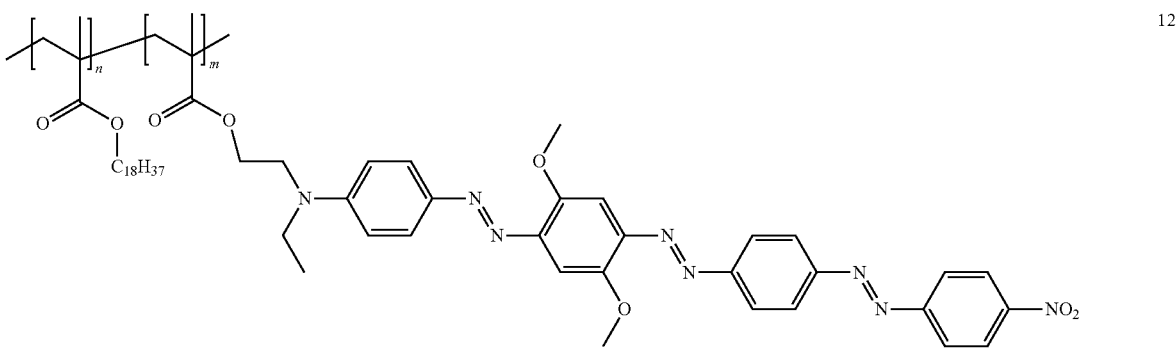
12
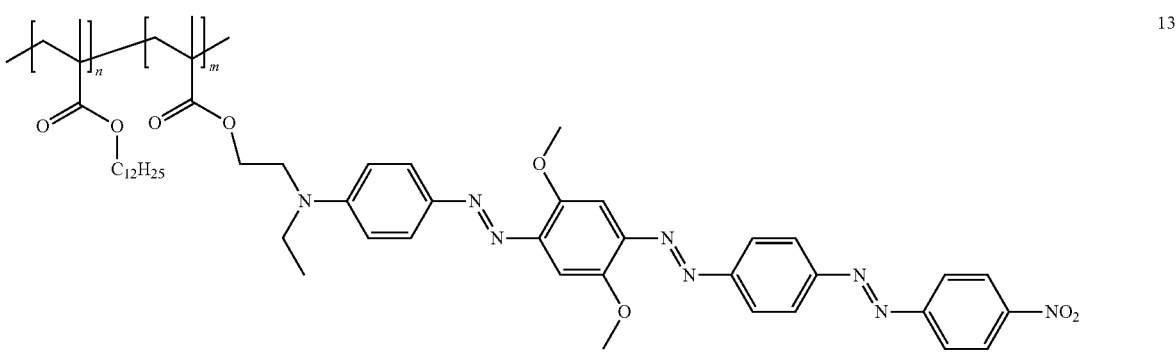
13
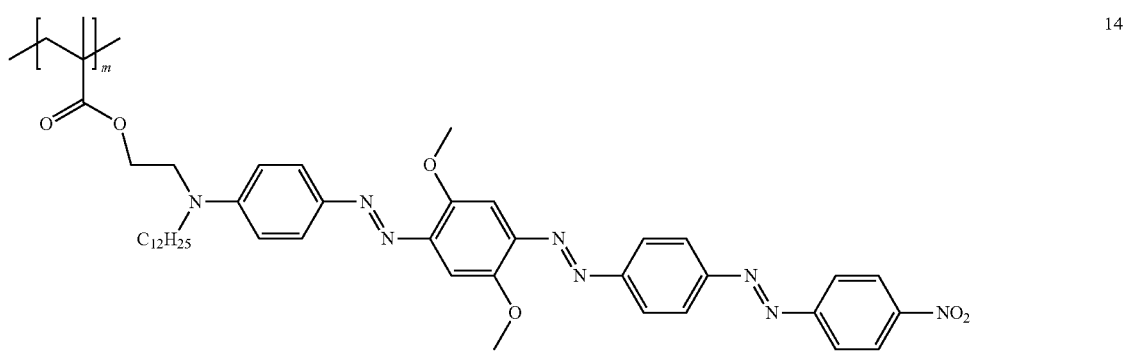
14
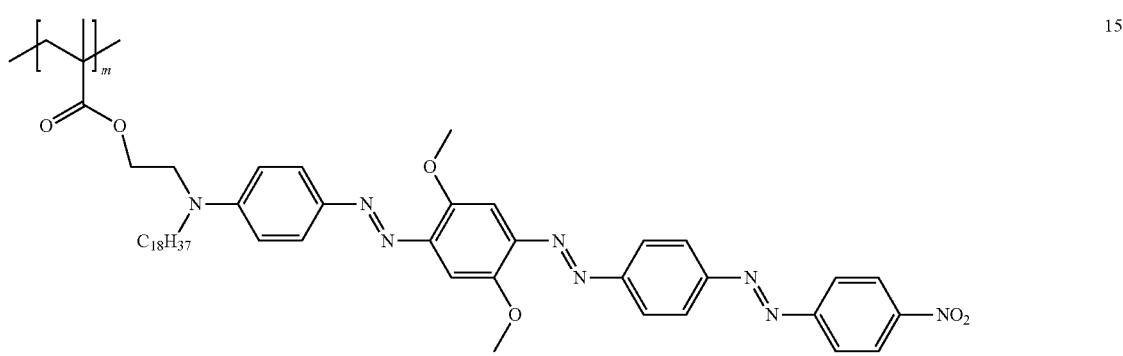
15

TABLE 2-continued
Examples of YanLi Polymers
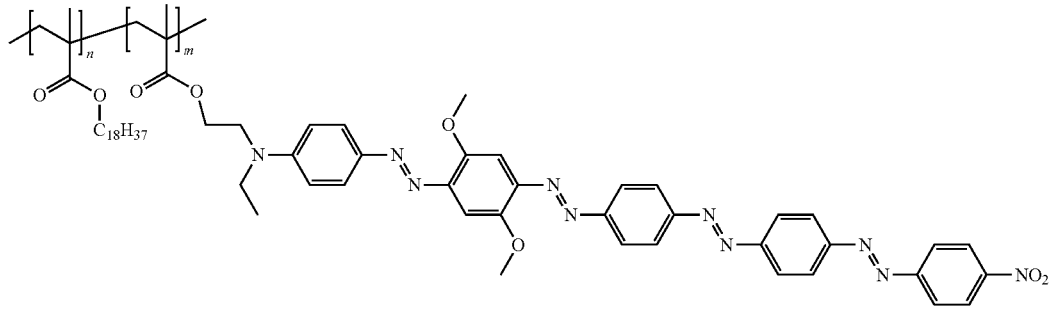
16
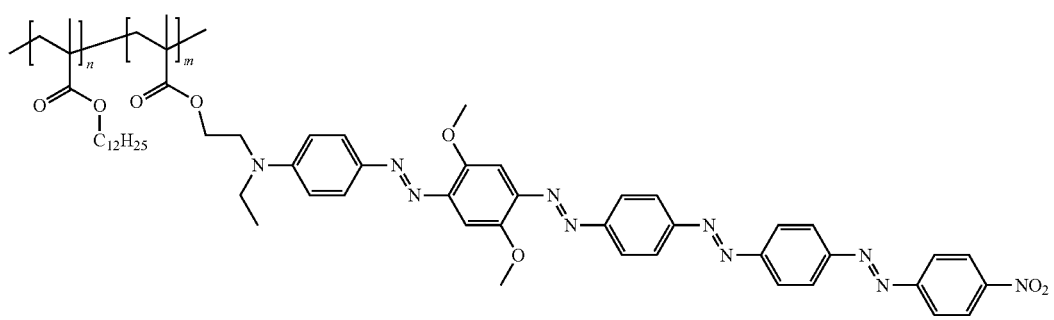
17
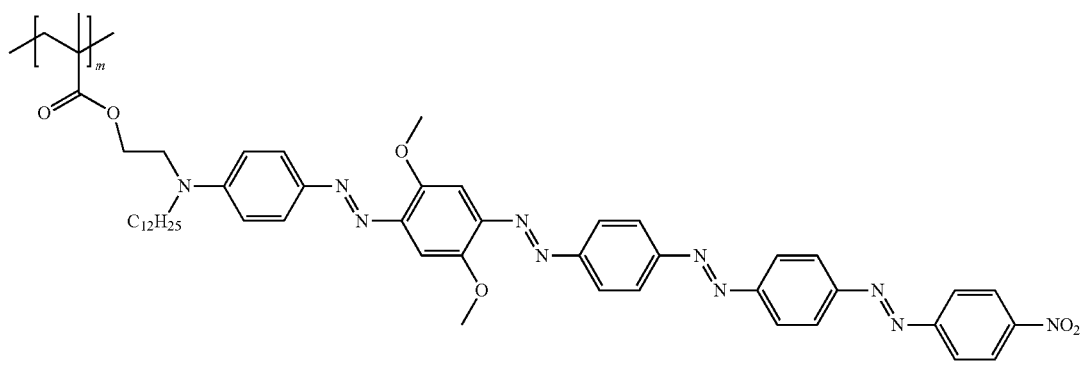
18
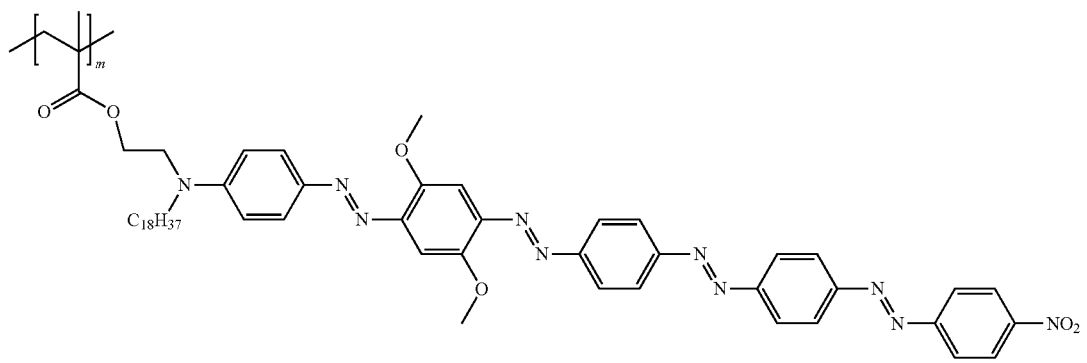
19

TABLE 2-continued
Examples of YanLi Polymers
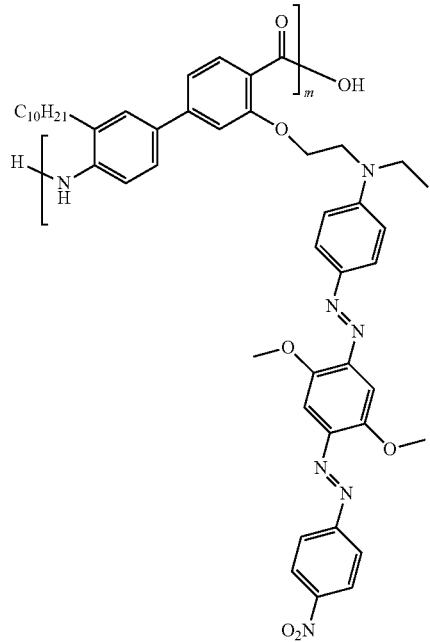
20
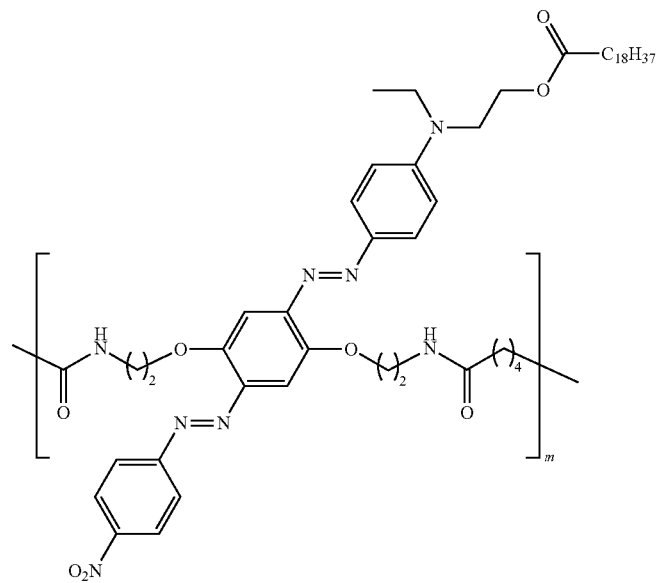
21

TABLE 2-continued
Examples of YanLi Polymers
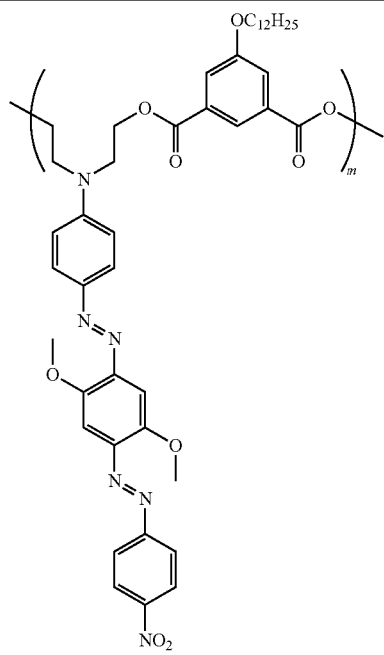
22
Additional specific examples of YanLi polymers include the following:
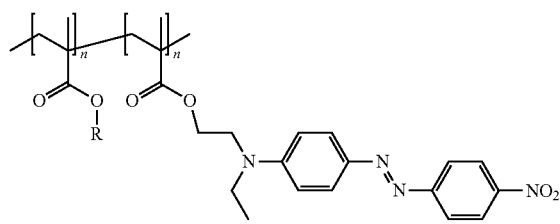
R = $C_{12}H_{25}$ or R = $C_{18}H_{37}$
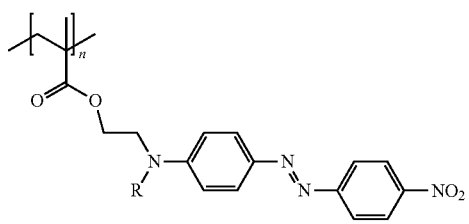
R = $C_{12}H_{25}$ or R = $C_{18}H_{37}$
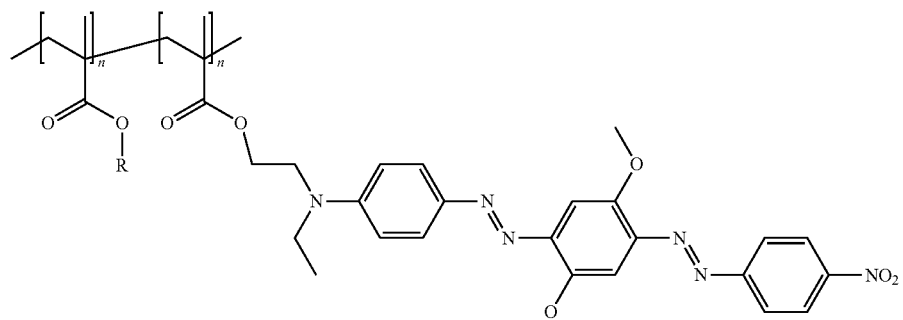
R = $C_{12}H_{25}$ or R = $C_{18}H_{37}$ -continued
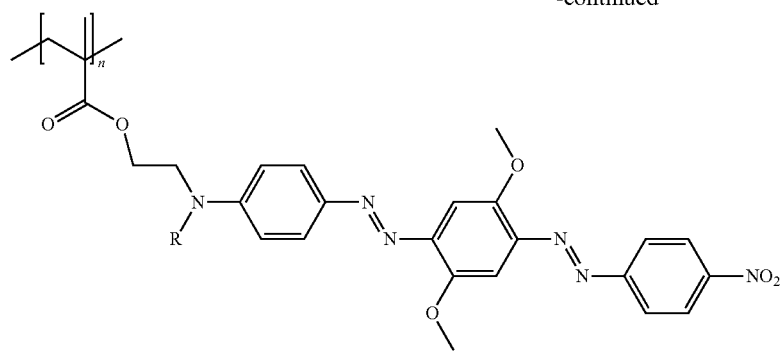
R = C₁₀H₂₅ (C10) or R = C₁₈H₃₇
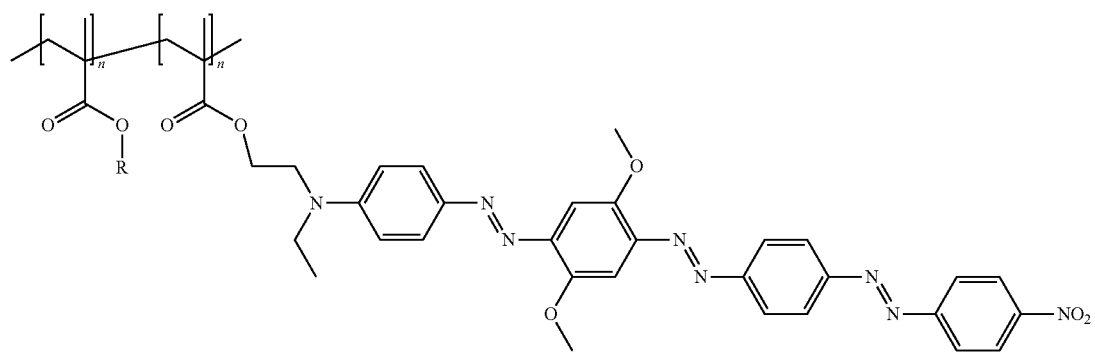
R = C₁₂H₂₅
R = C₁₈H₃₇
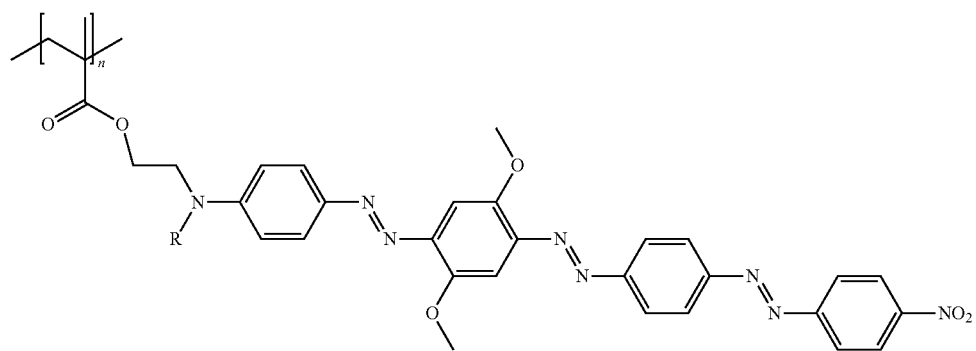
R = C₁₂H₂₅
R = C₁₈H₃₇
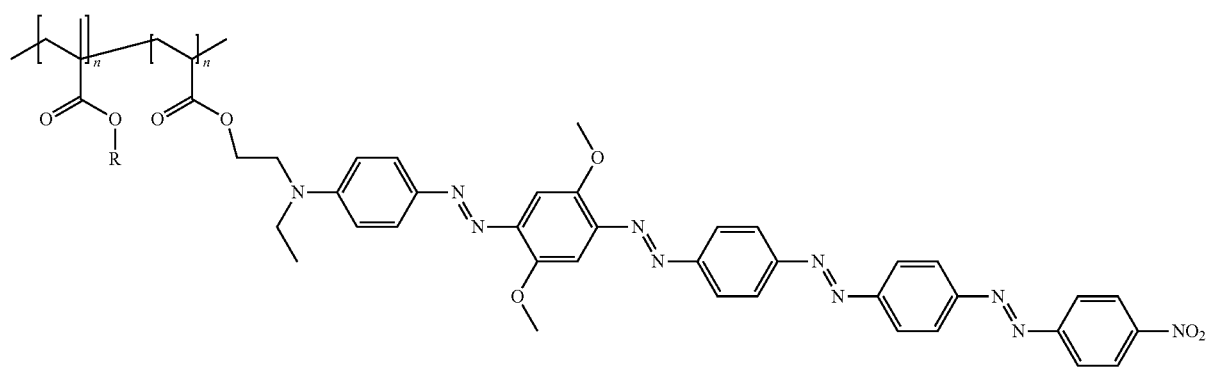
R = C₁₂H₂₅
R = C₁₈H₃₇

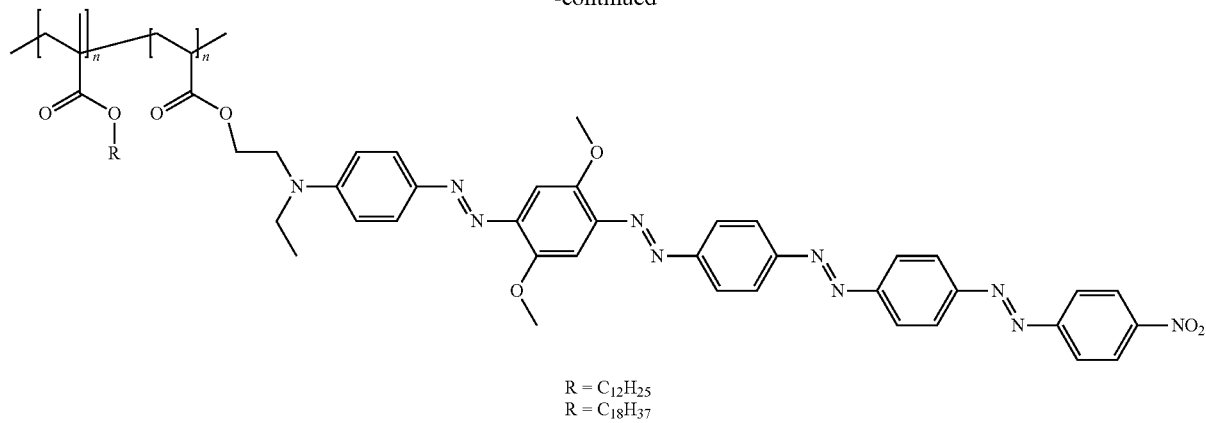

R = C$_{12}$H$_{25}$
R = C$_{18}$H$_{37}$

In many embodiments the composite polymer may include a repeating backbone linked to a polarizable unit in the form of one or more azo-dye chromophores. The azo-dye chromophores may consist of phenyl groups in conjugated connection via a conjugated bridge of two heteroatoms (e.g. an azo-bridge), such that there are "n" phenyl groups and "n-1" conjugated bridges where n is an integer between 2 and 16. Side chains may be added to the final backbone product or incorporated into individual monomers that are then polymerized.

These chromophores impart high polarizability due to delocalization of electrons. This polarizability may be enhanced by dopant groups. The composite polymer may further include resistive tails that will provide insulation within the material. In some embodiments, the resistive tails are can be substituted or unsubstituted carbon chains ($C_nX_{2n+1}$, where "X" represents hydrogen, fluorine, chlorine, or any combination thereof). In some embodiments, the resistive tails may be rigid fused polycyclic aryl groups in order to limit the motion of the side chains, potential stabilizing van der waals interactions between side chains while simultaneously making the material more stable by eliminating voids. In some embodiments, the resistive tails may be rigid in order to limit voids within the material. The synthetic scheme for demonstrative, but not exclusive, species are shown below and are expected to be adaptable to the claimed variations.

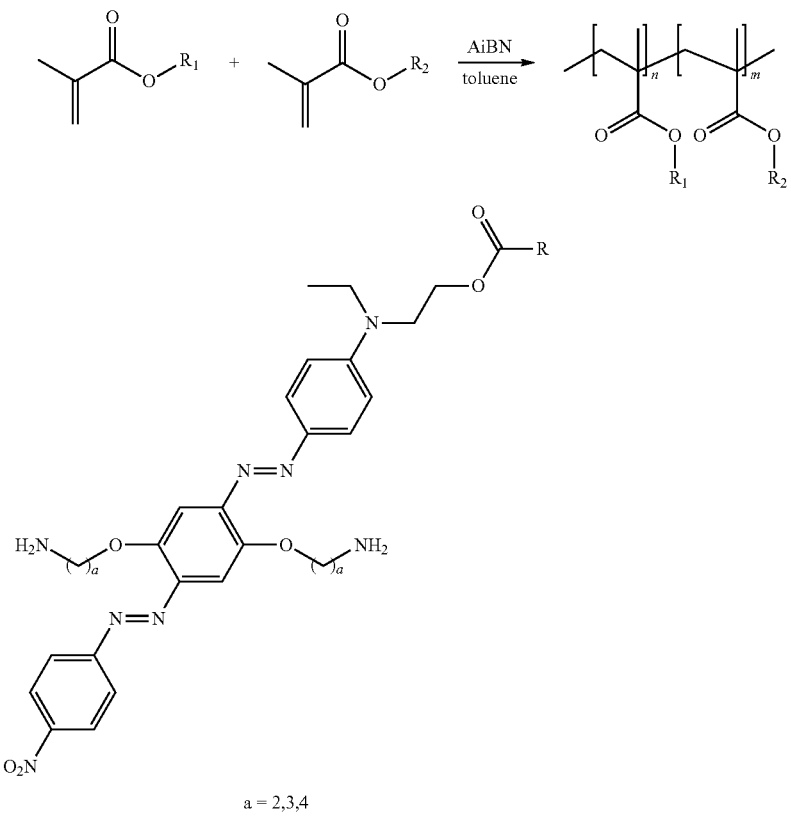

a = 2,3,4

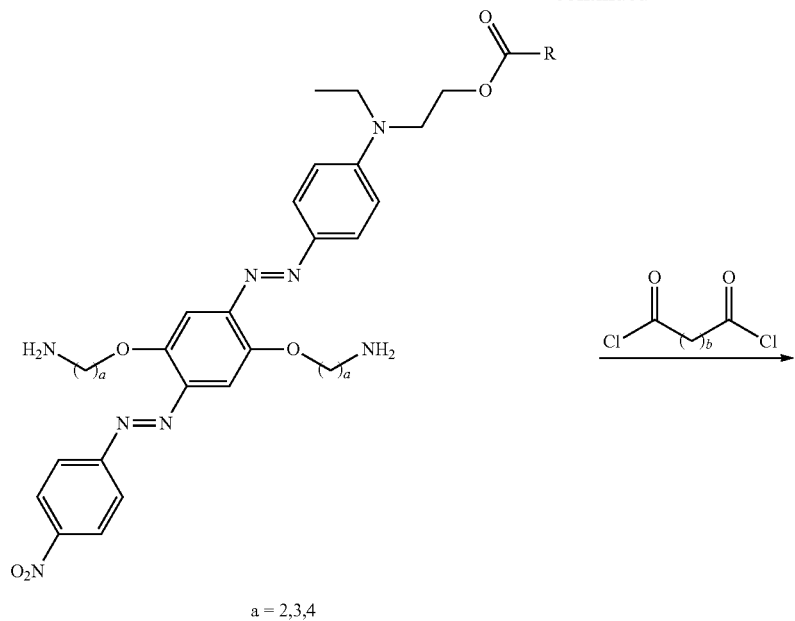
a = 2,3,4
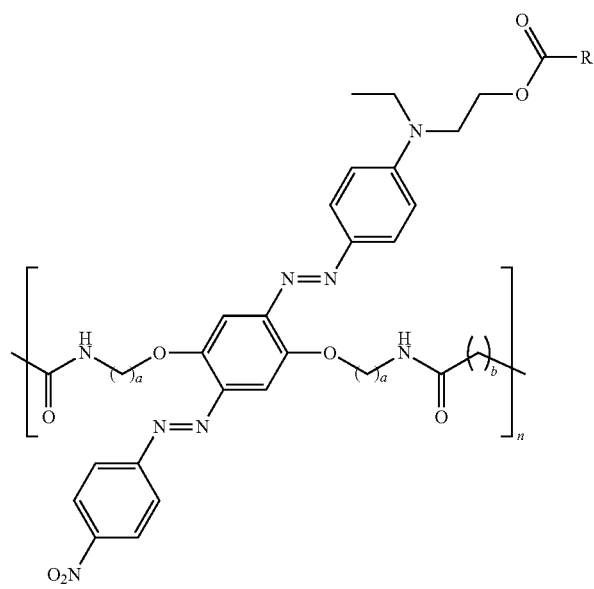
a = 2,3,4

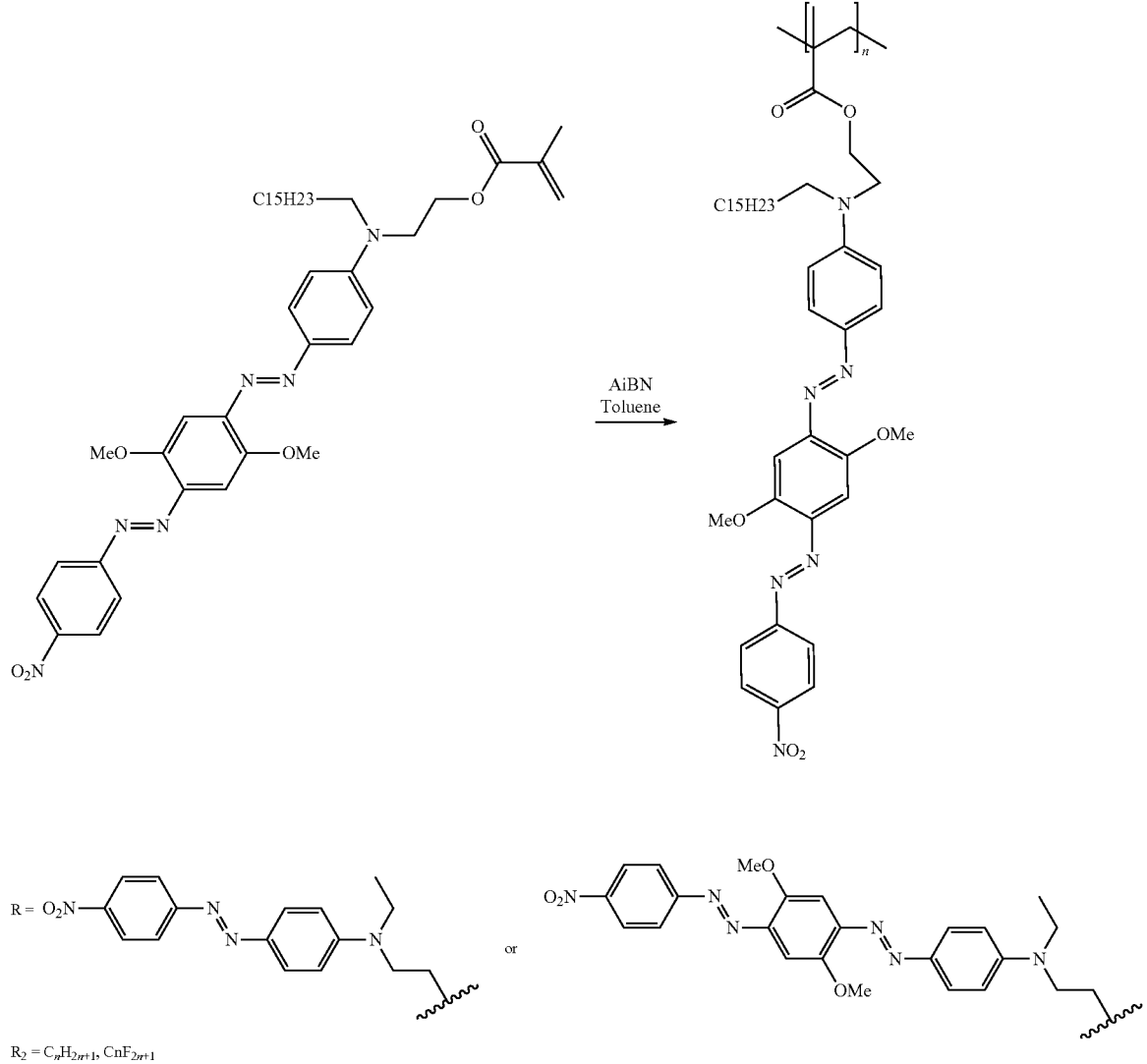

No technical complications are expected in adapting these syntheses to monomers bearing both chromophore and resistive tail, as in structures 3, 4, 7, 10, 11, 14, 15, and 19 from Table 2.

Examples of suitable chromophores include, but are not limited to, Disperse Red-1, Black Hole Quencher-1, and Black Hole Quencher-2. In many of the embodiments it may not be necessary for all monomer units to bear a chromophore, and in some it may be desirable to possess other side chains or sites within the repeating backbone that impart other qualities to the material such as stability, ease of purification, flexibility of finished film, etc.

For embodiments where the chromophores are incorporated as side chains, the resistive tails may be added before the side chains are attached to a finished polymer, after side chains have been chemically added to a finished polymer, or incorporated into the polymer during synthesis by incorporation into monomer units.

For embodiments where the chromophore is part of the backbone the tails may be attached to the finished composite polymer or incorporated into monomer units and added during composite synthesis.

Non-limiting examples of suitable tails are alkyl, haloalkyl, cycloakyl, cyclohaloalkyl, and polyether.

Syntheses of eight different YanLi polymers described herein will be further explained below.

Example 1: Synthesis of Polymer 1

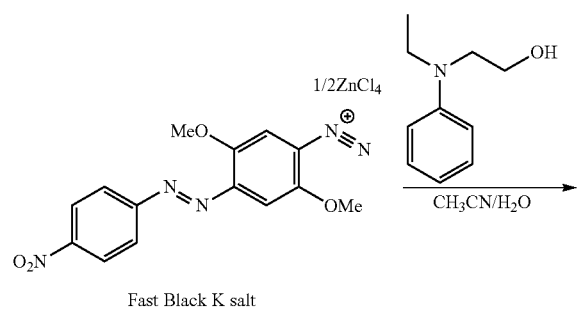

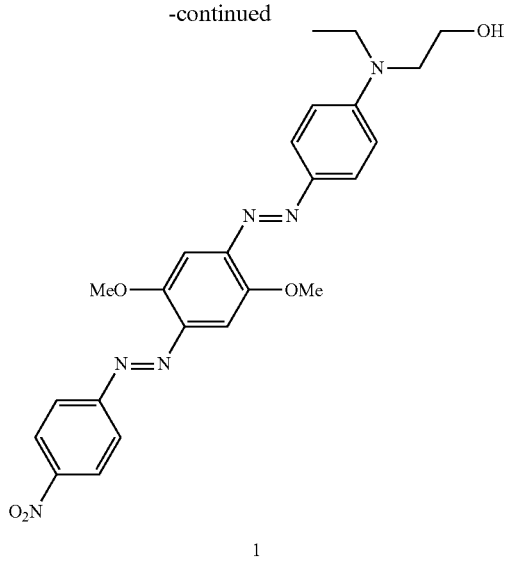

1

First compound 1—2-((4-((E)-(2,5-dimethoxy-4-((E)-(4-nitrophenyl) diazenyl)phenyl) diazenyl)phenyl)(ethyl) amino)ethan-1-ol was synthesized from Fast Black K Salt (2,5-Dimethoxy-4-(4-nitrophenylazo)benzenediazonium chloride zinc double salt. Fast Black K Salt (25%, 30 g) was dissolved in 250 mL acetonitrile and 250 mL NaOAc buffer solution (pH=4) and the resulting solution was stirred for 1 hour and then sonicated for 15 min, followed by vacuum filtration. The filtrate was dropwise added to a solution of 2-(ethyl(phenyl)amino)ethan-1-ol (4.1 g in 65 mL acetonitrile) at 0° C. The resultant solution was stirred at room temperature for 16 hours and the precipitate was filtered out and washed with mix solvent of acetonitrile/water (1:1) and dried under vacuum. The product was obtained as a black powder.

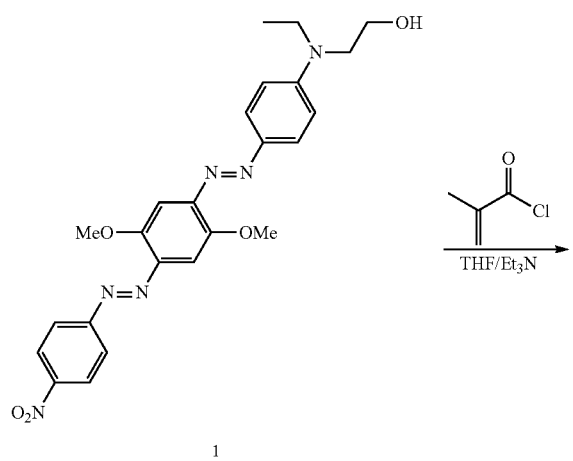

1

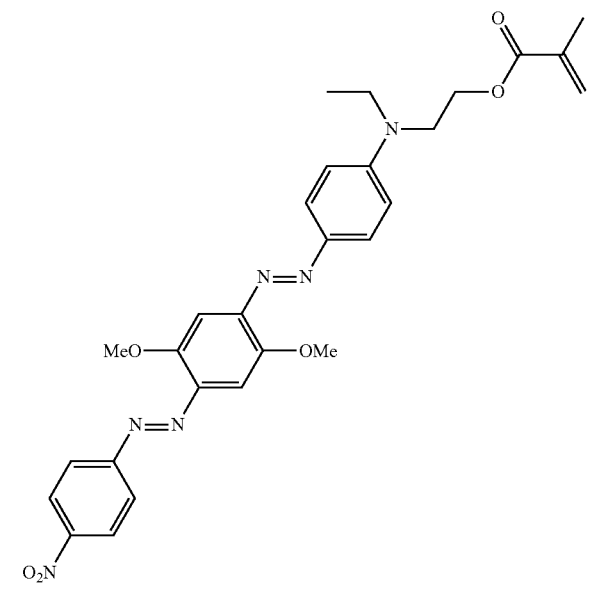

2

2-((4-((E)-(2,5-dimethoxy-4-((E)-(4-nitrophenyl)diazenyl) phenyl)diazenyl)phenyl)(ethyl) amino)ethyl methacrylate (Compound 2) is then synthesized from compound 1. To the solution of compound 1 (5.0 g) and triethylamine (4.4 mL) in 70 mL THF (anhydrous) at 0° C., was dropwise added a solution of methacryloyl chloride (3.1 mL) in THF (anhydrous, 10 mL). The resulting solution was warmed up to room temperature and was stirred overnight at room temperature. The reaction solution was filtered and THF was used to wash the insoluble; the filtrate was concentrated under vacuum and diluted in dichloromethane. The diluted solution was washed with water and the solvent was removed under vacuum. The crude product was purified with column chromatography and 3.2 g pure product was isolated as a black powder.

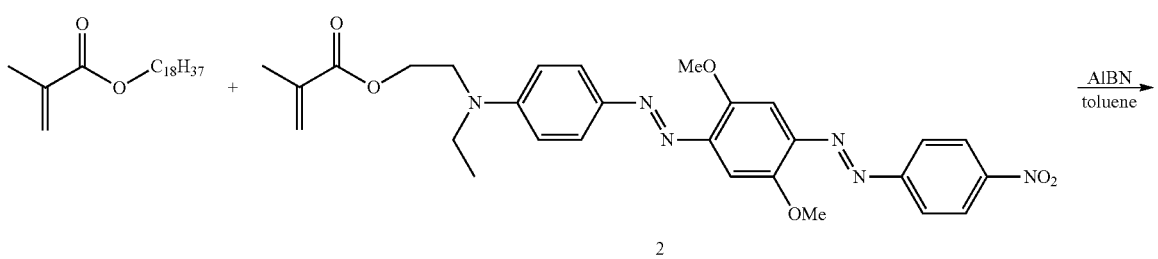

2

-continued

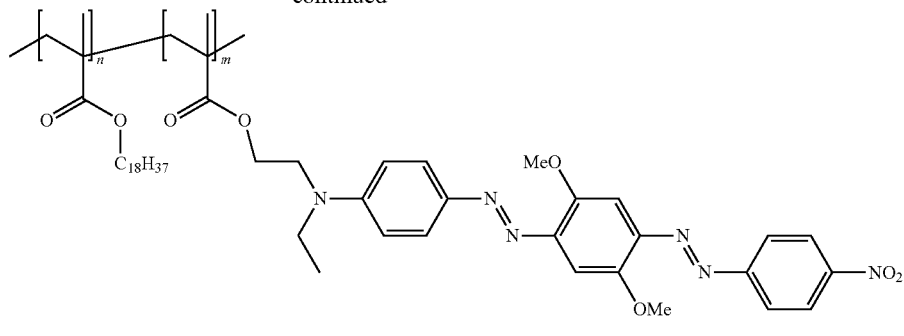
Polymer 1

Polymer 1 was then formed from compound 2 as follows. Compound 2 (2.0 g), stearylmethacrylate (1.2 g) and AIBN (160 mg) were dissolved in anhydrous toluene (12 mL) in a sealed flask and the resulting solution was heated to 85° C. for 18 hours and then cooled to room temperature. The polymer was obtained by precipitating in isopropanol.

Example 2: Synthesis of Polymer 2

Polymer 2 was synthesized using (E)-2-(ethyl(4-((4-nitrophenyl)diazenyl)phenyl)amino)ethyl methacrylate (compound 3). Compound 3 was synthesized from Disperse Red-1 (2-[N-ethyl-4-[(4-nitrophenyl)diazenyl]anilino]ethanol or $C_{16}H_{18}N_4O_3$) and methacryloyl chloride using preparation procedure of compound 2.

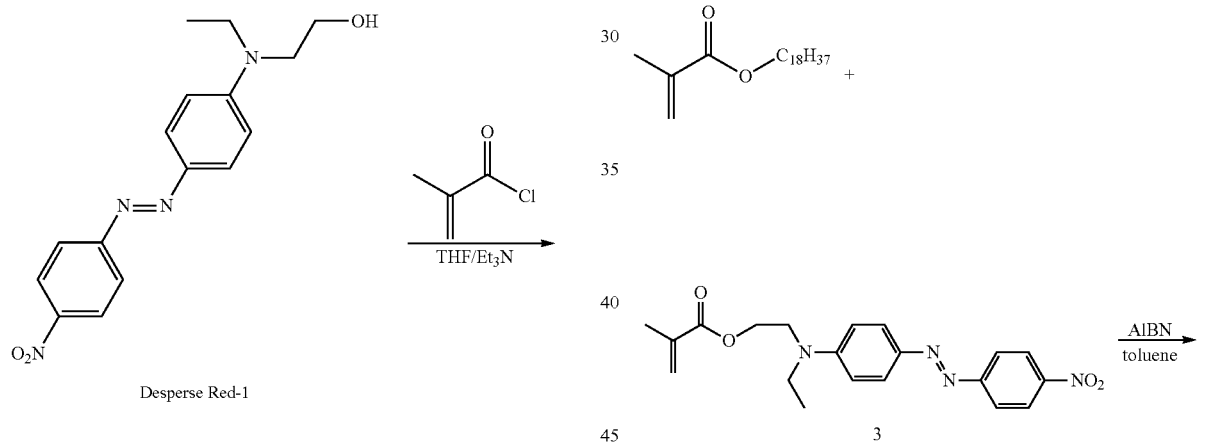

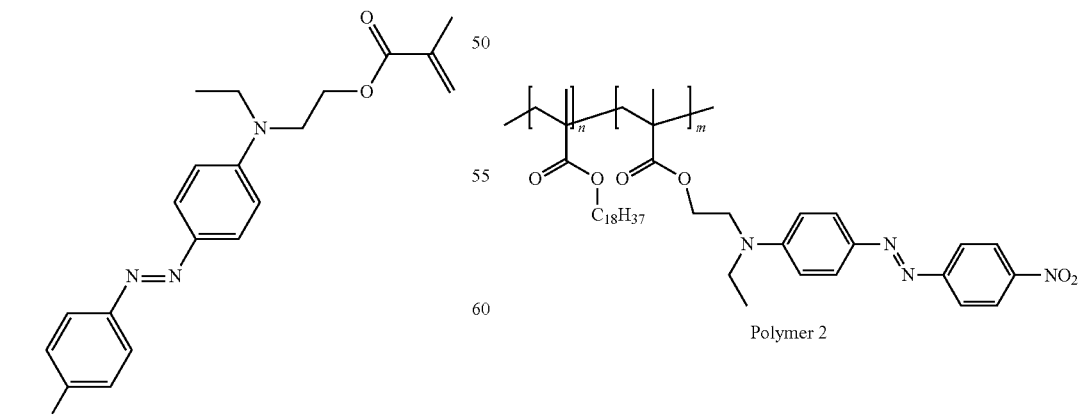
Polymer 2

Polymer 2. Polymer 2 was synthesized from compound 3 and stearylmethacrylate using preparation procedure of polymer 1.

Example 3: Synthesis of Polymer 3

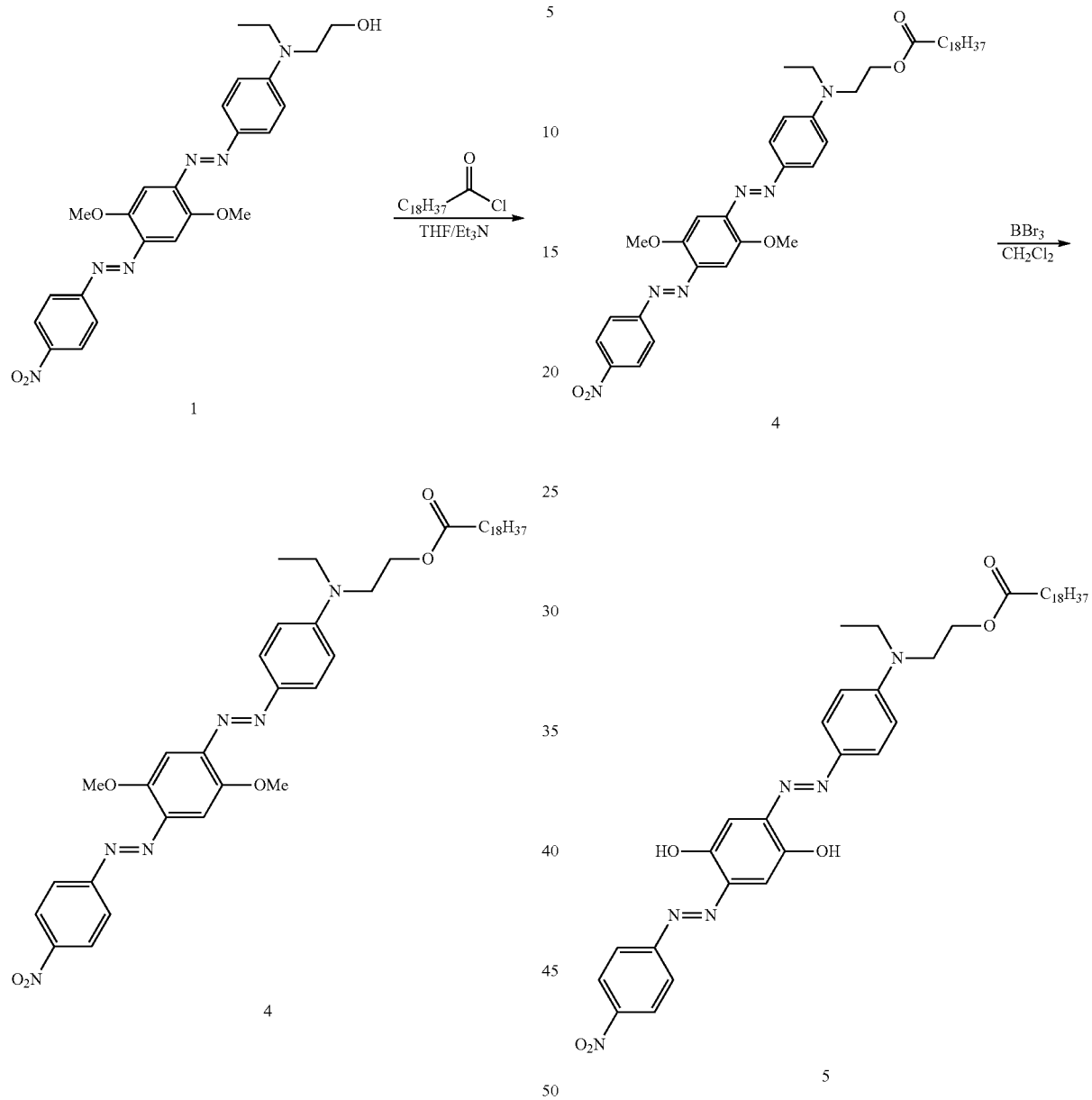

Polymer 3 was synthesized using 2-((4-((E)-(2,5-dimethoxy-4-((E)-(4-nitrophenyl)diazenyl)phenyl)diazenyl)phenyl) (ethyl)amino) ethyl nonadecanoate (compound 4), which was synthesized from compound 1 described above: To a solution of compound 1 (0.5 g) and triethylamine (0.46 mL) in 15 mL THF at 0° C., was dropwise added a solution of stearoyl chloride (1.12 mL) in THF. The resulting solution was warmed up to room temperature and was stirred overnight at room temperature. The reaction solution was filtered and THF was used to wash the insoluble; the filtrate was concentrated under vacuum and residue was taken in dichloromethane. The crude product solution was washed with water and the solvent was removed under vacuum. The crude product was purified with column chromatography.

Compound 4 was then used to synthesize 2-((4-((E)-(2,5-dimethoxy-4-((E)-(4-nitrophenyl)diazenyl)phenyl)diazenyl)phenyl)(ethyl) amino)ethyl nonadecanoate (compound 5). Specifically, compound 4 (1.0 g) was dissolved in dichloromethane (30 mL) and cooled to −78° C.; BBr$_3$ (0.72 g) was slowly added into the solution. The resulting reaction mixture was slowly warmed to room temperature and was kept at room temperature with stirring for 12 hours. Sodium bicarbonate aqueous solution was injected in the reaction mixture at 0° C. and diluted with dichloromethane. The solution was washed with water and brine, and then concentrated under vacuum. The product was purified via flash column chromatography.

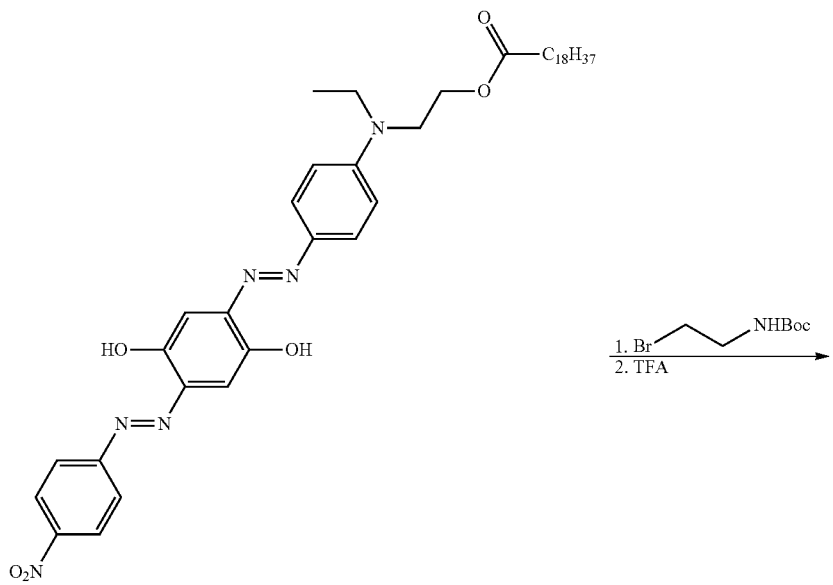

5

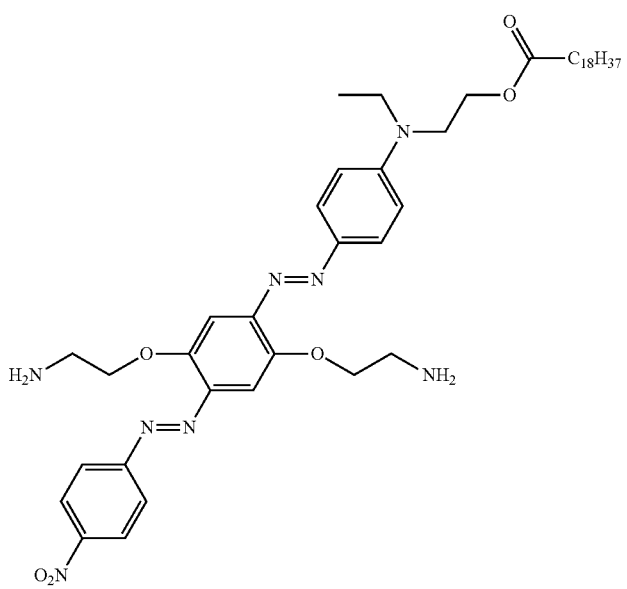

6

Compound 5 was then used to synthesize compound 6 (2-((4-((E)-(2,5-bis(2-aminoethoxy)-4-((E)-(4-nitrophenyl)diazenyl)phenyl)diazenyl)phenyl) (ethyl)amino)ethyl nonadecanoate). Compound 5 (0.73 g), $K_2CO_3$ (1.38 g) and tert-butyl (2-bromoethyl)carbamate (0.44 g) were added to dimethylformamide (DMF) (15 mL), and the resulting mixture was stirred at 65° C. overnight. $H_2O$ (400 mL) was added to the reaction mixture and the aqueous layer was extracted with EtOAc (200 mL×2). The combined organic layer was washed with $H_2O$ (100 mL×2) and brine (50 mL), dried over $Na_2SO_4$, filtered, and concentrated under reduced pressure. The crude product was purified by silica column chromatography. The pure product was dissolved in dichloromethane (10 mL) and TFA (trifluoroacetic acid) (3 mL) and the solution was stirred at room temperature for 2 hours. Then excess reagent and solvent were removed under vacuum. The resulting crude product was neutralized by $NaHCO_3$ solution, extracted with $CH_2Cl_2$ (3×50 mL), dried over $MgSO_4$ and evaporated. The crude product (compound 6) was purified by silica column chromatography.

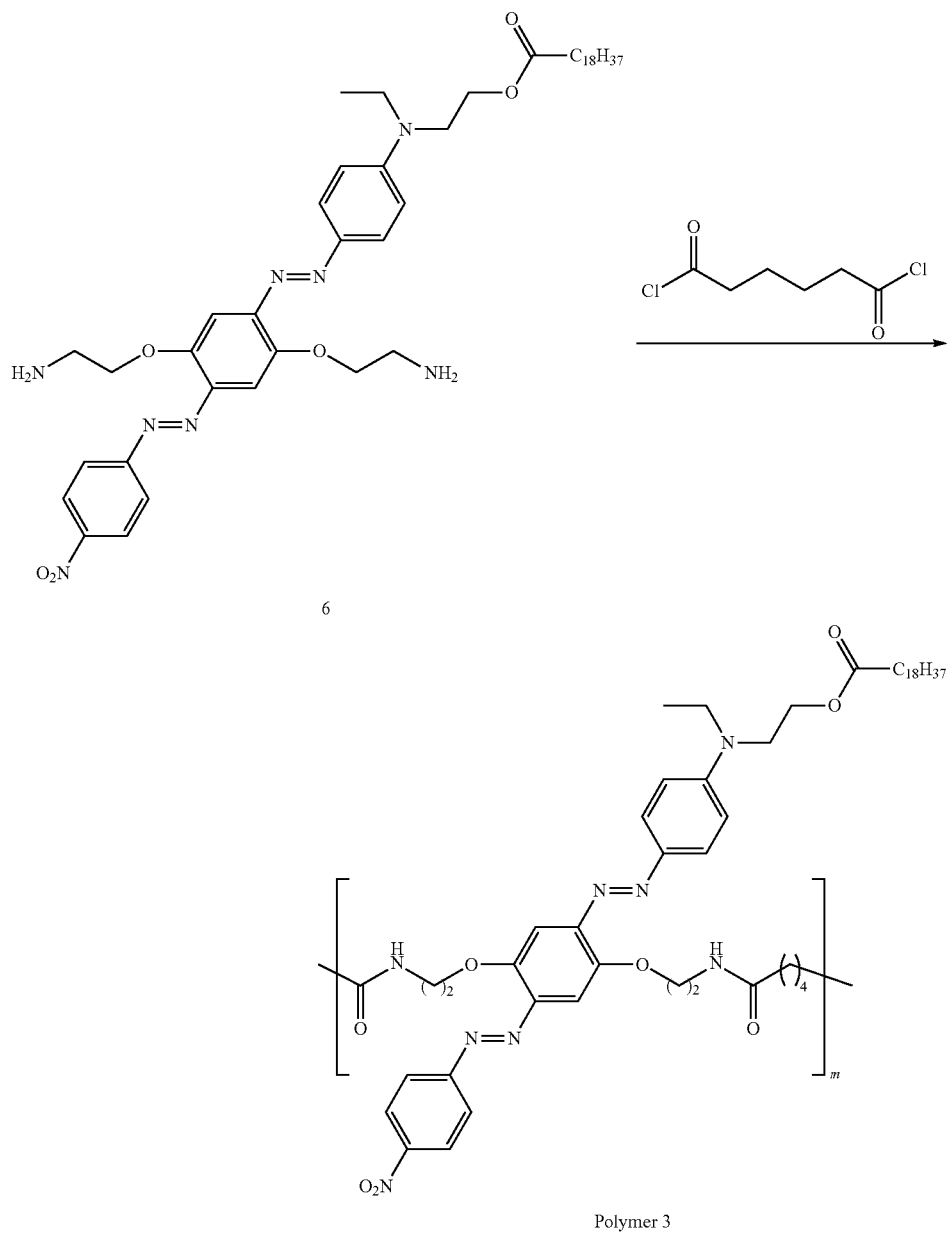

6

Polymer 3

Polymer 3. To the solution of compound 6 (4.1 g) in CH₂C₂ (15 mL), was slowly added adipoyl dichloride (0.9 g) at 0° C. After the addition, the solution was allowed to warm to room temperature and stir for 2 hours. The resulting solution was concentrated and dropwise added into isopropanol to precipitate the polymer 3.

Example 4: Synthesis of Polymer 4

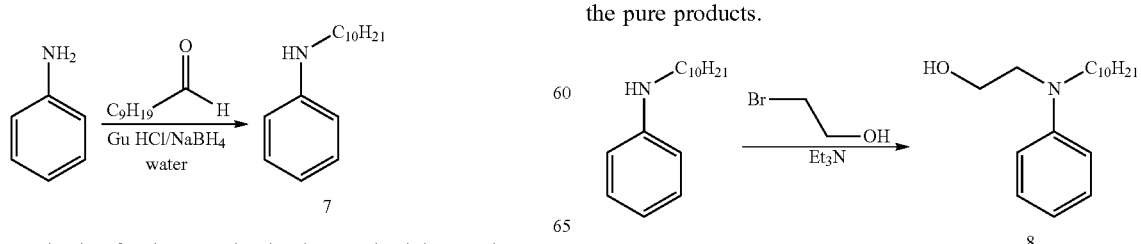

7

8

The synthesis of polymer 4 begins by synthesizing N-decylaniline (compound 7).

To a solution containing GuHCl (10 mg, 5 mol %) in H₂O (4 mL), was added decanal (2 mmol) and aniline (2.2 mmol) and the mixture vigorously stirred for 15 min at room temperature. After, NaBH₄ (20 mg, 2.1 mmol) was added, the mixture was stirred for additional 10 min. The reaction mixture was extracted with CH₂Cl₂, dried over Na₂SO₄, concentrated under vacuum and the crude mixture was purified by column chromatography on silica gel to afford the pure products.

2-(Decyl(phenyl)amino)ethan-1-ol (compound 8) is then synthesized from compound 7

To a solution of 7 (470 mg, 2.00 mmol) in toluene (5 ml) was added triethylamine (405 mg, 4.00 mmol) and 2-bromoethanol (501 mg, 4.01 mmol), and the mixture was refluxed for 2 h. The resulting mixture was diluted with saturated NH₄Cl and extracted with ethyl acetate. The extract was washed with brine, dried over anhydrous MgSO4, filtered, and concentrated in vacuo. The crude product was purified by silica gel chromatography to give 8.

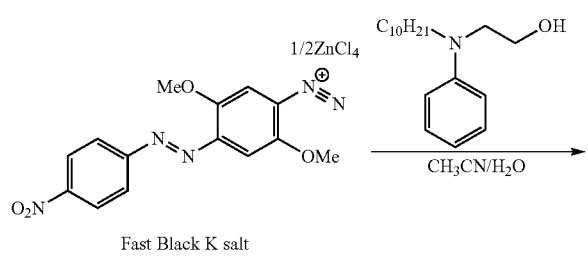

Fast Black K salt

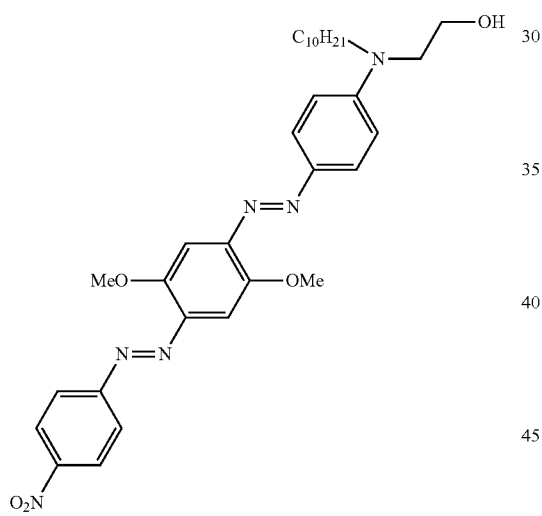

9

2-(Decyl(4-((E)-(2,5-dimethoxy-4-((E)-(4-nitrophenyl)diazenyl)phenyl)diazenyl) phenyl) amino)ethan-1-ol (compound 9) was then synthesized from Fast Black K Salt and compound 8

Fast Black K Salt (25%, 30 g) was dissolved in 250 mL acetonitrile and 250 mL NaOAc buffer solution (pH=4) and the resulting solution was stirred for 1 hour and then sonicated for 15 min, followed by vacuum filtration. The filtrate was dropwise added to a solution of compound 8 (6.8 g in 65 mL acetonitrile) at 0° C. The resultant solution was stirred at room temperature for 16 hours and the precipitate was filtered out and washed with mix solvent of acetonitrile/water (1:1) and dried under vacuum. The product was obtained as a black powder.

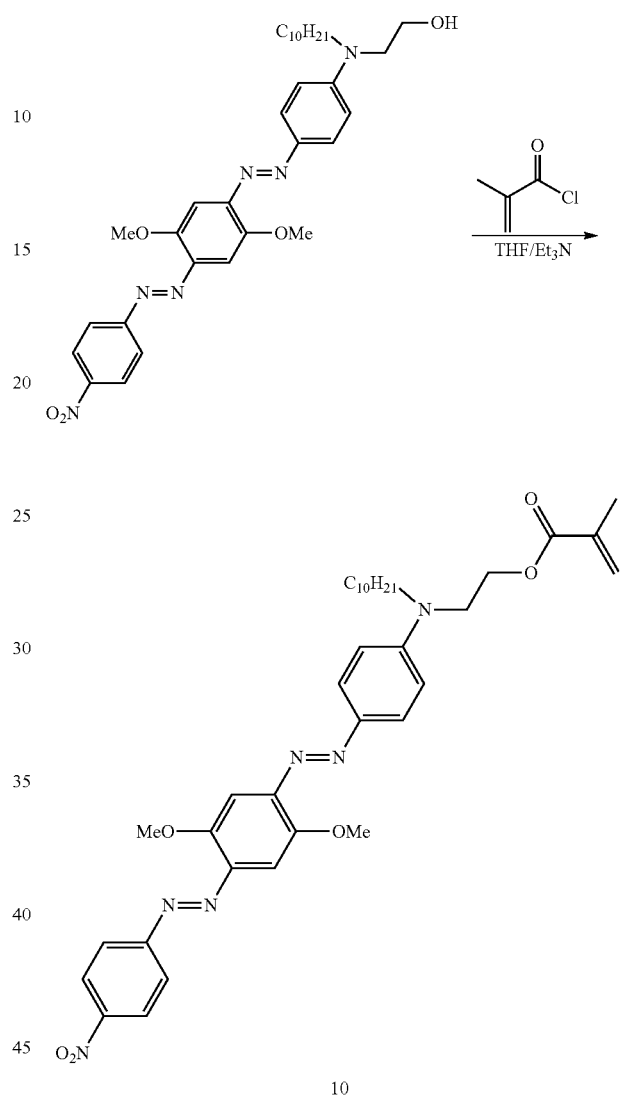

10

2-(decyl(4-((E)-(2,5-dimethoxy-4-((E)-(4-nitro phenyl) amino)ethyl methacrylate (compound 10)

To the solution of compound 9 (5.0 g) and triethylamine (3.5 mL) in 70 mL THF (anhydrous) at 0° C., was dropwise added a solution of methacryloyl chloride (2.5 mL) in THF (anhydrous, 10 mL). The resulting solution was warmed up to room temperature and was stirred overnight at room temperature. The reaction solution was filtered and THF was used to wash the insoluble; the filtrate was concentrated under vacuum and diluted in dichloromethane. The diluted solution was washed with water and the solvent was removed under vacuum. The crude product was purified with column chromatography and 3.3 g pure product (compound 10) was isolated as a black powder.

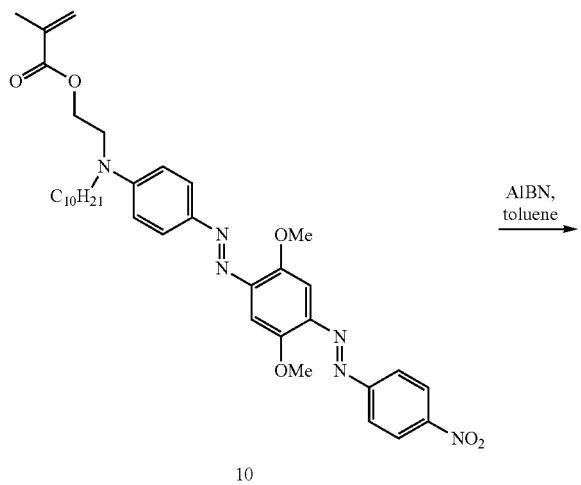

10

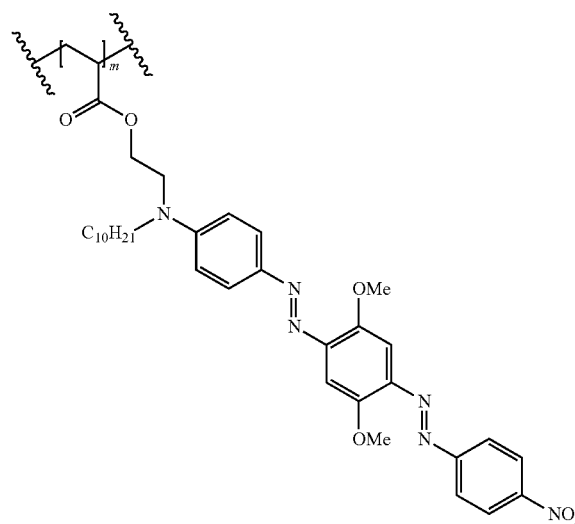

Polymer 4

Poly 2-(decyl(4-((E)-(2,5-dimethoxy-4-((E)-(4-nitrophenyl)diazenyl)phenyl)diazenyl) phenyl) amino)ethyl methacrylate (4) (Polymer 4) was then synthesized from compound 10.

Compound 10 (2.0 g) and AIBN (40 mg) were dissolved in anhydrous toluene (6 mL) in a sealed flask and the resulting solution was heated to 85° C. for 18 hours and then cooled to room temperature. The polymer (1.4 g) was obtained by precipitating and washing in 2-isopropanol.

Preferred embodiments of the invention will meet one of the following formulae.

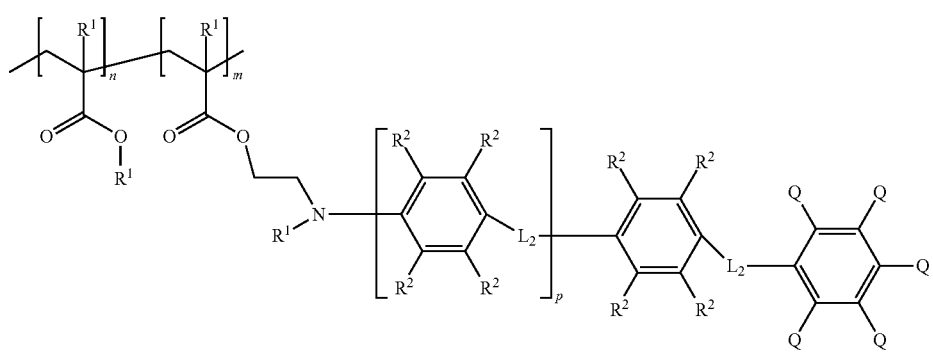

Wherein, each instance of $R^1$ is independently selected from —H, —OH, —Ak, —OAk, —OAk-$X_o$, or —Ak-$X_o$, or alkoxy; each instance of $R^2$ is independently selected from H, —OH, —OAk, —OAk-$X_o$, or Ak; $L_2$ is a heteroatom bridge in conjugation with the ring system of the side chain (e.g. azo-bridge or —N=N—, alkene bridge or —HC=CH—, and alkyne or —C≡C— bridge), each instance of Q is independently selected from any electron withdrawing group or H, Ak is alkyl or branched alkyl or aryl, X is any halogen, n is 0-150, m is 1-300, o is 1-51, p is 0-10, with the provisio that at least one instance of $R^1$ must be a resistive tail. Preferred, but not limiting, embodiments of resistive tails include hydrocarbon and halohydrocarbon chains, non-aromatic hydrocarbocycles, and non-aromatic heterocycles. In some embodiments, it may be preferable for the resistive tails to be ridged. In such embodiments, rigid resistive tails maybe non-aromatic carbocycles or non-aromatic heterocycles.

Other embodiments of the invention possess a polyester backbone where resistive tail and Polarizable Unit are each simultaneously side chains to the same monomer. A sample scheme for polyester embodiments is depicted below.

Example 5: Synthesis of Polymer 5

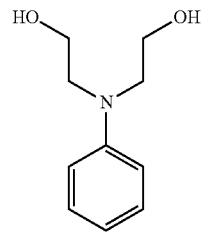

N-Phenyldiethanolamine

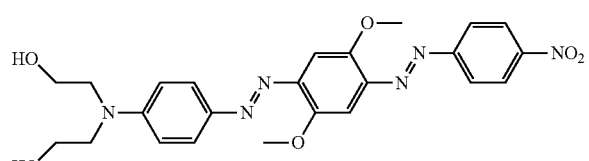

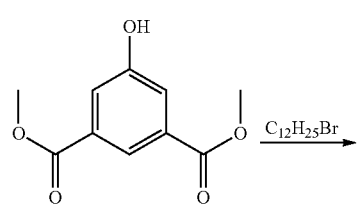

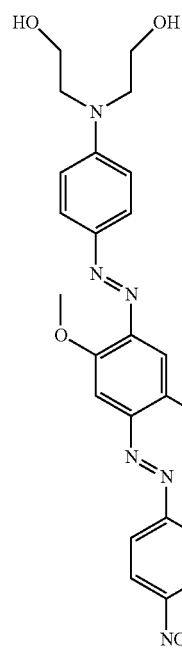

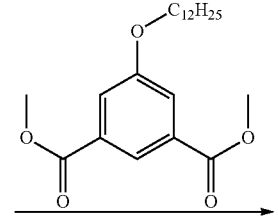

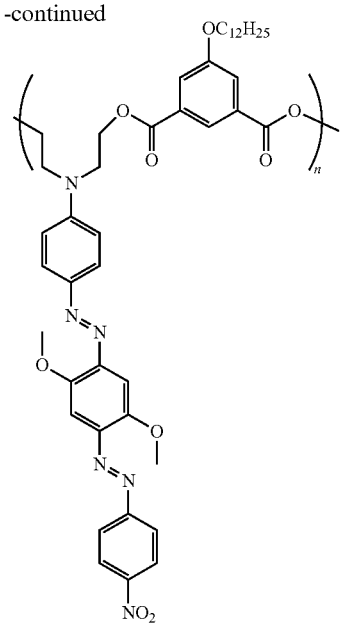

Polymer 5

This scheme should be widely adaptable to accommodate a variety of backbones and polarizable units. Such species would meet the following formula.

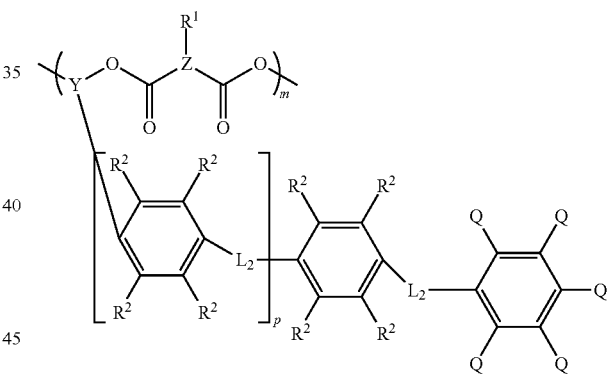

Where each instance of $R^1$ is independently selected from any alkyl group, each instance of $R^2$ is independently selected from —H, —OH, —OAk, or —OAk-$X_o$, $L_2$ is a heteroatom bridge in conjugation with the ring system of the side chain (e.g. azo-bridge or —N=N—, alkene bridge or —HC=CH—, and alkyne or —C≡C— bridge), each instance of Q is independently selected from any electron donating or electron withdrawing group, Z is substituted or unsubstituted hydrocarbon cyclic or chain linkage, Y is any hydrocarbon chain which may be interrupted by a hetero atom at the point of attachment, m is 1-300, o is 1-51, p is 0-10. Preferred embodiments include m between 60 and 270, and p between 1 and 4.

Other embodiments of the invention possess alternative backbones where resistive tail and Polarizable Unit are each simultaneously side chains to the same monomer. A sample scheme for polyaramid embodiments is depicted below.

Example 6: Synthesis of Polymer 6

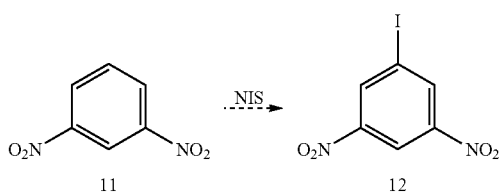

Synthesis of 12: Add 1,3-dinitrobenzene (11) in a round bottom flask with concentrated sulfuric acid (0.5 M) with 1.1 equiv. of $I_2$. Connect to reflux condenser and place reaction vessel in an oil bath heated to 150° C. When the reaction is complete, pour mixture onto ice and filter product. Wash solid with sodium bicarbonate until neutralized and dissolve in dichloromethane until dissolved. Wash with aqueous sodium thiosulfate (10%) solution to remove $I_2$ and organic solution with magnesium sulfate before filtering. Remove organic solvent under vacuum, recrystallize, and filter to isolate 12.

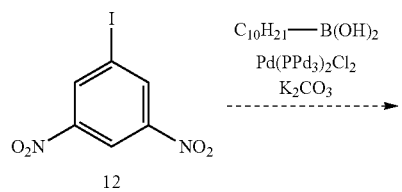

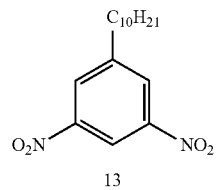

Synthesis of 13: Add 12 (1 equiv.), dodecane boronic acid (1.2 equiv), $Pd(PPh_3)_2Cl_2$ (0.05 equiv), and potassium carbonate (2 equiv.) into a reaction vessel. Evacuate and backfill with $N_2$ three times. Add a degassed mixture of toluene and water (10:1) and heat to 80° C. When the reaction is complete, slowly add 1 M aqueous solution of HCl until the aqueous layer is acidic. Extract with dichloromethane (3×) and dry organic fractions with $MgSO_4$ before filtering. Concentrate the crude reaction mixture and filter through celite before recrystallizing. Filter to isolate product 13.

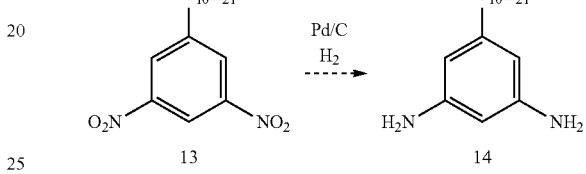

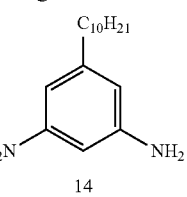

Synthesis of 14: Add 3 (1 equiv) to reaction flask with palladium on carbon (0.1 equiv). Evacuate and backfill with $N_2$ before adding ethanol (0.1 M). Fill a balloon and needle with $H_2$ gas and connect to reaction vessel and heat to 80° C. When the reaction is completed, filter through celite making sure the palladium on carbon does not dry. Remove solvent under reduced pressure and recrystallize to purify product 14.

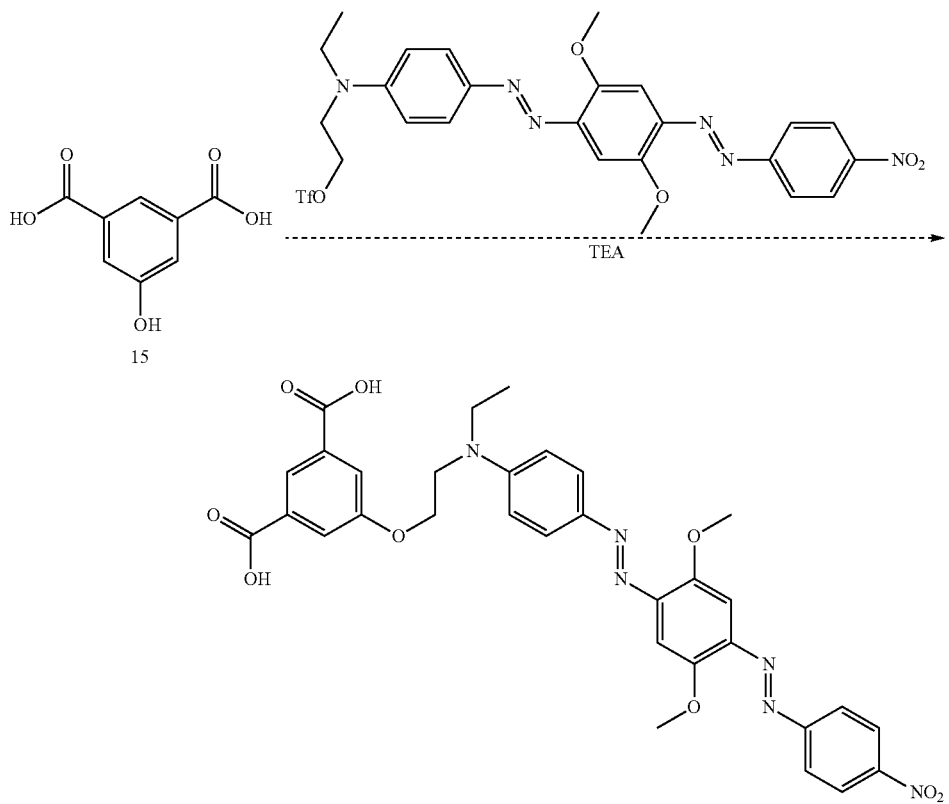

Synthesis of 16: Add 15 (1 equiv.) into a round bottom flask and dissolve in solution of dichloromethane/triethylamine (5:1, 0.1 M). Add a solution of 10 (1.1 equiv, 0.5 M) in dichloromethane to the solution of 15. When the reaction is complete, wash with 1 M aqueous HCl until acidic and extract with dichloromethane (3 times). Dry organic fractions with MgSO$_4$, filter, and concentrate under vacuum. Purify through crystallization or SiO$_2$ column chromatography to isolate 16.

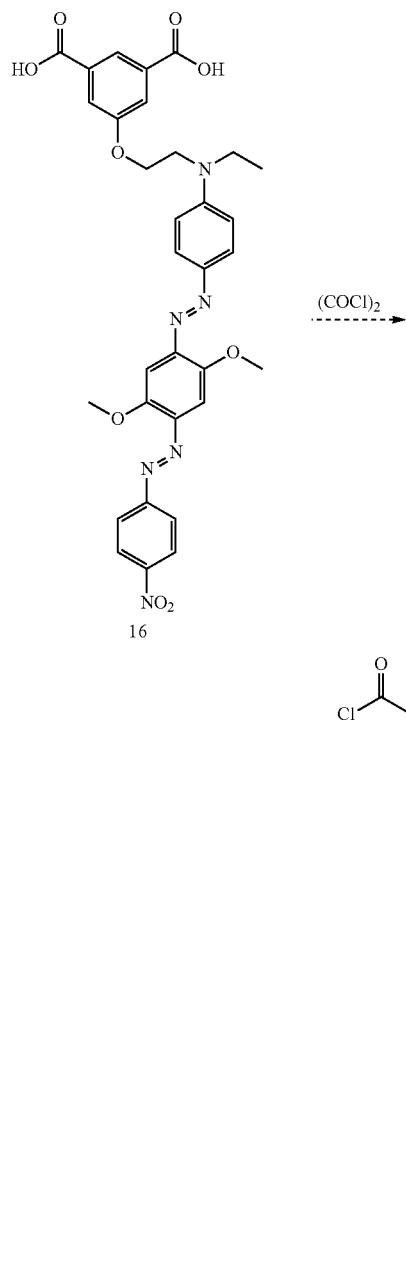

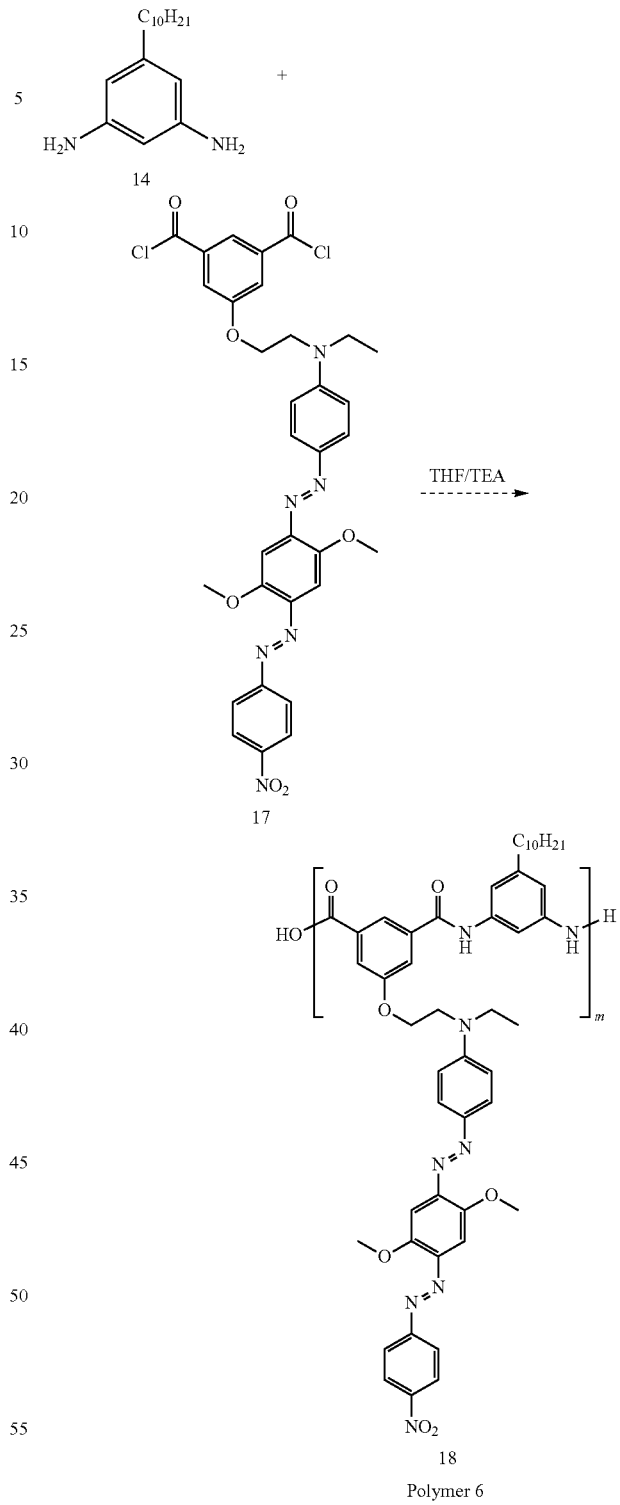

Synthesis of 17: Dissolve 16 (1 equiv.) in dichloromethane (0.1 M) and add oxalyl chloride (2.1 equiv) with a drop of dimethylformamide as catalyst. Let reaction stir at room temperature until bubbling stops. Remove solvent under vacuum to isolate 7.

Synthesis of 18: Add 14 (1.0 equiv.) and 17 (1.0 equiv.) to a reaction vessel before adding a mixture of anhydrous tetrahydrofuran and triethylamine (5:1, 0.1 M). When the reaction is complete, concentrate under reduced pressure and precipitate to isolate 18.

The scheme for Polymer 6 should be widely adaptable to accommodate a variety of backbones and polarizable units. Such species would meet the following formula.

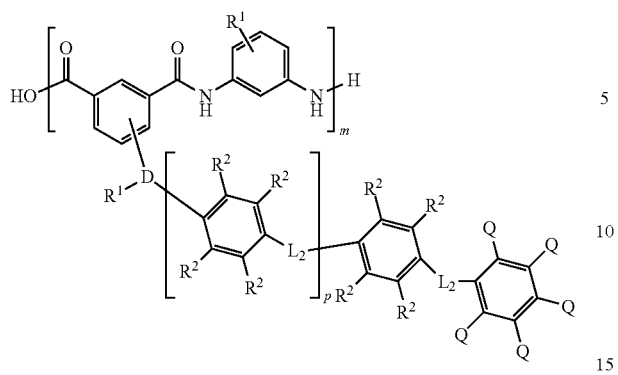

Where each instance of $R^1$ is independently selected from any alkyl or alkoxyl group or —H, each instance of $R^2$ is independently selected from —H, —OH, —OAk, or —OAk-$X_o$, $L_2$ is a heteroatom bridge in conjugation with the ring system of the side chain (e.g. azo-bridge or —N=N—, alkene bridge or —HC=CH—, and alkyne or —C≡C— bridge), Q is selected from any electron withdrawing group, D is any hydrocarbon chain which may be interrupted by hetero atoms at the point of backbone attachment and side chain attachment, m is 1-300, o is 1-51, p is 0-10. Preferred embodiments include m between 60 and 270, and p between 1 and 4.

Examples 7a & 7b: Synthesis of Polymers 7a & 7b

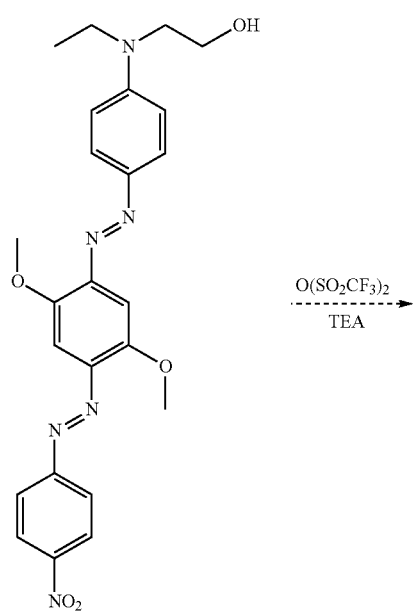

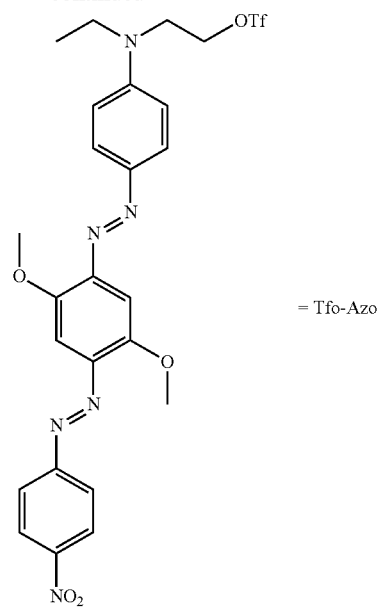

Synthesis of 20: Dissolve 1 (1 equiv.) in a solution of $CH_2Cl_2$ (0.1 M) and triethyl amine (1 equiv.) and let stir for 10 min. Add trifluoromethanesulfonic anhydride (1.1 equiv.) slowly and let stir for 30 min. Wash reaction mixture with aqueous HCl (1 M), extract with dichloromethane, and dry with $MgSO_4$. Remove solvent to isolate 20.

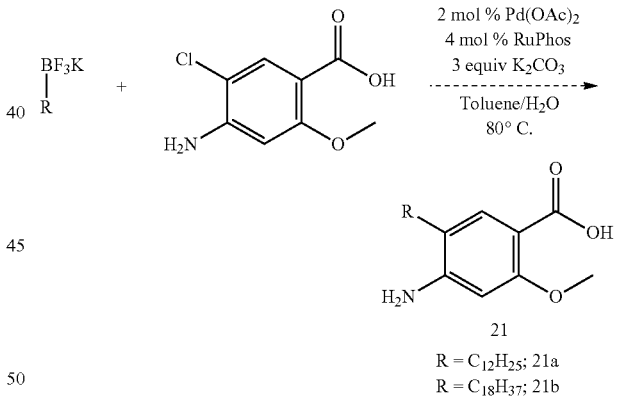

Synthesis of 21a-21b: Add 4-amino-5-chloro-2-methoxybenzoic acid, alkyl potassium trifluoroborate salt, Pd(OAc)$_2$ (0.02 equiv.), RuPhos (0.04 equiv.), and $K_2CO_3$ (3 equiv.) to a reaction flask. Evacuate this flask and backfill with $N_2$ three times. In a separate flask, combine toluene and water (0.3 M; 10:1) and sparge with $N_2$ for 60 minutes. Transfer this solution mixture to the reaction flask and place this into a preheated oil bath at 80° C. When the reaction is complete, it should cool to room temperature before carefully adding 1 M HCl until the aqueous layer has been acidified. Extract this with $CH_2Cl_2$ and dry the organic fractions with $MgSO_4$ before filtering. Remove the organic solvent under reduced pressure and isolate the product by silica gel chromatography to isolate 21a or 21b.

The procedure below is adapted from: Molander G A, Sandrock D L. "Potassium trifluoroborate salts as convenient, stable reagents for difficult alkyl transfers", *Current Opinion In Drug Discovery & Development* 2009; 12(6): pages 811-823;

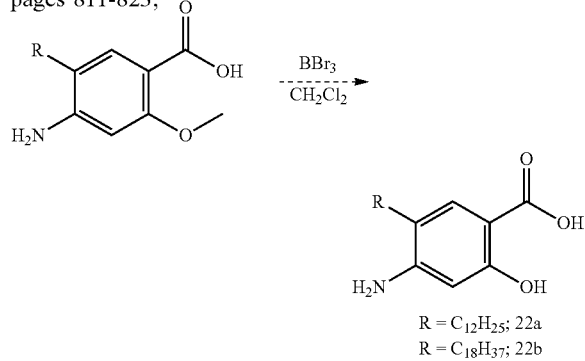

R = C₁₂H₂₅; 22a
R = C₁₈H₃₇; 22b

Synthesis of 22a-22b: Dissolve 21a or 21b in anhydrous CH₂Cl₂ (0.3 M) in an oven dried round bottom flask. Cool this solution to 0° C. in an ice bath and add boron tribromide (1 M in CH₂Cl₂) slowly. Once addition of BBr₃ is complete, remove the ice bath and let the reaction mixture to warm up to ambient temperature for 12 hours. When the reaction is completed, cool it back to 0° C. and slowly add methanol to quench any excess BBr₃ present. Wash this reaction with distilled water and collect the organic fraction. Dry with MgSO₃, filter, then remove solvent under vacuum. Purify by either recrystallization or silica gel chromatography to isolate 22a or 22b

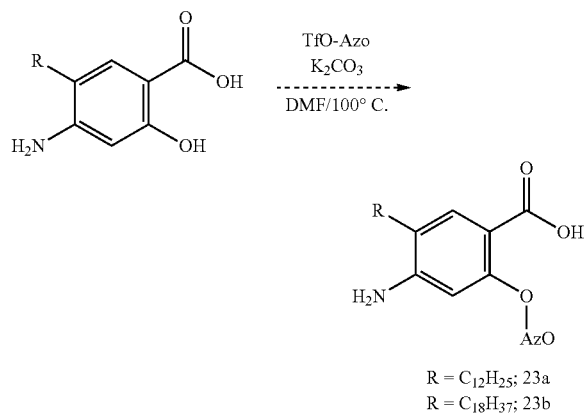

R = C₁₂H₂₅; 23a
R = C₁₈H₃₇; 23b

Synthesis of 23a-23b: Add either 22a or 22b (1 equiv.) and K₂CO₃ (2 equiv) into a round bottom flask and dissolve in solution of anhydrous DMF (0.1 M). Dissolve 20 (1.1 equiv, 0.5 M) in DMF and add this to the previous reaction mixture. Place the reaction mixture in a preheated 100° C. oil bath and stir until the reaction is completed. When the reaction is complete, wash with 1 M aqueous HCl until acidic and extract with CH₂Cl₂ (3 times). Dry organic fractions with MgSO₄, filter, and concentrate under vacuum. Purify through crystallization or SiO₂ column chromatography to isolate 23a or 23b.

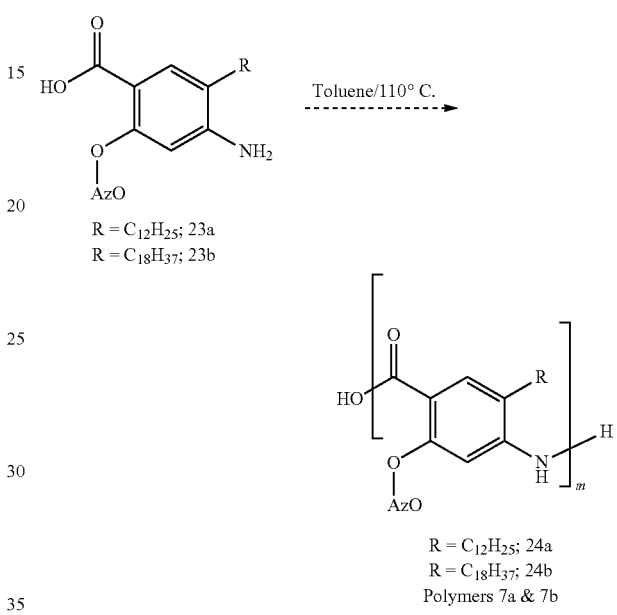

R = C₁₂H₂₅; 24a
R = C₁₈H₃₇; 24b
Polymers 7a & 7b

Synthesis of 24a-24b: Dissolve monomers 23b or 23b in toluene (0.4 M) in a round bottom flask equipped with a Dean Stark trap to remove water formed during the reaction and stir at 110° C. in a preheated oil bath. When the reaction is complete, purify the polymer through precipitation and isolate through filtration or centrifugation.

The scheme for Polymers 7a and 7b should be widely adaptable to accommodate a variety of backbones and polarizable units. Such species would meet the following formula.

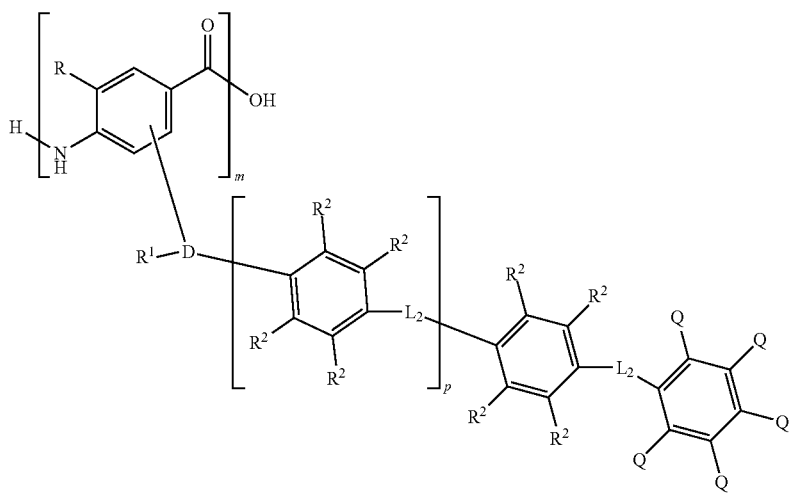

Where each instance of $R^1$ is independently selected from —H or any alkyl or alkoxyl group, each instance of $R^2$ is independently selected from —H, —OH, —OAk, or —OAk-$X_o$, $L_2$ is a heteroatom bridge in conjugation with the ring system of the side chain (e.g. azo-bridge or —N=N—, alkene bridge or —HC=CH—, and alkyne or —C≡C— bridge), Q is selected from any electron withdrawing group, D is any hydrocarbon chain which may be interrupted by hetero atoms at the point of backbone attachment and side chain attachment, m is 1-300, o is 1-51, p is 0-10. Preferred embodiments include m between 60 and 270, and p between 1 and 4.

Synthesis of Polymer 8

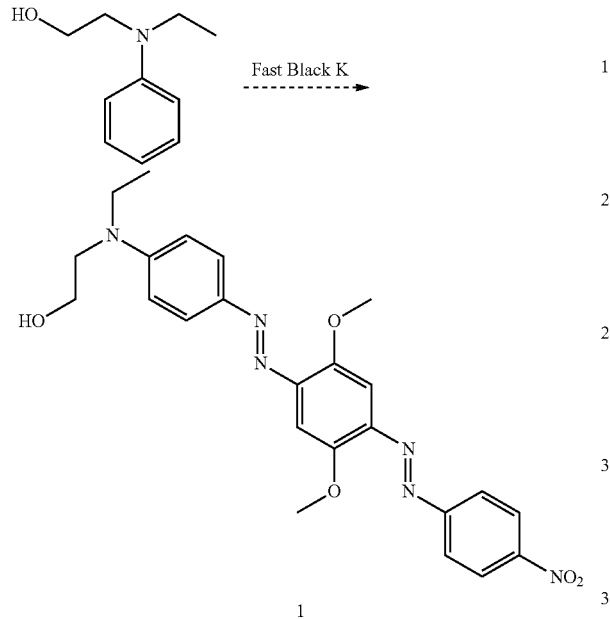

Synthesis of 1: Dissolve Fast Black K Salt in acetonitrile and NaOAc buffer solution (pH=4) and stir the resulting solution for 1 hour, followed by vacuum filtration. Add the filtrate dropwise to a solution of 2-(ethyl(phenyl)amino) ethan-1-ol at 0-5° C. Stir the solution at room temperature for 16 hours before filtering the precipitate and wash with a mixture of acetonitrile/water (1:1) and dried under vacuum.

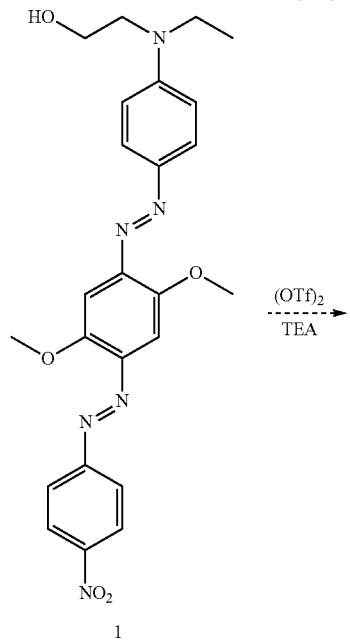

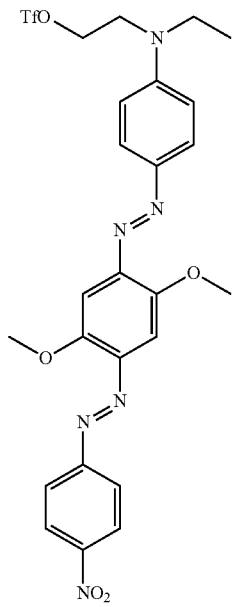

Synthesis of 20: Dissolve 1 (1 equiv.) in a solution of dichloromethane (0.1 M) and triethyl amine (1 equiv.) and let stir for 10 min. Add trifluoromethanesulfonic anhydride (1.1 equiv.) slowly and let stir for 30 min. Wash reaction mixture with aqueous HCl (1 M), extract with dichloromethane, and dry with $MgSO_4$. Remove solvent to isolate 20.

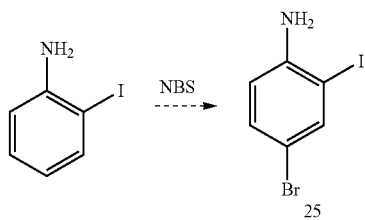

Synthesis of 25: Add 1-iodo-2-aminobenzene to a round bottom flask dissolved in dichloromethane (0.1 M) with 1.1 equiv. of N-bromosuccinimide. Let the reaction stir at room temperature for one hour. When the reaction is complete, wash with aqueous HCl (1 M) and extract with dichloromethane. Dry using $MgSO_4$, filter, and remove organic solvent under reduced pressure to isolate 25.

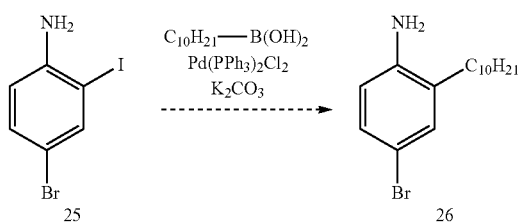

Synthesis of 26: Add 25 (1 equiv.), dodecane boronic acid (1.2 equiv), $Pd(PPh_3)_2Cl_2$ (0.05 equiv), and potassium carbonate (2 equiv.) into a reaction vessel. Evacuate and backfill with $N_2$ three times. Add a degassed mixture of toluene and water (10:1) and heat to 80° C. When the reaction is complete, slowly add 1 M aqueous solution of HCl until the aqueous layer is acidic. Extract with dichloromethane (3×) and dry organic fractions with $MgSO_4$ before filtering. Concentrate the crude reaction mixture and filter through celite before recrystallizing. Filter to isolate product 26.

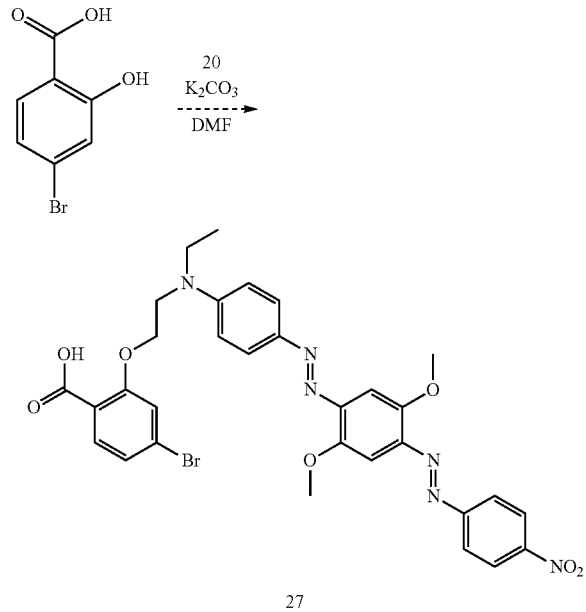

27

Synthesis of 27: Add 4-bromosalicylic acid (1 equiv.) into a round bottom flask with potassium carbonate (1.5 equiv.) and dissolve in solution of dimethylformamide (0.1 M) and heat the reaction to 100° C. for 2 hours. When the reaction is complete, wash with 1 M aqueous HCl until acidic and extract with dichloromethane (3 times). Dry organic fractions with MgSO$_4$, filter, and concentrate under vacuum. Purify through crystallization or SiO$_2$ column chromatography to isolate 27.

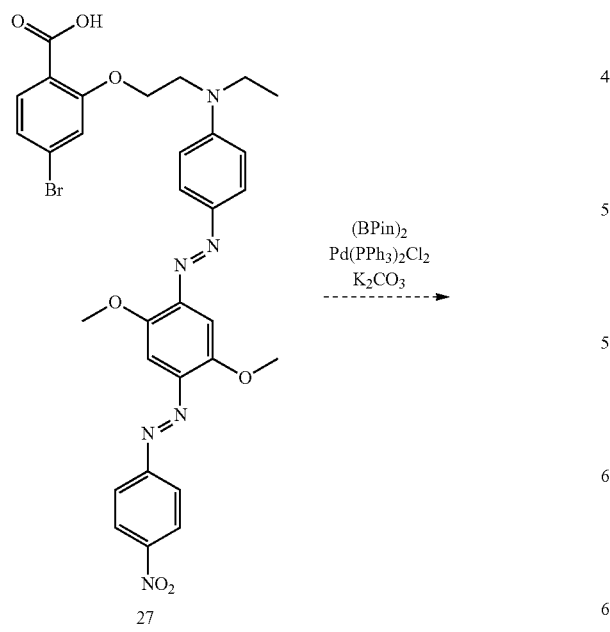

27

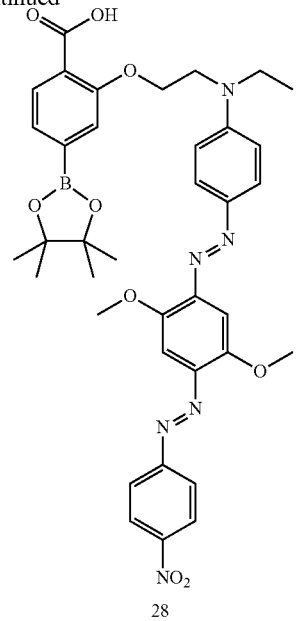

28

Synthesis of 28: Add 27 (1 equiv.), bispinacolborane (1.5 equiv), Pd(PPh$_3$)$_2$Cl$_2$ (0.05 equiv), and potassium carbonate (2 equiv.) into a reaction vessel. Evacuate and backfill with N$_2$ three times. Add a degassed mixture of toluene and water (10:1) and heat to 80° C. When the reaction is complete, slowly add 1 M aqueous solution of HCl until the aqueous layer is acidic. Extract with dichloromethane (3×) and dry organic fractions with MgSO$_4$ before filtering. Concentrate the crude reaction mixture and filter through celite before recrystallizing. Filter to isolate product 28.

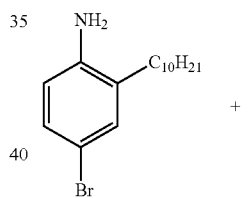

26

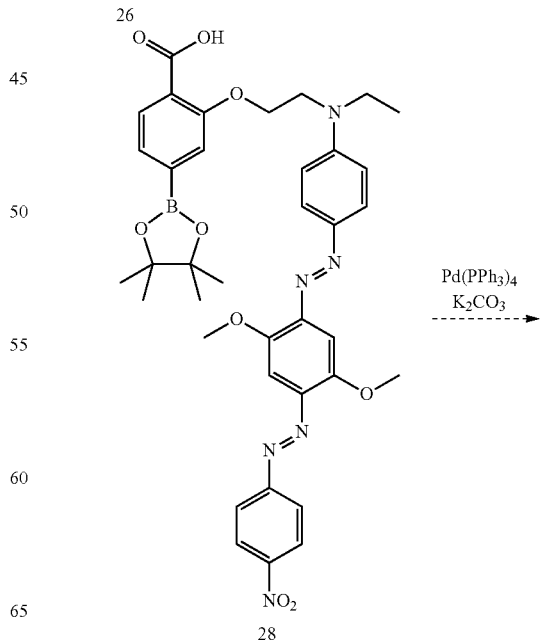

28

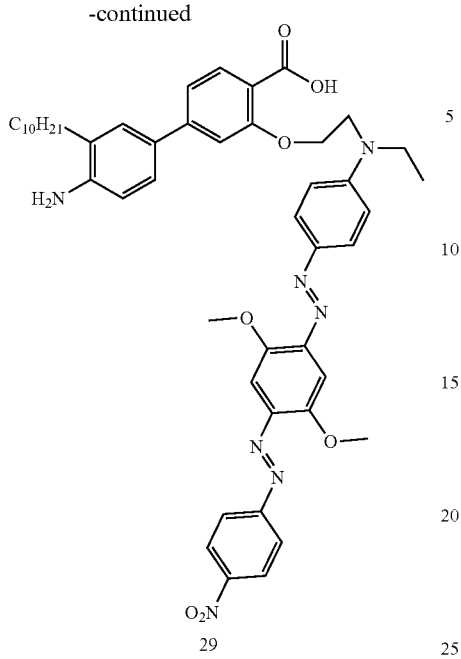

29

Synthesis of 29: Add 28 (1 equiv.), 26 (1 equiv), Pd(PPh$_3$)$_4$ (0.05 equiv), and potassium carbonate (2 equiv.) into a reaction vessel. Evacuate and backfill with N$_2$ three times. Add a degassed mixture of toluene and water (10:1) and heat to 80° C. When the reaction is complete, slowly add 1 M aqueous solution of HCl until the aqueous layer is acidic. Extract with dichloromethane (3×) and dry organic fractions with MgSO$_4$ before filtering. Concentrate the crude reaction mixture and filter through celite before recrystallizing. Filter to isolate product 29.

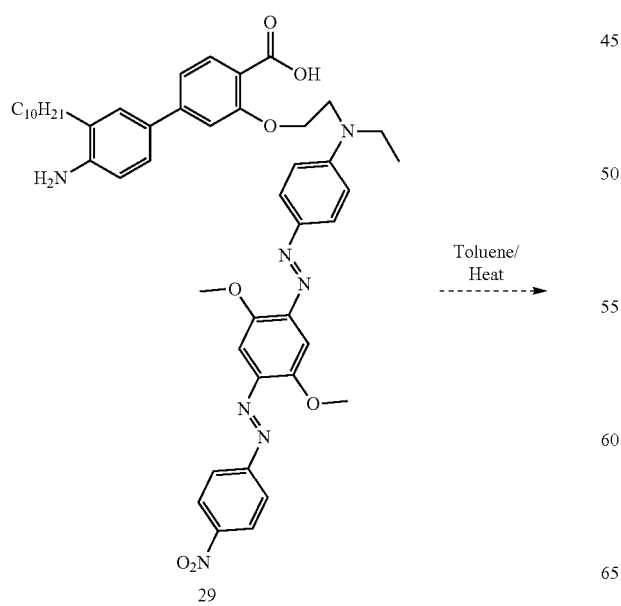

29

→ Toluene/Heat

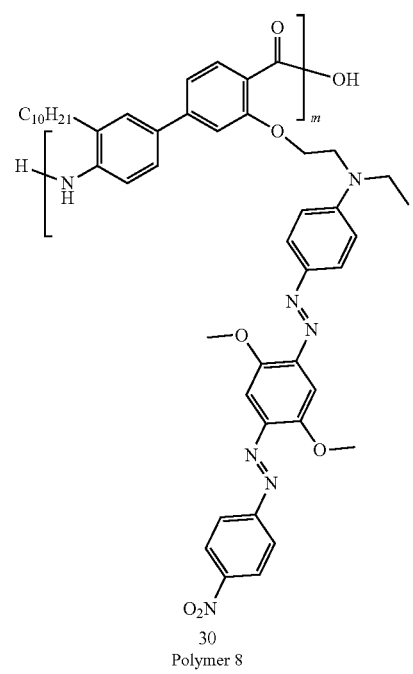

30
Polymer 8

Synthesis of 30: Add 29 (1.0 equiv.) to a reaction vessel before adding toluene and (0.1 M). Connect the reaction vessel to a and dean-stark apparatus and reflux condenser and heat to 150° C. When the reaction is complete, concentrate the crude reaction mixture under reduced pressure and precipitate polymer into hexane to isolate 30.

The scheme for Polymer 8 should be widely adaptable to accommodate a variety of backbones and polarizable units. Such species would meet the following formula.

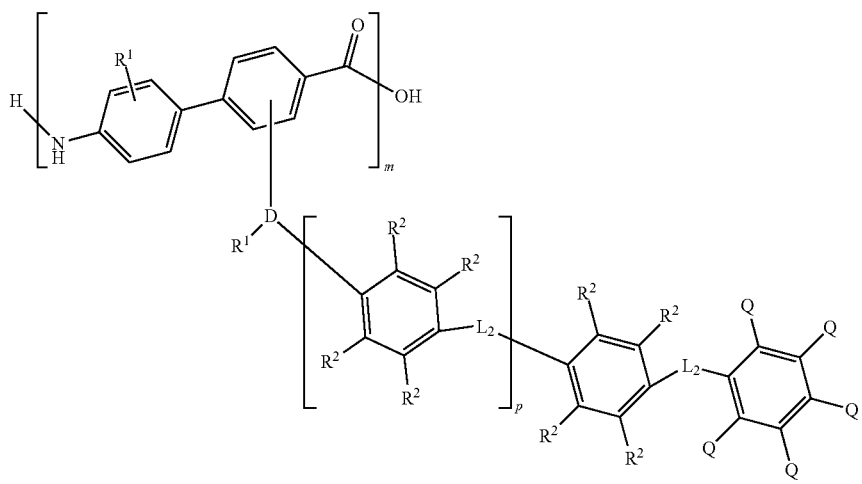

Where each instance of $R^1$ is independently selected from —H or any alkyl or alkoxyl group, each instance of $R^2$ is independently selected from —H, —OH, —OAk, or —OAk-$X_o$, $L_2$ is a heteroatom bridge in conjugation with the ring system of the side chain (e.g. azo-bridge or —N=N—, alkene bridge or —HC=CH—, and alkyne or —C≡C— bridge), Q is selected from any electron withdrawing group, D is any hydrocarbon chain which may be interrupted by hetero atoms at the point of backbone attachment and side chain attachment, m is 1-300, o is 1-51, p is 0-10. Preferred embodiments include m between about 60 and 270, and p between 1 and 4.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "A", or "An" refers to a quantity of one or more of the item following the article, except where expressly stated otherwise. As used herein, in a listing of elements in the alternative, the word "or" is used in the logical inclusive sense, e.g., "X or Y" covers X alone, Y alone, or both X and Y together, except where expressly stated otherwise. Two or more elements listed as alternatives may be combined together. The appended claims are not to be interpreted as including means-plus-function limitations, unless such a limitation is explicitly recited in a given claim using the phrase "means for."

What is claimed is:

1. A composite polymeric material of the following formula:

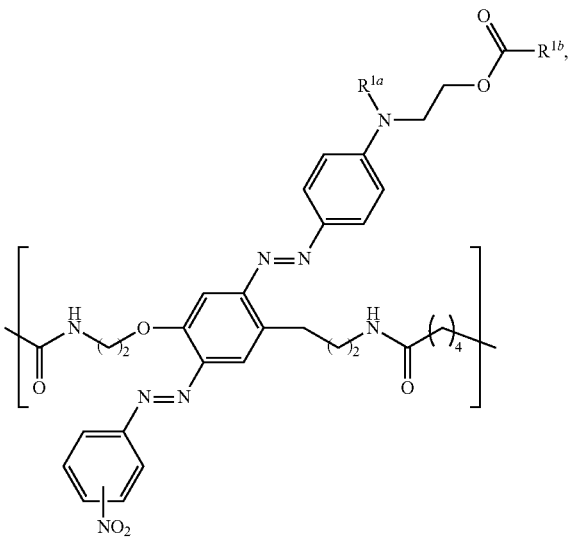

wherein $R^{1a}$ and $R^{1b}$ are —Ak,
wherein:
Ak is alkyl, m is 1-300, l is 1-51, and wherein $R^{1a}$ or $R^{1b}$ is an insulating resistive tail or wherein $R^{1a}$ and $R^{1b}$ are both insulating resistive tails.

2. The composite polymeric material of claim 1, wherein $R^{1a}$ or $R^{1b}$ possesses at least 7 carbon atoms.

3. The composite polymeric material of claim 1 wherein $R^{1b}$ and $R^{1b}$ are insulating resistive tails are independently selected from the group consisting of saturated hydrocarbon, saturated halogenated hydrocarbon, partially halogenated hydrocarbon, aryl chain, and cycloalkyl, and X—RR'R"; wherein X is selected from C, O, N, and S, and R, R', and R" are independently selected from H and $C_{5-50}$, wherein one or more of R, R', and R" is $C_{5-50}$.

4. The composite polymeric material of claim 3 wherein the insulating resistive tails are selected independently from the group consisting of non-aromatic carbocycles and non-aromatic heterocycles.

5. The composite polymeric material of claim 1 wherein all insulating resistive tails may be rigid.

6. The composite polymeric material of claim 1, wherein the composite polymeric material may have structure 21:

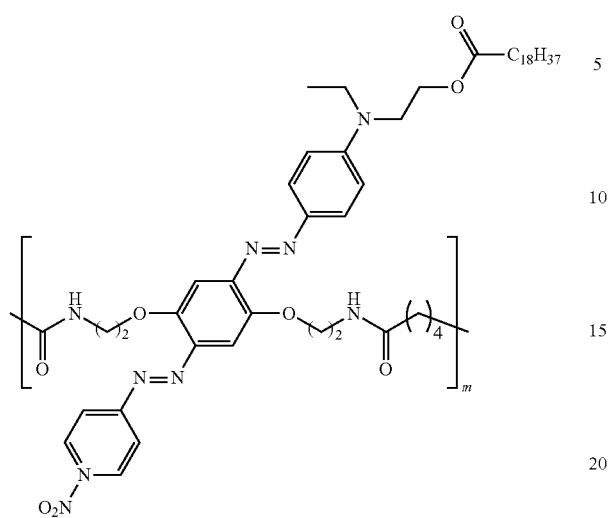
wherein in ranges from 1-300.
7. A metadielectric film comprising a polymer matrix and at least one material from claim 1.
* * * * *